United States Patent
Terada et al.

(10) Patent No.: US 10,304,528 B2
(45) Date of Patent: May 28, 2019

(54) MEMORY DEVICE, MEMORY SYSTEM, AND MEMORY CONTROL METHOD

(71) Applicant: SONY SEMICONDUCTOR SOLUTIONS CORPORATION, Kanagawa (JP)

(72) Inventors: Haruhiko Terada, Kanagawa (JP); Yotaro Mori, Kanagawa (JP); Makoto Kitagawa, Chiba (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/567,446

(22) PCT Filed: Mar. 29, 2016

(86) PCT No.: PCT/JP2016/060174
§ 371 (c)(1),
(2) Date: Oct. 18, 2017

(87) PCT Pub. No.: WO2016/174979
PCT Pub. Date: Nov. 3, 2016

(65) Prior Publication Data
US 2018/0122466 A1    May 3, 2018

(30) Foreign Application Priority Data
Apr. 27, 2015   (JP) ................. 2015-090176

(51) Int. Cl.
*G11C 13/00*    (2006.01)
*G11C 8/10*    (2006.01)

(52) U.S. Cl.
CPC ............ *G11C 13/0038* (2013.01); *G11C 8/10* (2013.01); *G11C 13/00* (2013.01); *G11C 13/004* (2013.01);
(Continued)

(58) Field of Classification Search
CPC .................................................. G11C 13/0038
(Continued)

(56) References Cited

U.S. PATENT DOCUMENTS 6,879,505 B2 *   4/2005   Scheuerlein ............ G11C 8/08
                                                    257/E27.103
8,050,075 B2 *   11/2011   Yamada .................. G11C 5/025
                                                    365/103
(Continued)

FOREIGN PATENT DOCUMENTS

JP      2012-248242      12/2012
JP      2013-502023 A     1/2013
JP      2014-79302 A      5/2014

OTHER PUBLICATIONS

International Search Report prepared by the Japan Patent Office dated Apr. 19, 2016, for International Application No. PCT/JP2016/060174.

*Primary Examiner* — Son L Mai
(74) *Attorney, Agent, or Firm* — Sheridan Ross P.C.

(57) ABSTRACT

A memory device of one embodiment of the technology includes: a plurality of memory cells in a matrix arrangement; a plurality of row wirings each coupled to one end of each memory cell; a plurality of column wirings each coupled to another end of each memory cell, a first decoder circuit coupled to each of the row wirings of even-numbered rows; a second decoder circuit coupled to each of the row wirings of odd-numbered rows; a third decoder circuit coupled to each of the column wirings of even-numbered columns; and a fourth decoder circuit coupled to each of the column wirings of odd-numbered columns. The first decoder circuit, the second decoder circuit, the third decoder circuit, and the fourth decoder circuit are constituted by independent circuits from one another.

16 Claims, 34 Drawing Sheets

(52) U.S. Cl.
CPC ...... *G11C 13/0023* (2013.01); *G11C 13/0026* (2013.01); *G11C 13/0028* (2013.01); *G11C 13/0033* (2013.01); *G11C 13/0061* (2013.01); *G11C 13/0069* (2013.01); *G11C 2213/71* (2013.01)

(58) Field of Classification Search
USPC .......................................................... 365/148
See application file for complete search history.

(56) References Cited

U.S. PATENT DOCUMENTS

| | | | |
|---|---|---|---|
| 8,050,109 B2 * | 11/2011 | Yan ........................ | G11C 7/18 365/148 |
| 9,042,161 B2 * | 5/2015 | Koyama ................. | G11C 5/025 365/149 |
| 2011/0026301 A1 * | 2/2011 | Ozawa .................... | G11C 5/02 365/148 |
| 2011/0032774 A1 | 2/2011 | Yan et al. | |
| 2014/0104925 A1 | 4/2014 | Azuma et al. | |

* cited by examiner

| a0 | a1 | b0 | b1 | b2 | s | line0 | line1 | line2 | line3 | line4 | line5 |
|----|----|----|----|----|----|-------|-------|-------|-------|-------|-------|
| 0  | 0  | 0  | 0  | 0  | x  | N     | N     | N     | N     | N     | N     |
| 1  | 0  | 1  | 0  | 0  | 1  | drv   | N     | N     | N     | N     | N     |
| 1  | 0  | 0  | 1  | 0  | 1  | N     | drv   | N     | N     | N     | N     |
| 1  | 0  | 0  | 0  | 1  | 1  | N     | N     | drv   | N     | N     | N     |
| 0  | 1  | 1  | 0  | 0  | 1  | N     | N     | N     | drv   | N     | N     |
| 0  | 1  | 0  | 1  | 0  | 1  | N     | N     | N     | N     | drv   | N     |
| 0  | 1  | 0  | 0  | 1  | 1  | drv   | N     | N     | N     | N     | drv   |
| 1  | 1  | 1  | 1  | 1  | 1  | N     | drv   | drv   | drv   | drv   | drv   |
| 1  | 1  | 1  | 1  | 1  | 0  | com   | com   | com   | com   | com   | com   |

FIG. 10

| a0 | a1 | b0 | b1 | b2 | s | line0 | line1 | line2 | line3 | line4 | line5 |
|---|---|---|---|---|---|---|---|---|---|---|---|
| 0 | 0 | 0 | 0 | 0 | 0 | z | z | z | z | z | z |
| 0 | 0 | 0 | 0 | 0 | 1 | com | com | com | com | com | com |
| 1 | 0 | 1 | 0 | 0 | 1 | drv | com | com | com | com | com |
| 1 | 0 | 0 | 1 | 0 | 1 | com | drv | com | com | com | com |
| 1 | 0 | 0 | 0 | 1 | 1 | com | com | drv | com | com | com |
| 0 | 1 | 1 | 0 | 0 | 1 | com | cin | com | drv | com | com |
| 0 | 1 | 0 | 1 | 0 | 1 | com | com | com | com | drv | com |
| 1 | 1 | 0 | 0 | 1 | 1 | com | com | com | com | com | drv |
| 1 | 1 | 1 | 1 | 1 | 0 | drv | drv | drv | drv | drv | drv |

FIG. 12

MEMORY DEVICE, MEMORY SYSTEM, AND MEMORY CONTROL METHOD

CROSS REFERENCE TO RELATED APPLICATIONS

This application is a national stage application under 35 U.S.C. 371 and claims the benefit of PCT Application No. PCT/JP2016/060174 having an international filing date of 29 Mar. 2016, which designated the United States, which PCT application claimed the benefit of Japanese Patent Application No. 2015-090176 filed 27 Apr. 2015, the disclosures of which are incorporated herein by reference in their entirety.

TECHNICAL FIELD

The disclosure relates to a memory device including a decoder circuit, a memory system including the memory device, and a memory control method in the memory device as mentioned above.

BACKGROUND ART

In recent years, there has been a desire for enlargement of capacity of non-volatile memories for data storage typified by resistance variable memories such as ReRAM (Resistive Random Accessible Memory). However, currently-existing resistance variable memories that utilize access transistors cause an increase in floor area per unit cell. Accordingly, as compared to, for example, flash memories such as an NAND type, the enlargement of the capacity has not been easy, even in miniaturization using the same design rules. Meanwhile, in a case with the use of a so-called cross point array structure, the floor area per unit cell becomes smaller, leading to achievement of the enlargement of the capacity. The cross point array structure includes arrangement of memory elements at intersections where wirings cross each other, with the wirings extending in different directions in a horizontal plane. Moreover, in a case with the use of a so-called V3D (Vertical 3-Dimention) structure as well, the floor area per unit cell becomes smaller, leading to the achievement of the enlargement of the capacity. The V3D structure includes the arrangement of the memory elements at intersections where horizontally-extending wirings and vertically-extending wirings cross each other.

Memory cells in the cross point array structure or memory cells in the V3D structure include switch elements for cell selection, as well as the memory elements. As the switch elements, used are transistors or elements having diode characteristics. In these memory cells, voltage application to between the crossing wirings makes it possible to change states of the memory cells or to read the states of the memory cells (for example, refer to PTL 1).

CITATION LIST

Patent Literature

PTL 1: Japanese Unexamined Patent Application Publication No. 2012-248242

SUMMARY OF THE INVENTION

Now, in the memory cell array described in PTL 1, in writing, a predetermined voltage (an access voltage) is applied to a memory cell as a target of writing (a selected memory cell), while a voltage smaller than the access voltage (a non-access voltage) is applied to other memory cells than the target of the writing (non-selected memory cells). Thus, in the application of the access voltage to the selected memory cell, restrained are voltage variations in non-selected memory caused by inter-wiring capacitive coupling. However, in order to achieve such voltage application in the memory cell array described in PTL 1, it is necessary to provide, per each wiring, a decoder circuit including at least two switch elements. Specifically, it is necessary for the decoder circuit to include, per each wiring, a switch element used in selection of the access voltage and a switch element used in selection of the non-access voltage. This causes a disadvantage of an increase in floor area of the decoder circuit.

It is therefore desirable to provide a memory device and a memory system including the memory device, and a memory control method that make it possible to restrain influences of inter-wiring capacitive coupling while restraining an increase in floor area of a decoder circuit.

A memory device according to an embodiment of the disclosure includes a plurality of memory cells in a matrix arrangement. The memory cells each include a current path that includes a selection element and a variable resistance element coupled in series to each other. The memory device according to the embodiment of the disclosure further includes a plurality of row wirings extending in a row direction and a plurality of column wirings extending in a column direction. The plurality of the row wirings each are coupled to one end of the current path. The plurality of the column wirings each are coupled to another end of the current path. The memory device according to the embodiment of the disclosure further includes a first decoder circuit, a second decoder circuit, a third decoder circuit, and a fourth decoder circuit. The first decoder circuit is coupled to each of the row wirings of even-numbered rows. The second decoder circuit is coupled to each of the row wirings of odd-numbered rows. The third decoder circuit is coupled to each of the column wirings of even-numbered columns. The fourth decoder circuit is coupled to each of the column wirings of odd-numbered columns. The first decoder circuit, the second decoder circuit, the third decoder circuit, and the fourth decoder circuit are constituted by independent circuits from one another.

A memory system according to an embodiment of the disclosure includes a plurality of memory cells in a matrix arrangement. The memory cells each include a current path that includes a selection element and a variable resistance element coupled in series to each other. The memory system according to the embodiment of the disclosure further includes a plurality of row wirings extending in a row direction and a plurality of column wirings extending in a column direction. The plurality of the row wirings each are coupled to one end of the current path. The plurality of the column wirings each are coupled to another end of the current path. The memory system according to the embodiment of the disclosure further includes a first decoder circuit, a second decoder circuit, a third decoder circuit, and a fourth decoder circuit. The first decoder circuit is coupled to each of the row wirings of even-numbered rows. The second decoder circuit is coupled to each of the row wirings of odd-numbered rows. The third decoder circuit is coupled to each of the column wirings of even-numbered columns. The fourth decoder circuit is coupled to each of the column wirings of odd-numbered columns. The memory system according to the embodiment of the disclosure further includes a voltage control circuit and a controller. The voltage control circuit controls voltages to be applied to the first decoder circuit, the second decoder circuit, the third decoder circuit, and the fourth decoder circuit. The controller controls the voltage control circuit, and controls the first decoder circuit, the second decoder circuit, the third decoder circuit, and the fourth decoder circuit independently from one another.

In the memory device according to the embodiment of the disclosure, to the row wiring to be coupled to the memory cell as a target of selection (a row selection line), and to the row wirings in adjacency to the row selection line, coupled on the one-to-one basis are two decoder circuits constituted by the independent circuits from each other (the first decoder circuit and the second decoder circuit). Furthermore, in the memory device according to the embodiment of the disclosure, to the column wiring to be coupled to the memory cell as the target of the selection (a column selection line), and to the column wirings in adjacency to the column selection line, coupled on the one-to-one basis are two decoder circuits constituted by the independent circuits from each other (the third decoder circuit and the fourth decoder circuit). Accordingly allowing a voltage outputted from the first decoder circuit and a voltage outputted from the second decoder circuit to differ from each other makes it possible to apply two kinds of voltages different from each other to the row selection line and the row wirings in adjacency to the row selection line. Likewise, allowing a voltage outputted from the third decoder circuit and a voltage outputted from the fourth decoder circuit to differ from each other makes it possible to apply two kinds of voltages different from each other to the column selection line and the column wirings in adjacency to the column selection line.

A memory control method according to an embodiment of the disclosure is a memory control method in a memory device as follows, and includes controlling a first decoder circuit, a second decoder circuit, a third decoder circuit, and a fourth decoder circuit independently from one another.

The memory device to be used in the memory control method according to the embodiment of the disclosure includes a plurality of memory cells in a matrix arrangement. The memory cells each include a current path that includes a selection element and a variable resistance element coupled in series to each other. The memory device as mentioned above further includes a plurality of row wirings extending in a row direction and a plurality of column wirings extending in a column direction. The plurality of the row wirings each are coupled to one end of the current path. The plurality of the column wirings each are coupled to another end of the current path. The memory device as mentioned above further includes the first decoder circuit, the second decoder circuit, the third decoder circuit, and the fourth decoder circuit. The first decoder circuit is coupled to each of the row wirings of even-numbered rows. The second decoder circuit is coupled to each of the row wirings of odd-numbered rows. The third decoder circuit is coupled to each of the column wirings of even-numbered columns. The fourth decoder circuit is coupled to each of the column wirings of odd-numbered columns.

In the memory control method according to the embodiment of the disclosure, the row wiring to be coupled to the memory cell as the target of the selection (the row selection line) is driven by the first decoder circuit, whereas the row wirings in adjacency to the row selection line are driven by the second decoder circuit. Furthermore, in the memory control method according to the embodiment of the disclosure, the column wiring to be coupled to the memory cell as the target of the selection (the column selection line) is driven by the third decoder circuit, whereas the column wirings in adjacency to the column selection line are driven by the fourth decoder circuit. Accordingly, allowing the voltage outputted from the first decoder circuit and the voltage outputted from the second decoder circuit to differ from each other makes it possible to apply the two kinds of the voltages different from each other to the row selection line and the row wirings in adjacency to the row selection line. Likewise, allowing the voltage outputted from the third decoder circuit and the voltage outputted from the fourth decoder circuit to differ from each other makes it possible to apply the two kinds of the voltages different from each other to the column selection line and the column wirings in adjacency to the column selection line.

According to the memory device, the memory system, and the memory control method according to the embodiments of the disclosure, it is possible to apply the two kinds of the voltages different from each other to the row selection line and the row wirings in adjacency to the row selection line. It is also possible to apply the two kinds of the voltages different from each other to the column selection line and the column wirings in adjacency to the column selection line. Accordingly, in application of an access voltage to the selected memory cell, it is possible to restrain the voltage variations in the non-selected memory caused by the inter-wiring capacitive coupling. Moreover, in the disclosure, the row selection line and the row wirings in adjacency to the row selection line are driven by the decoder circuits different from each other. The column selection line and the column wirings in adjacency to the column selection line are driven by the decoder circuits different from each other. It is therefore sufficient to use, as each of the decoder circuits, a decoder circuit that includes, per each wiring, a single switch element. It is unnecessary to use a decoder circuit that includes, per each wiring, at least two switch elements. Hence, it is possible to restrain the influences of the inter-wiring capacitive coupling while restraining the increase in the floor area of the decoder circuit.

BRIEF DESCRIPTION OF DRAWING

FIG. 10 is a truth table of the BL decoders and the WL decoders in FIG. 9.

FIG. 12 is a truth table of decoding in BL decoders and WL decoders in FIG. 11.

MODES FOR CARRYING OUT THE INVENTION

In the following, some embodiments of the disclosure are described in detail with reference to the drawings. It is to be noted that description is made in the following order.

Figure 31:
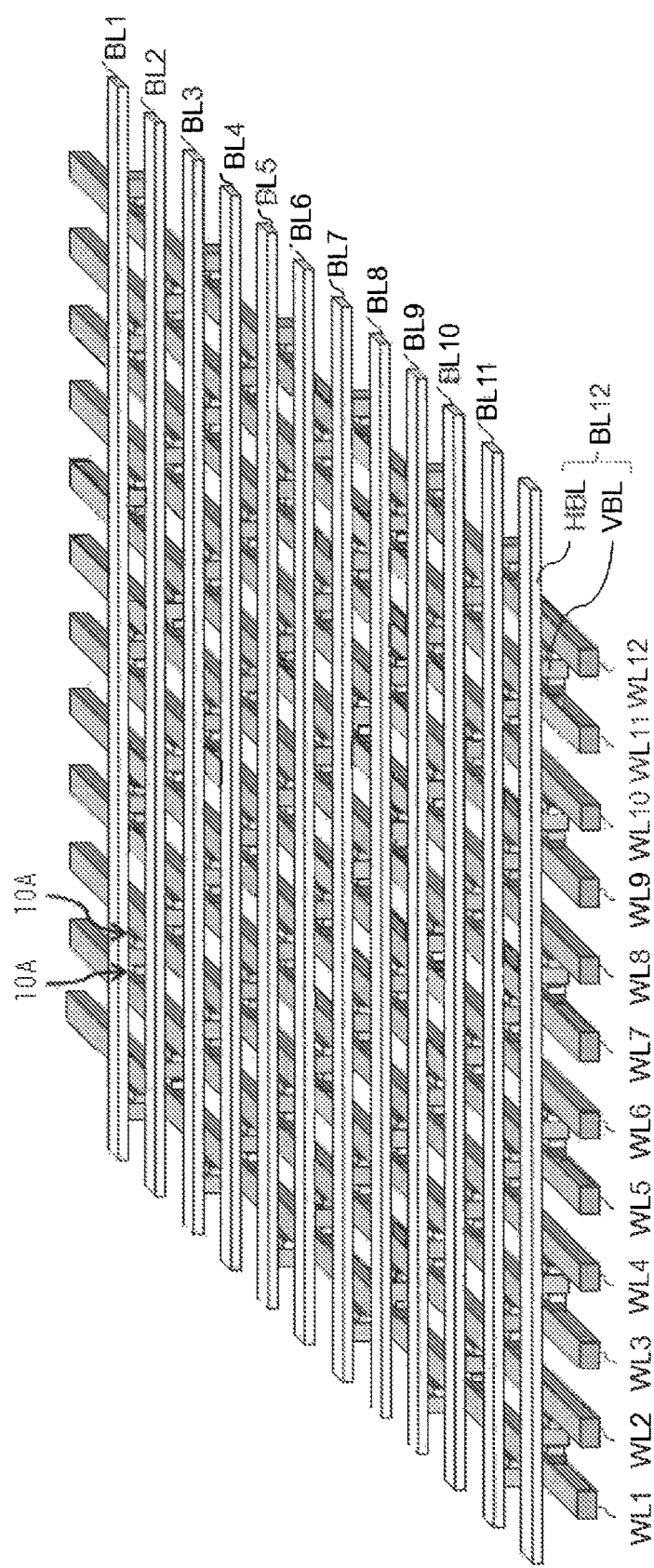
FIG. 31 is a diagram that illustrates one modification example of the perspective configuration of the memory cell arrays in FIGS. 2 and 20.
Figure 32:
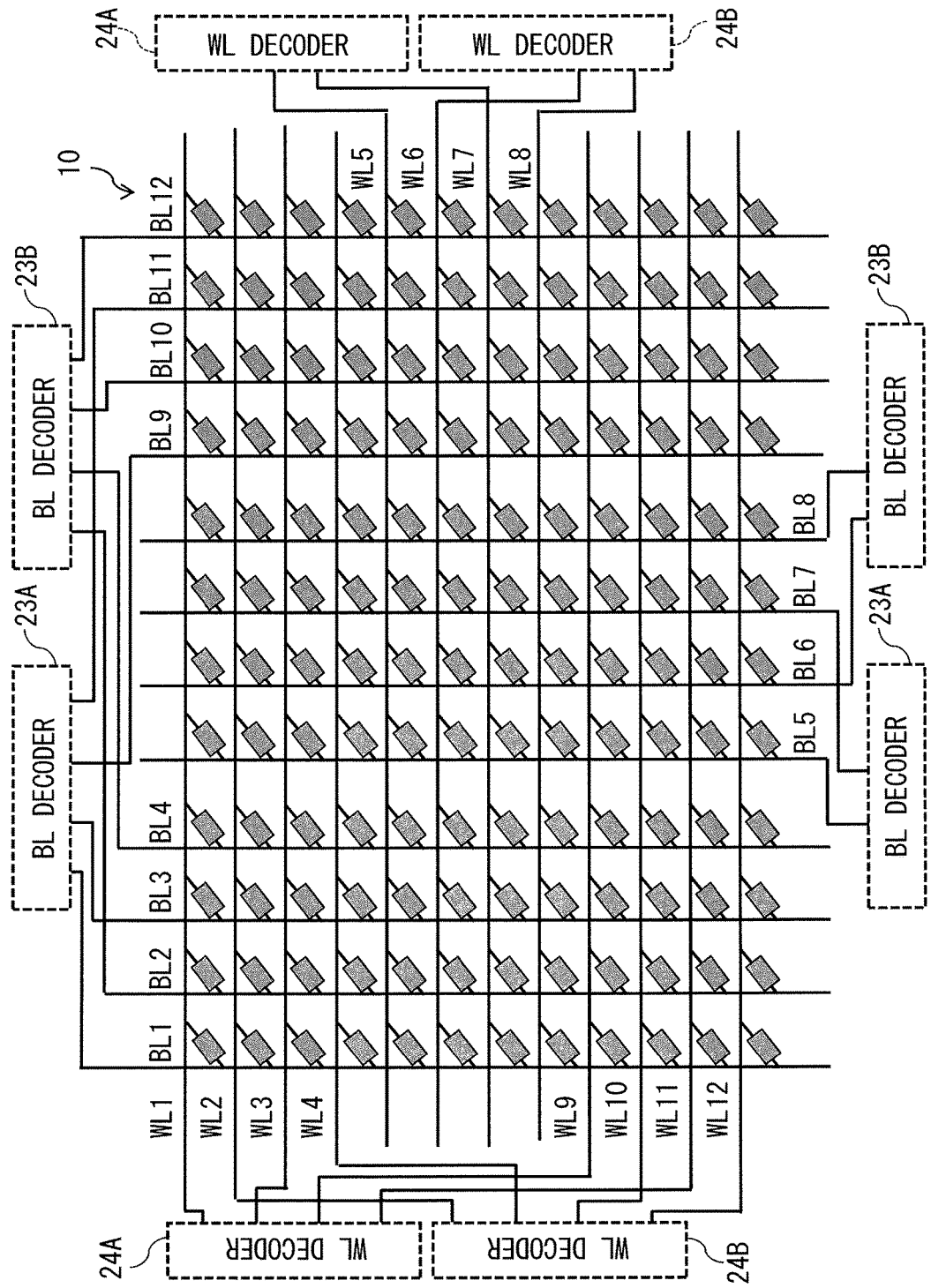
FIG. 32 is a diagram that illustrates one example of an equivalent circuit of a memory cell array in FIG. 31.

1. Embodiment
An example including a memory cell array in stacked arrangement (FIGS. 1 to 19)
2. Modification Examples
Modification Example A: an example in which pre-charge is omitted (FIGS. 20 to 25)
Modification Example B: an example in which pre-charge is carried out in a writing failure (FIG. 26)
Modification Example C: an example in which pre-charge is carried out in accordance with a writing position (FIG. 27)
Modification Example D: variations of a pre-charge circuit (FIGS. 28 to 30)
Modification Example E: an example including a memory cell array in a single-layer arrangement (FIGS. 31 and 32)

1. EMBODIMENT

[Configuration]

Figure 1:
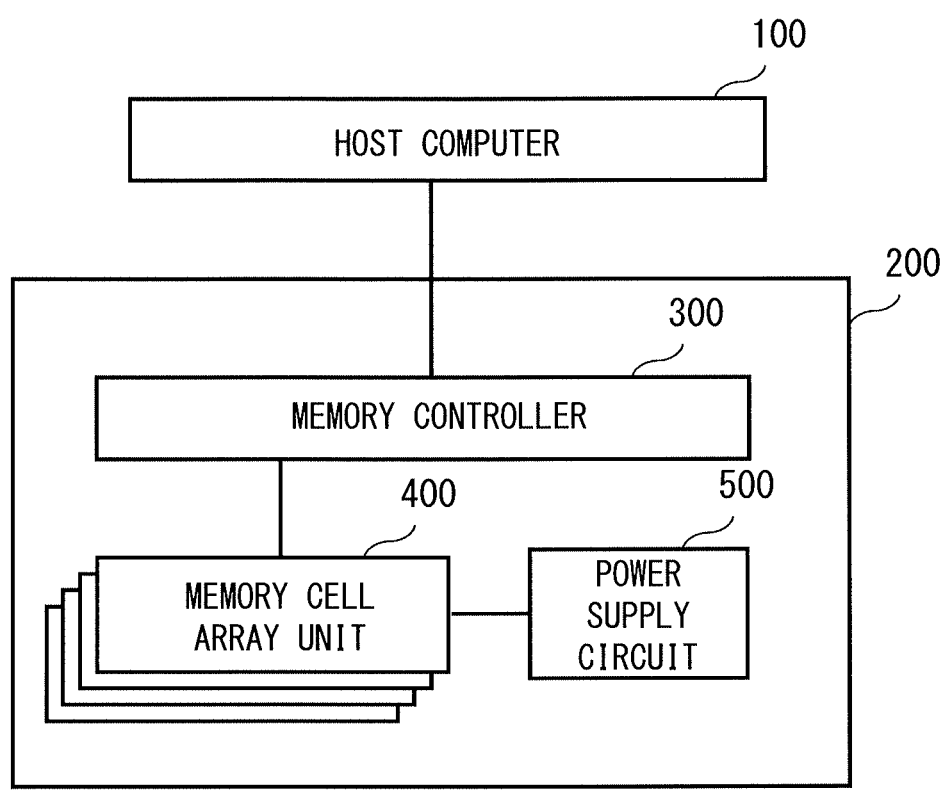
FIG. 1 is a diagram that illustrates one example of functional blocks of an information processing system according to one embodiment of the disclosure.

FIG. 1 illustrates one example of functional blocks of an information processing system according to one embodiment of the disclosure. The information processing system includes a host computer 100 and a memory system 200. The memory system 200 includes a memory controller 300, one or more memory cell array units 400, and a power supply circuit 500. It is to be noted that FIG. 1 illustrates a state in which a plurality of the memory cell array units 400 are provided. The memory system 200 corresponds to one specific example of a "memory system" in the disclosure. The memory controller 300 corresponds to one specific example of a "memory controller" in the disclosure. The memory cell array unit 400 corresponds to one specific example of a "memory device" in the disclosure.

[Host Computer 100]

The host computer 100 controls the memory system 200. Specifically, the host computer 100 issues a command that specifies a logic address as a target of access, and supplies the command or data to the memory system 200. Moreover, the host computer 100 receives data outputted from the memory system 200. Here, the command is provided for a control of the memory system 200, and include, for example, a write command or a read command. The write command instructs data writing process. The read command instructs data reading process. Furthermore, the logic address is an address allotted to each region as an access unit in a case where the host computer 100 makes access to the memory system 200, in address space defined by the host computer 100. Hereinafter, the region as the access unit is referred to as a "sector". A size of each sector is, for example, 4 KB (kilobyte).

[Memory Controller 300]

The memory controller 300 controls the one or more memory cell array units 400. The memory controller 300 receives, from the host computer 100, the write command that specifies the logic address. Moreover, the memory controller 300 executes the data writing process in accordance with the write command. In the writing process, the logic address is converted to a physical address, and data is written to the physical address. Here, the physical address is an address allotted, in the one or more memory cell array units 400, to each access unit in a case where the memory controller 300 makes access to the one or more memory cell array units 400. A unit at which the memory controller 300 makes access to the one or more memory cell array units 400 is assumed to be, for example, the same as the sector. In this case, in the one or more memory cell array units 400, the physical address is allotted to each sector. Moreover, upon receiving the read command that specifies the logic address, the memory controller 300 converts the logic address to the physical address, and reads data from the physical address. Thus, the memory controller 300 outputs, to the host computer 100, the data thus read, as read data. In addition, upon receiving, from the host computer 100, a reset command that specifies the logic address, the memory controller 300 converts the logic address to the physical address, and erases data written to the physical address. An access unit by the memory controller 300 may be either the same as or different from the access unit by the host computer 100. It is to be noted that a control method, by the memory controller 300, of the one or more memory cell array units 400 is to be described later at any time.

[Power Supply Circuit 500]

The power supply circuit 500 supplies a desired voltage to the one or more memory cell array units 400. Specifically, the power supply circuit 500 supplies a BL driver 21 described later with a set voltage Vset1, a set voltage Vset2, a sense voltage Vsense_h, and a reset voltage Vreset_i. Moreover, the power supply circuit 500 supplies a WL driver 22 described later with a ground voltage Vss, a sense voltage Vsense_i, and a reset voltage Vreset_h. Furthermore, the power supply circuit 500 supplies a pre-charge circuit 25 described later with the ground voltage Vss and a reference voltage Vcom. The ground voltage Vss and the sense voltage Vsense_i correspond to one specific example of a "first voltage" in the disclosure. The set voltage Vset1, the set voltage Vset2, and the sense voltage Vsense_h correspond to one specific example of a "third voltage" in the disclosure.

The set voltage Vset1 is a voltage of magnitude that is able to apply, to a switch element 10S, a voltage equal to or larger than a voltage Vsnap. The voltage Vsnap is a voltage at which the switch element 10S changes from a high resistance state to a low resistance state. The set voltage Vset2 is a voltage lower than the set voltage Vset1. Specifically, the set voltage Vset2 is a voltage lower than the voltage Vsnap, and is a voltage large enough to maintain a current Iset of magnitude necessary to perform writing to a memory cell 10A. Here, let us assume that resistance of a memory element 10M at a start of the writing to the memory cell 10A is Rhrs. Moreover, let us assume that a voltage at which the switch element 10S changes from the low resistance state to the high resistance state is Vhold. At this occasion, the set voltage Vset1 is a voltage larger than (the voltage Vsnap+the current Iset×the resistance Rhrs). The set voltage Vset2 is a voltage larger than (the voltage Vhold+the current Iset×the resistance Rhrs). The sense voltage Vsense_h is a voltage that is higher than the ground voltage Vss and is lower than the set voltage Vset2. The sense voltage Vsense_h is a voltage higher than the sense voltage Vsense_i. The reset voltage Vreset_h is a voltage higher than the reset voltage Vreset_i.

[Memory Cell Array Unit 400]

Figure 2:
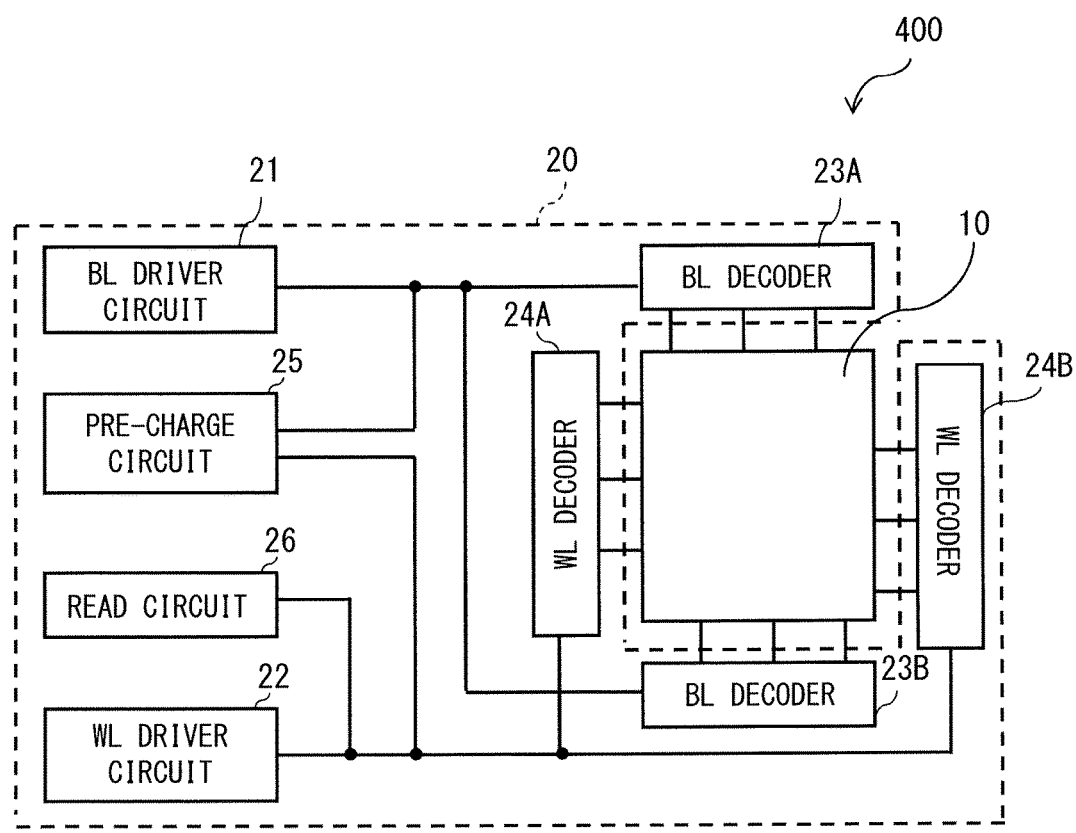
FIG. 2 is a diagram that illustrates one example of functional blocks of a memory cell array unit in FIG. 1.

Description is given next of the memory cell array unit 400. FIG. 2 illustrates one example of functional blocks of the memory cell array unit 400. The memory cell array unit 400 is constituted by, for example, a semiconductor chip. The memory cell array unit 400 includes a memory cell array 10 and a control circuit 20. The control circuit 20 exchanges commands, write data, read data, and other pieces of information with the memory controller 300. The control circuit 20 writes data to the memory cell array 10 in accordance with the write command, and reads data from the memory cell array 10 in accordance with the read command. Moreover, the control circuit 20 erases data at a predetermined position in the memory cell array 10, in accordance with the reset command. Detailed description of the control circuit 20 is given later.

[Memory Cell Array 10]

Figure 3:
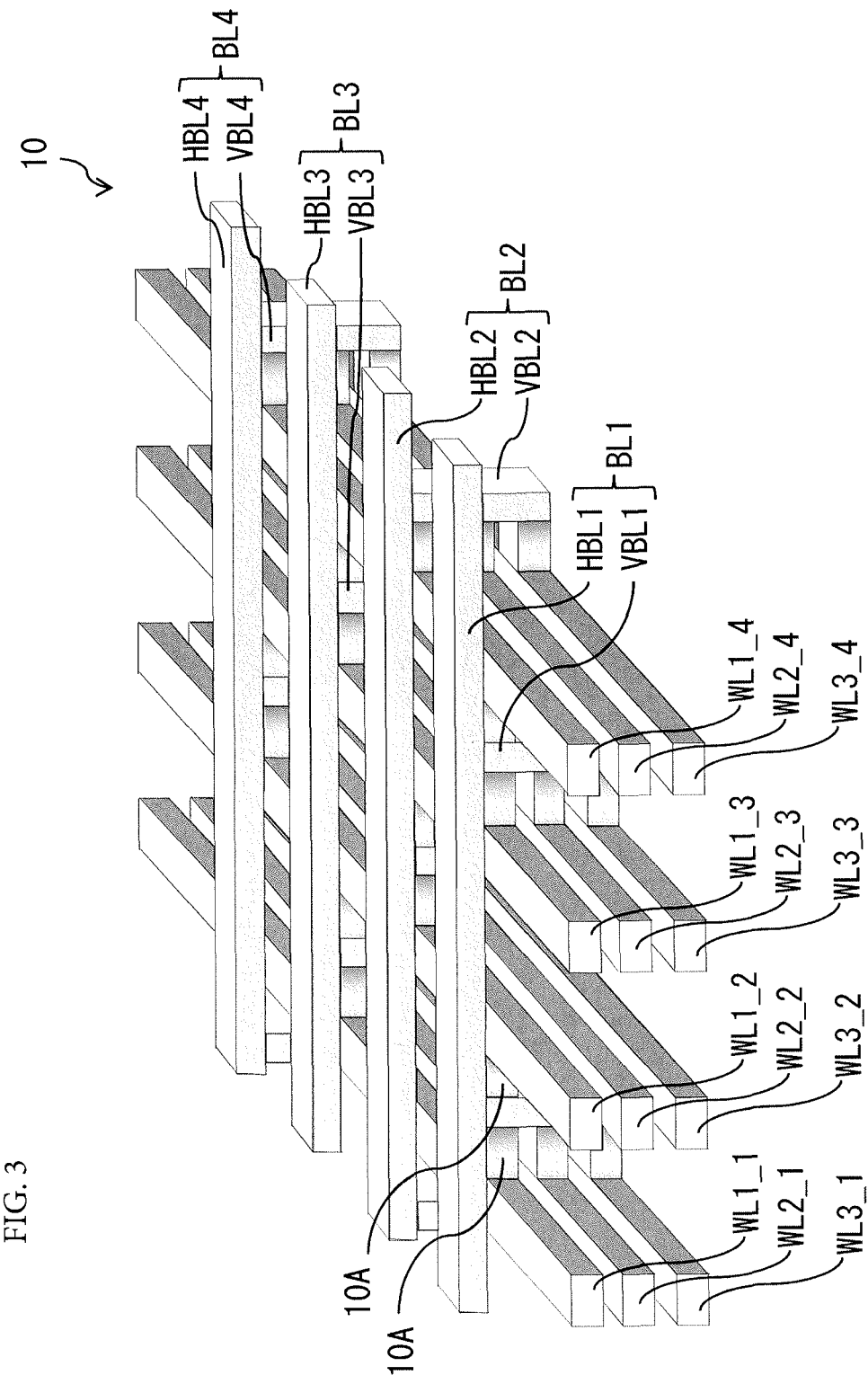
FIG. 3 is a view of one example of a perspective configuration of a memory cell array in FIG. 2.

FIG. 3 illustrates one example of a perspective configuration of the memory cell array 10. The memory cell array 10 includes n sectors (n is an integer of 2 or more). Each of the sectors includes a plurality of the memory cells 10A. The number of the memory cells 10A corresponds to the size of the sector. Moreover, the physical address is allotted to each sector.

The memory cell array 10 includes a plurality of word lines WL, a plurality of bit lines BL, and the plurality of the memory cells 10A. The plurality of the memory cells 10A are arranged, on the one-to-one basis, at positions where the word lines WL and the bit lines BL are confronted with one another. The word lines WL correspond to one specific example of "row wirings" in the disclosure. The bit lines BL correspond to one specific example of "column wirings" in the disclosure.

In FIG. 3, for purposes of convenience, position information (e.g., 1_1, 1_2) is assigned to an end of reference characters of each of the word lines WL, whereas position information (1, 2, 3, 4) is also assigned to an end of reference characters of each of the bit lines BL. Specifically, the position information 1_1, 1_2, 1_3, and 1_4 is assigned to four pieces of the word lines WL provided in a first layer. Moreover, the position information 2_1, 2_2, 2_3, and 2_4 is assigned to four pieces of the word lines WL provided in a second layer. The position information 3_1, 3_2, 3_3, and 3_4 is assigned to four pieces of the word lines WL provided in a third layer. Moreover, the position information 1_1, 2_1, and 3_1 is assigned to the word lines WL of a first row. The position information 1_2, 2_2, and 3_2 is assigned to the word lines WL of a second row. Furthermore, the position information 1_3, 2_3, and 3_3 is assigned to the word lines WL of a third row. The position information 1_4, 2_4, and 3_4 is assigned to the word lines WL of a fourth row. In addition, the position information 1 is assigned to the bit line BL, a horizontal bit line HBL, and a vertical bit line VBL of a first column. The position information 2 is assigned to the bit line BL, the horizontal bit line HBL, and the vertical bit line VBL of a second column. The position information 3 is assigned to the bit line BL, the horizontal bit line HBL, and the vertical bit line VBL of a third column. The position information 4 is assigned to the bit line BL, the horizontal bit line HBL, and the vertical bit line VBL of a fourth column.

The plurality of the memory cells 10A are in a matrix arrangement. For example, as illustrated in FIG. 3, the plurality of the memory cells 10A are in the matrix arrangement in a horizontal plane (two-dimensionally, in an X-Y plane), and furthermore, are in the matrix arrangement in a vertical plane (two dimensionally, in an X-Z plane or a Y-Z plane). In other words, the plurality of the memory cells 10A are in a stacked arrangement. This makes it possible to provide a storage device of higher density and larger capacity. It is to be noted that in the followings, the plurality of the memory cells 10A are assumed to be in the stacked arrangements as illustrated in FIG. 3.

The plurality of the word lines WL are so disposed as to be divided into a plurality of levels. Each of the word lines WL extends in a row direction. Each of the bit lines BL is constituted by the horizontal bit line HBL and the vertical bit line VBL. The horizontal bit line HBL extends in a column direction. The vertical bit line VBL is coupled to the horizontal bit line HBL and extends in a vertical direction.

At this occasion, for example, as illustrated in FIG. 3, the plurality of the horizontal bit lines HBL are disposed in a single layer, whereas the plurality of the vertical bit lines VBL are disposed between the two word lines WL in adjacency to each other in the horizontal plane. Furthermore, for example, as illustrated in FIG. 3, the plurality of the vertical bit lines VBL and the plurality of the word lines WL are disposed, in the horizontal plane, in confronted relation to one another, with a predetermined gap in between. Each of the memory cells 10A are held between the vertical bit line VBL and the word line WL, in the horizontal plane. From the forgoing, the memory cell array 10 has a V3D structure.

Figure 4:
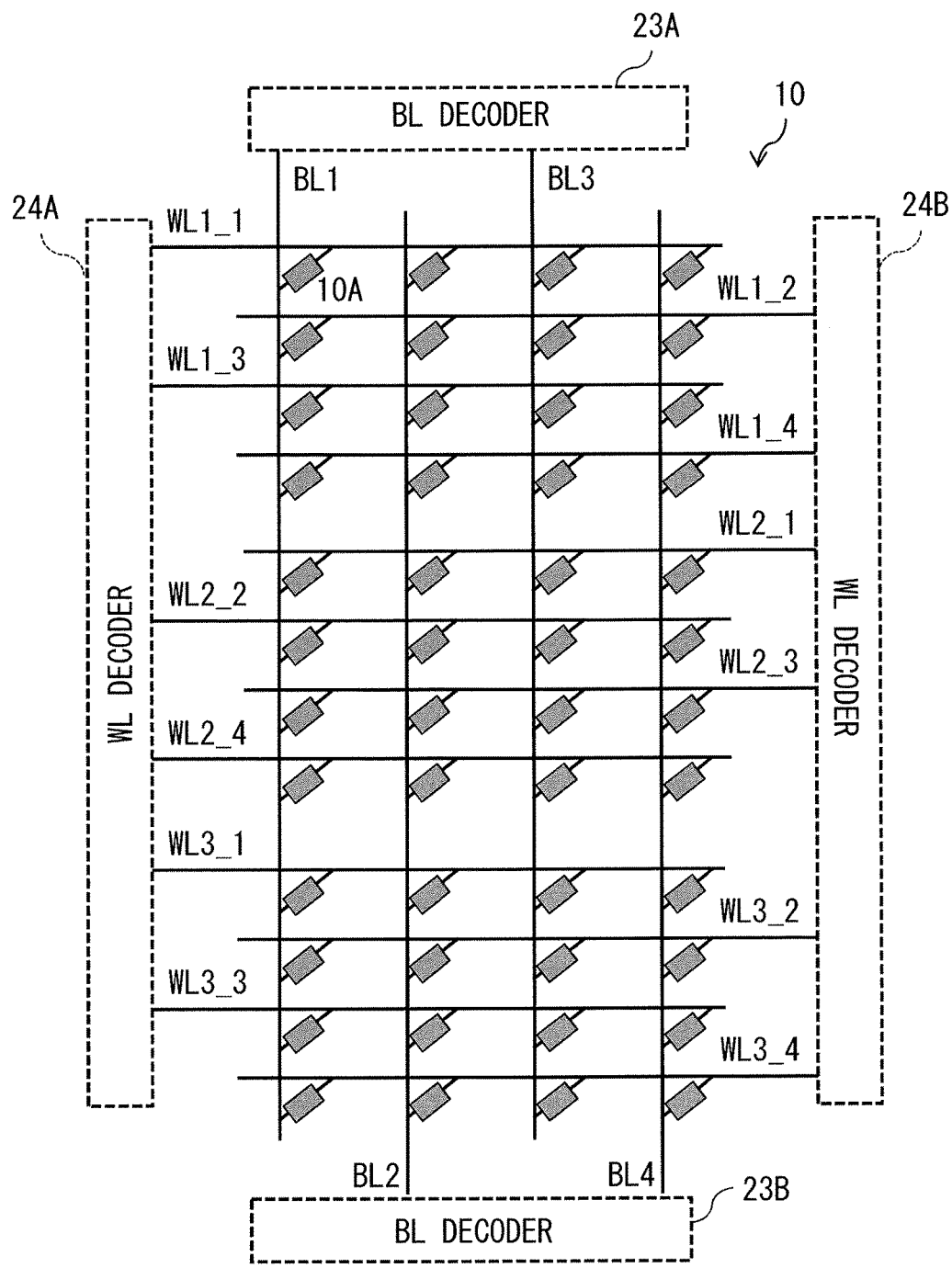
FIG. 4 is a diagram that illustrates one example of an equivalent circuit of the memory cell array in FIG. 2.

FIG. 4 illustrates one example of an equivalent circuit of the memory cell array 10. The memory cells 10A are provided, on the one-to-one basis, at respective positions where the bit lines BL and the word lines WL are confronted with one another. The plurality of the memory cells 10A coupled to the four pieces of the word lines WL1_1 to WL1_4 on upper side of FIG. 4 are provided in the first layer. The plurality of the memory cells 10A coupled to the four pieces of the word lines WL2_1 to WL2_4 in the middle of FIG. 4 are provided in the second layer. The plurality of the memory cells 10A coupled to the four pieces of the word lines WL3_1 to WL3_4 on lower side of FIG. 4 are provided in the third layer. Representing the memory cell array 10 as the equivalent circuit as in FIG. 4 gives an understanding that the memory cell array 10 is equivalent to a cross point memory cell array. The cross point memory cell array includes arrangement of memory cells at intersections where wirings cross each other, with the wirings extending in different directions from one another in a horizontal plane.

Figure 5:
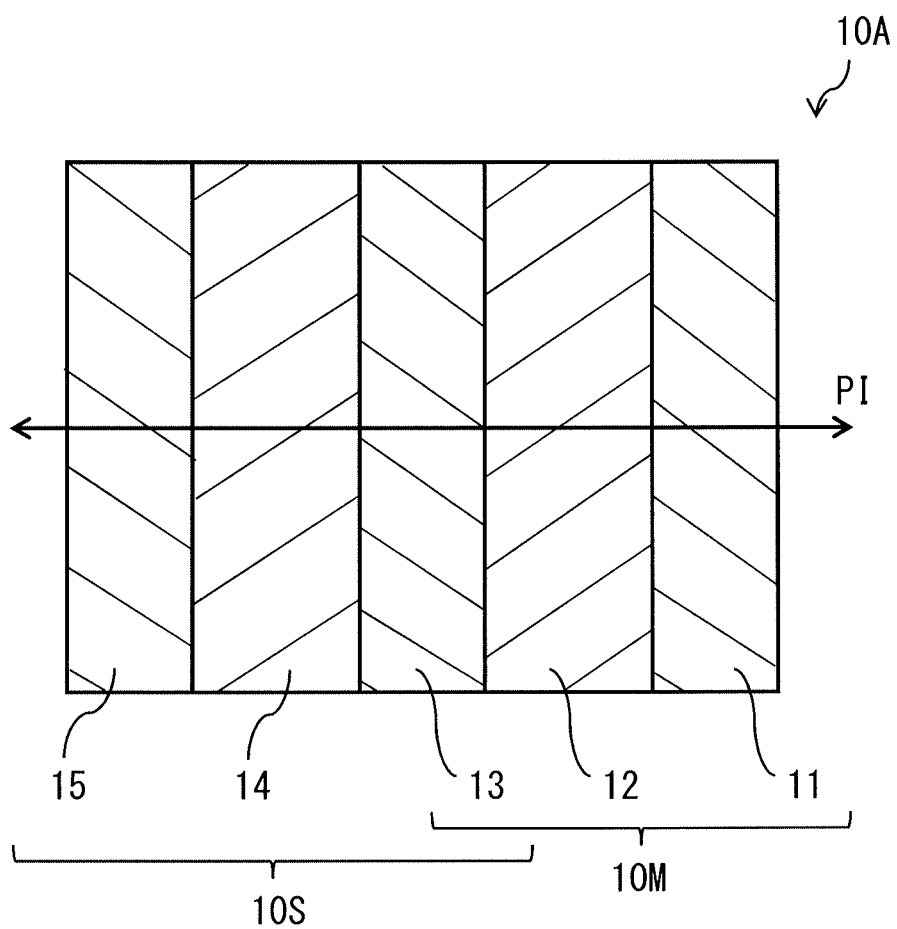
FIG. 5 is a view of one example of a cross-sectional configuration of a memory cell in FIG. 3.

FIG. 5 illustrates one example of a cross-sectional configuration of the memory cell 10A. The memory cell 10A includes a current path PI that includes the memory element 10M and the switch element 10S coupled in series to each other. The memory element 10M corresponds to one specific example of a "memory element" in the disclosure. The switch element 10S corresponds to one specific example of a "switch element" in the disclosure.

The memory element 10M is disposed, for example, close to the word line WL, whereas the switch element 10S is disposed, for example, close to the bit line BL (the vertical bit line VBL). It is to be noted that the memory element 10M may be disposed close to the bit line BL (the vertical bit line VBL), whereas the switch element 10S may be disposed close to the word line WL. Moreover, in a case where in a certain layer, the memory element 10M is disposed close to the word line WL while the switch element 10S is disposed close to the bit line BL (the vertical bit line VBL), in another layer in adjacency to the layer, the memory element 10M may be disposed close to the bit line BL (the vertical bit line VBL), whereas the switch element 10S may be disposed close to the word line WL.

[Memory Element 10M]

The memory element 10M includes an electrode 11, an electrode 13, and a memory layer 12. The electrode 13 is disposed in confronted relation to the electrode 11. The memory layer 12 is provided between the electrode 11 and the electrode 13. The memory layer 12 is constituted by, for example, either a stacked structure in which a resistance variable layer and an ion source layer are stacked, or a single-layer structure of the resistance variable layer. The resistance variable layer is constituted by, for example, an insulating layer made of, for example, SiN, $SiO_2$, $Gd_2O_3$. The ion source layer includes a movable element that forms a conductive path inside the resistance variable layer by application of an electric field. The ion source layer is constituted by, for example, a metal film, an alloy film (e.g., a Cu—Te alloy film), and/or a metal compound film that include one or more metal elements selected from, for example, Cu, Ag, Zr, and Al. It is to be noted that other metal elements than Cu, Ag, Zr, and Al may be used for the ion source layer insofar as the metal elements have property of high ionizability. Moreover, the ion source layer may also be constituted by a material of a combination of at least one element out of Cu, Ag, Zr, and Al with at least one chalcogen element out of S, Se, and Te.

[Switch Element 10S]

The switch element 10S includes an electrode 15, the electrode 13, and a switch layer 14. The electrode 13 is disposed in confronted relation to the electrode 15 and also serves as the electrode of the memory element 10M. The switch layer 14 is provided between the electrode 15 and the electrode 13. The switch layer 14 is so constituted as to include, for example, at least one chalcogen element out of S, Se, and Te. It is preferable that the switch layer 14 be so constituted as to further include at least one element out of B, Al, Ga, C, Si, Ge, N, P, As, Ab, and Bi, in addition to the chalcogen element as mentioned above.

The switch layer 14 changes to the low resistance state by increasing an applied voltage to a predetermined threshold voltage (a switching threshold voltage) or more, and changes to the high resistance state by decreasing the applied voltage to a voltage lower than the threshold voltage (the switching threshold voltage) as mentioned above. In other words, in the switch layer 14, an amorphous structure of the switch layer 14 is stably maintained regardless of application of a voltage pulse or a current pulse through the electrode 15 and the electrode 13. Moreover, the switch layer 14 does not perform memory operation in which, for example, the conductive path is maintained after erasure of the applied voltage. The conductive path is formed by movement of ions by voltage application.

[I-V Characteristics of Memory Cell 10A]

Description is given next of I-V characteristics of the memory cell 10A. In the following, described are I-V characteristics of each of the switch element 10S and the memory element 10M that constitute the memory cell 10A, and thereafter, described is the I-V characteristics of the memory cell 10A.

First, described is the I-V characteristics of the memory element 10M. In the memory element 10M, an increase in a forward bias (a write voltage) is accompanied by an increase in a current value. At a predetermined write voltage (for example, the order of about 3.5V), write operation is carried out by formation of the conductive path in the resistance variable layer. Thus, the memory layer 12 changes to the low resistance state, causing an increase in the current. In other words, the memory element 10M is brought to the low resistance state by the application of the write voltage. This low resistance state is also maintained after suspension of the applied voltage.

With the write voltage being applied to the switch element 10S, in the switch element 10S, the increase in the write voltage is accompanied by the increase in the current. With the write voltage exceeding a predetermined threshold voltage (for example, the order of about 4V), OTS operation causes a rapid increase in the current, or a decrease in resistance. Thus, the switch element 10S is brought to an ON state. After this, decreasing the write voltage causes a gradual decrease in a value of the current that flows through the electrode of the switch element 10S. For example, although it depends on constituent materials and conditions of formation of the switch element 10S, the resistance rapidly increases at the threshold voltage substantially equivalent to that of the case of the increase. Thus, the switch element 10S is brought to an OFF state.

Switching behavior of the current value in the start and the suspension of the application of the write voltage to the memory cell 10A constitutes an I-V curve of a combination of I-V curves of the switch element 10S and the memory element 10M. In the memory cell 10A as described, for example, in a V/2 bias system, a read voltage (Vread) of the memory cell 10A is set at a voltage larger than a threshold at which a rapid resistance change occurs on the I-V curve, whereas Vread/2 is set at a voltage smaller than the threshold of the resistance change. This results in an increase in a selection ratio (an ON/OFF ratio) defined as a current ratio between a Vread bias and a Vread/2 bias. Moreover, as described above, the I-V curve of the memory cell 10A is the combination of the I-V curve of the switch element 10S and the I-V curve of the memory element 10M. Therefore, the larger the resistance change (or a current change) around the threshold in the switch element 10S is, the larger the selection ratio (the ON/OFF ratio) becomes. Furthermore, as described above, the I-V curve of the memory cell 10A is the combination of the I-V curve of the switch element 10S and the I-V curve of the memory element 10M. Therefore, the larger the resistance change (or the current change) around the threshold in the switch element 10S is, the larger the selection ratio (the ON/OFF ratio) becomes. In addition, the larger the selection ratio is, the larger a read margin becomes. This makes it possible to increase an array size without erroneous reading, allowing for further enlargement of capacity of the memory cell array. This applies not only to read operation but also to the write operation.

Meanwhile, with a reverse bias (here, an erasure voltage) being applied, the change in the current value in the application of the erasure voltage to the switch element 10S exhibits similar behavior to that of the application of the write voltage. In contrast, regarding the change in the current value in the application of the erasure voltage to the memory element 10M, voltage application of an erasure threshold voltage (for example, the order of about 2V to 3V) or more causes a change from the low resistance state to the high resistance state. Furthermore, the change in the current value in the application of the erasure voltage to the memory cell 10A is the combination of the I-V curve of the switch element 10S and the I-V curve of the memory element 10M, as with the case of the application of the write voltage.

[Control Circuit 20]

Next, the control circuit 20 is described. For example, as illustrated in FIG. 2, the control circuit 20 includes a BL driver circuit 21, a WL driver circuit 22, two BL decoders 23A and 23B, two WL decoders 24A and 24B, a pre-charge circuit 25, and a read circuit 26. The BL driver circuit 21 and the pre-charge circuit 25 control the voltage to be applied to the two BL decoders 23A and 23B, in accordance with a control by the memory controller 300. The WL driver circuit 22 and the pre-charge circuit 25 control the voltage to be applied to the two WL decoders 24A and 24B, in accordance with the control by the memory controller 300. The memory controller 300 controls the BL driver circuit 21, the WL driver circuit 22, and the pre-charge circuit 25, and controls the BL decoder 23A, the BL decoder 23B, the WL decoder 24A, and the WL decoder 24B independently from one another.

It is to be noted that a circuit constituted by the BL driver circuit 21, the WL driver circuit 22, the pre-charge circuit 25, and the power supply circuit 500 corresponds to one specific example of a "voltage control circuit" in the disclosure. The WL decoder 24A corresponds to one specific example of a "first decoder circuit" in the disclosure. The WL decoder 24B corresponds to one specific example of a "second decoder circuit" in the disclosure. The BL decoder 23A corresponds to one specific example of a "third decoder circuit" in the disclosure. The BL decoder 23B corresponds to one specific example of a "fourth decoder circuit" in the disclosure.

Figure 6:
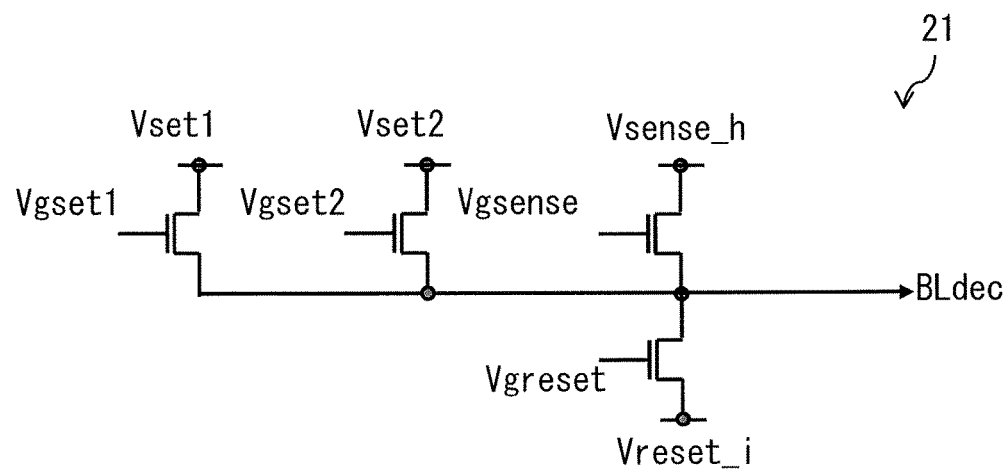
FIG. 6 is a diagram that illustrates one example of a circuit configuration of a BL driver circuit in FIG. 2.

FIG. 6 illustrates one example of a circuit configuration of the BL driver circuit 21. The BL driver circuit 21 controls a voltage to be supplied to the two BL decoders 23A and 23B. The BL driver circuit 21 selects, in accordance with the control by the memory controller 300, one voltage from four kinds of the voltages (Vset1, Vset2, Vsense_h, and Vreset_i) supplied from the power supply circuit 500. The BL driver circuit 21 outputs the voltage thus selected, to the BL decoders 23A and 23B (specifically, to an input terminal dry described later). The four kinds of the voltages (Vset1, Vset2, Vsense_h, and Vreset_i) correspond to one specific example of a "third voltage" in the disclosure. In the write operation, the BL driver circuit 21 selects the set voltage Vse1 or the set voltage Vse2, and outputs it to the BL decoders 23A and 23B. In the read operation, the BL driver circuit 21 selects the sense voltage Vsense_h, and outputs it to the BL decoders 23A and 23B. In reset operation, the BL driver circuit 21 selects the reset voltage Vreset_i, and outputs it to the BL decoders 23A and 23B.

The memory controller 300 outputs control signals Vgset1, Vgset2, Vgsense, and Vgreset to the BL driver circuit 21, and thereby allows the BL driver circuit 21 to select one voltage from the four kinds of the voltages (Vset1, Vset2, Vsense_h, and Vreset_i). The BL driver circuit 21 selects, on the basis of the control signals Vgset1, Vgset2, Vgsense, Vgreset from the memory controller 300, one voltage from the four kinds of the voltages (Vset1, Vset2, Vsense_h, and Vreset_i), and outputs it to the BL decoders 23A and 23B.

Figure 7:
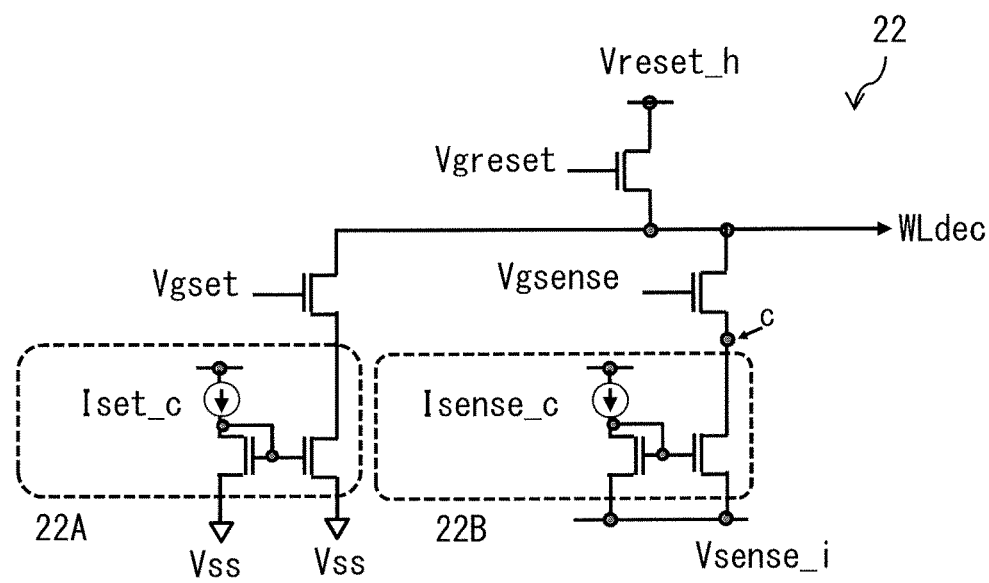
FIG. 7 is a diagram that illustrates one example of a circuit configuration of a WL driver circuit in FIG. 2.

FIG. 7 illustrates one example of a circuit configuration of the WL driver circuit 22. The WL driver circuit 22 controls a voltage to be supplied to the two WL decoders 24A and 24B. The WL driver circuit 22 selects one voltage from three kinds of voltages (Vss, Vsense_i, and Vreset_h) supplied from the power supply circuit 500, in accordance with the control by the memory controller 300. The WL driver circuit 22 outputs the voltage thus selected, to the WL decoders 24A and 24B (specifically, to the input terminal dry described later). The three kinds of the voltages (Vss, Vsense and Vreset_h) correspond to one specific example of a "first voltage" in the disclosure. In the write operation, the WL driver circuit 22 selects the ground voltage Vss, and outputs it to the WL decoders 24A and 24B. In the read operation, the WL driver circuit 22 selects the sense voltage Vsense_i, and outputs it to the WL decoders 24A and 24B. In the reset operation, the WL driver circuit 22 selects the reset voltage Vreset_h, and outputs it to the WL decoders 24A and 24B.

The memory controller 300 outputs the control signals Vgset, Vgsense, and Vgreset to the WL driver circuit 22, and thereby allows the WL driver circuit 22 to select one voltage from the three kinds of the voltages (Vss, Vsense_i, and Vreset_h). The WL driver circuit 22 selects, on the basis of the control signals Vgset, Vgsense, and Vgreset from the memory controller 300, one voltage from the three kinds of the voltages (Vss, Vsense_i, and Vreset_h), and outputs it to the WL decoders 24A and 24B.

Furthermore, in selecting the ground voltage Vss, the WL driver circuit 22 limits a current flowing through the selected word line WL to a prescribed current value (Iset_c). Specifically, in a case where the current flowing through the selected word line WL is smaller than Iset_c, the WL driver circuit 22 applies the ground voltage Vss to the selected word line WL. In a case where the current flowing through the selected word line WL is equal to or larger than Iset_c, the WL driver circuit 22 outputs a voltage larger than the ground voltage Vss, in order to keep the current flowing through the selected word line WL from being larger than Iset_c. As described, limiting the current value to Iset_c leads to suppression of degradation of characteristics caused by an excessively large current flow through the selected memory cell 10.

Furthermore, in selecting the sense voltage Vsense_i, the WL driver circuit 22 limits the current flowing through the selected word line WL to a prescribed current value (Isens_c). Specifically, in a case where the current flowing through the selected word line WL is smaller than Isens_c, the WL driver circuit 22 applies the sense voltage Vsense_i to the selected word line WL. In a case where the current flowing through the selected word line WL is equal to or larger than Isens_c, the WL driver circuit 22 outputs a voltage larger than the sense voltage Vsense_i, in order to keep the current flowing through the selected word line WL from being larger than Isens_c. As described, limiting the current value to Isens_c leads to the suppression of the degradation of the characteristics caused by the excessively large current flow through the selected memory cell 10.

Figure 8:
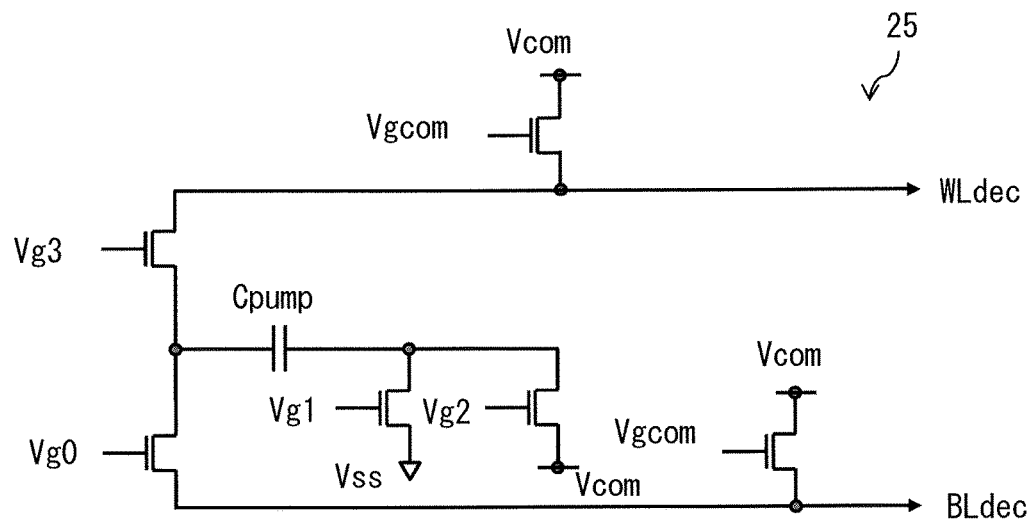
FIG. 8 is a diagram that illustrates one example of a circuit configuration of a pre-charge circuit in FIG. 2.

FIG. 8 illustrates one example of a circuit configuration of the pre-charge circuit 25. The pre-charge circuit 25 controls voltages to be supplied to the two BL decoders 23A and 23B and to the two WL decoders 24A and 24B. The pre-charge circuit 25 selects, in accordance with the control by the memory controller 300, output destinations of a voltage (a voltage A) larger by predetermined magnitude than a single kind of the voltage (Vcom) supplied from the power supply circuit 500, and of a voltage (a voltage B) smaller by predetermined magnitude than the voltage Vcom. The pre-charge circuit 25 outputs the voltage A and the voltage B to the output destinations thus selected. In the write operation or in the read operation, the pre-charge circuit 25 selects the voltage A as a voltage Vpre_w, and outputs it to the WL decoders 24A and 24B (specifically, to an input terminal com described later). In the write operation or in the read operation, the pre-charge circuit 25 selects the voltage B as a voltage Vpre_b, and outputs it to the BL decoders 23A and 23B (specifically, to the input terminal com described later). Moreover, in the reset operation, the pre-charge circuit 25 selects the voltage B as the voltage Vpre_w, and outputs it to the WL decoders 24A and 24B. In the reset operation, the pre-charge circuit 25 selects the voltage A as the voltage Vpre_b, and outputs it to the BL decoders 23A and 23B. The voltage Vpre_w corresponds to one specific example of a "second voltage" in the disclosure. The voltage Vpre_b corresponds to one specific example of a "fourth voltage" in the disclosure.

The voltage Vpre_w is a voltage higher than the voltage Vpre_b. The voltage Vpre_w and the voltage Vpre_b are so set as to allow a difference between the voltage Vpre_w and the voltage Vpre_b to be smaller than $\frac{1}{3}$ of a highest voltage (the voltage Vsens_h−the voltage Vsens_i) to be applied to the memory cell 10A as a target of selection in the read operation. Moreover, the voltage Vpre_w and the voltage Vpre_b are so set as to allow the difference between the voltage Vpre_w and the voltage Vpre_b to be smaller than $\frac{1}{3}$ of a highest voltage (the voltage Vset1) to be applied to the memory cell 10A as the target of the selection in the writing operation.

The memory controller 300 outputs control signals Vgcom, Vg0, Vg1, Vg2, and Vg3 to the pre-charge circuit 25, and thereby allows the pre-charge circuit 25 to select the output destinations of the two kinds of the voltages (Vpre_w and Vpre_b). The pre-charge circuit 25 selects the output destinations of the two kinds of the voltages (Vpre_w and Vpre_b), on the basis of the control signals Vgcom, Vg0, Vg1, Vg2, and Vg3 from the memory controller 300. Moreover, the pre-charge circuit 25 selects, on the basis of the control signals Vgcom, Vg0, Vg1, Vg2, and Vg3 from the memory controller 300, the single voltage (Vpre_b) from the two kinds of the voltages (Vpre_w and Vpre_b), and outputs it to the WL decoders 24A and 24B.

Figure 9:
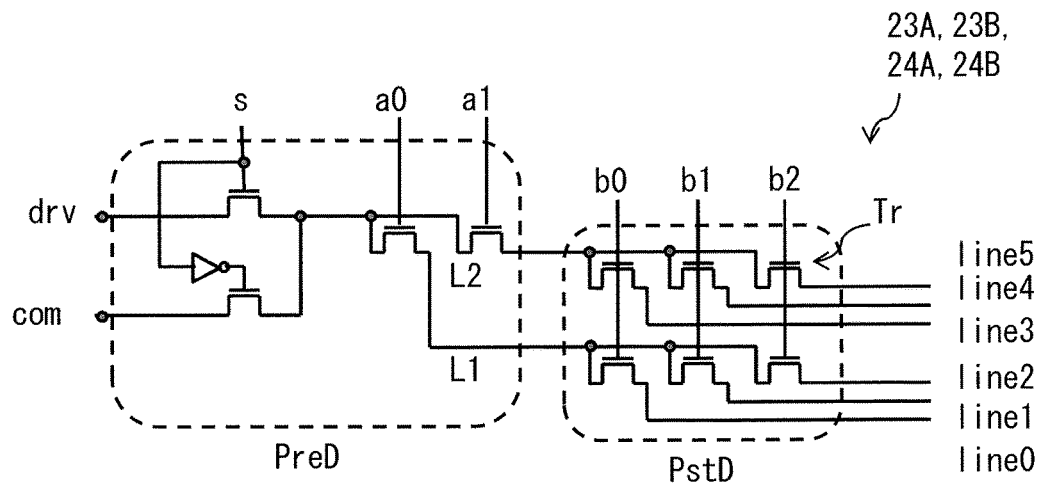
FIG. 9 is a diagram that illustrates one example of a circuit configuration of BL decoders and WL decoders in FIG. 2.

FIG. 9 illustrates one example of a circuit configuration of the BL decoders 23A and 23B, and the WL decoders 24A and 24B. The BL decoders 23A and 23B, and the WL decoders 24A and 24B each include, for example, the two input terminals dry and com, and a plurality of address terminals a0, a1, b0, b1, b2, and s. The BL decoders 23A and 23B, and the WL decoders 24A and 24B each include, for example, a plurality of output terminals line0 to line5. In the following, the output terminals line0 to line5 are generically referred to as output terminals line. It is to be noted that the two input terminals dry and com correspond to one specific example of "two first voltage input terminals" or "two second voltage input terminals" in the disclosure. The plurality of the address terminals a0, a1, b0, b1, b2, and s correspond to one specific example of a "plurality of first address input terminals" or a "plurality of second address input terminals" in the disclosure.

In the BL decoders 23A and 23B, the input terminal dry is coupled to an output terminal BLdec of the BL driver circuit 21, whereas the input terminal com is coupled to an output terminal BLdec of the pre-charge circuit 25. In the WL decoders 24A and 24B, the input terminal dry is coupled to an output terminal WLdec of the WL driver circuit 22, whereas the input terminal com is coupled to the output terminal BLdec of the pre-charge circuit 25. In the BL decoders 23A and 23B, and the WL decoders 24A and 24B, the plurality of the address terminals a0, a1, b0, b1, b2, and s are coupled to an output terminal of the memory controller 300. In the BL decoders 23A and 23B, the output terminals line are coupled, on the one-to-one basis, to the respective bit lines BL different from one another. Specifically, in the BL decoder 23A, the output terminals line are coupled to the respective bit lines BL of odd-numbered columns. In the BL decoder 23B, the output terminals line are coupled to the respective bit lines BL of even-numbered columns. In the WL decoders 24A and 24B, the output terminals line are coupled, on the one-to-one basis, to the respective word lines WL different from one another. Specifically, in the WL decoder 24A, the output terminals line are coupled to the respective word lines WL of odd-numbered rows. In the WL decoder 24B, the output terminals line are coupled to the respective word lines WL of even-numbered rows.

The BL decoders 23A and 23B perform decoding of a column address inputted to the plurality of the address terminals a0, a1, b0, b1, b2, and s, and thereby set a coupling mode between the plurality of the bit lines BL and the two input terminals dry and com. The WL decoders 24A and 24B perform decoding of a row address inputted to the plurality of the address terminals a0, a1, b0, b1, b2, and s, and thereby set a coupling mode between the plurality of the word lines WL and the two input terminals dry and com. The memory controller 300 generates the row address to output the row address to the WL decoders 24A and 24B, and generates the column address to output the column address to the BL decoders 23A and 23B.

The BL decoders 23A and 23B, and the WL decoders 24A and 24B are each constituted by, for example, a pre-decoder PreD and a post-decoder PstD.

The pre-decoder PreD selects one input terminal from the two input terminals drv and com, on the basis of a control signal inputted to the terminal s from the memory controller 300. Furthermore, the pre-decoder PreD sets a coupling mode between the selected input terminal and two wirings L1 and L2, on the basis of a control signal inputted to the terminals a0 and a1 from the memory controller 300. The post-decoder PstD sets a coupling mode between the two wirings L1 and L2 and the plurality of the output terminals line0 to line5, on the basis of a control signal inputted to the terminals b0, b1, and b2 from the memory controller 300.

The post-decoder PstD includes a plurality of switch elements Tr that are equal in number to the output terminals line0 to line5 of the post-decoder PstD. The plurality of the switch elements Tr are provided at a rate of one for each of the output terminals line0 to line5. The switch element Tr is constituted by, for example, an NMOS transistor. In the BL decoders 23A and 23B, the post-decoder PstD includes the plurality of the switch elements Tr that are equal in number to the bit lines BL allotted to the post-decoder PstD. The plurality of the switch elements Tr are provided at a rate of one per each bit line BL. In the WL decoders 24A and 24B, the post-decoder PstD includes the plurality of the switch elements Tr that are equal in number to the word lines WL allotted to the post-decoder PstD. The plurality of the switch elements Tr are provided at a rate of one per each word line WL. Accordingly, in the post-decoder PstD, the switch elements Tr are provided at a rate of one for each of the output terminals line. The switch elements Tr are dedicated to respective ones of the output terminals line, without being shared by the other output terminals line. A decoder in which the post-decoder PstD has such a configuration is called a 1T decoder.

FIG. 10 is a truth table of the BL decoders 23A and 23B, and the WL decoders 24A and 24B. The WL decoders 24A and 24B sets, on the basis of the row address inputted to the terminals a0, a1, b0, b1, b2 and s from the memory controller 300, the coupling mode between the input terminals drv and com, and the output terminals line0 to line5, as summarized in the truth table in FIG. 10. The BL decoders 23A and 23B sets, on the basis of the column address inputted to the terminals a0, a1, b0, b1, b2, and s from the memory controller 300, the coupling mode between the input terminals drv and com, and the output terminals line0 to line5, as summarized in the truth table in FIG. 10. As summarized in the truth table in FIG. 10, solely one input terminal out of the input terminals drv and com becomes conductive to the other output terminals than the output terminal in a floating state, out of the output terminals line0 to line5.

It is to be noted that in FIG. 10, "0" means a low voltage (Low), whereas "1" means a convention voltage (High). Accordingly, the switch element supplied with "0" is brought to the OFF (non-conductive) state. The switch element supplied with "1" is brought to the ON (conductive) state. Moreover, in FIG. 10, the term "z" means the floating state. The term "drv" means being brought to the conductive state to the input terminal drv. The term "com" means being brought to the conductive state to the input terminal com.

Figure 11:
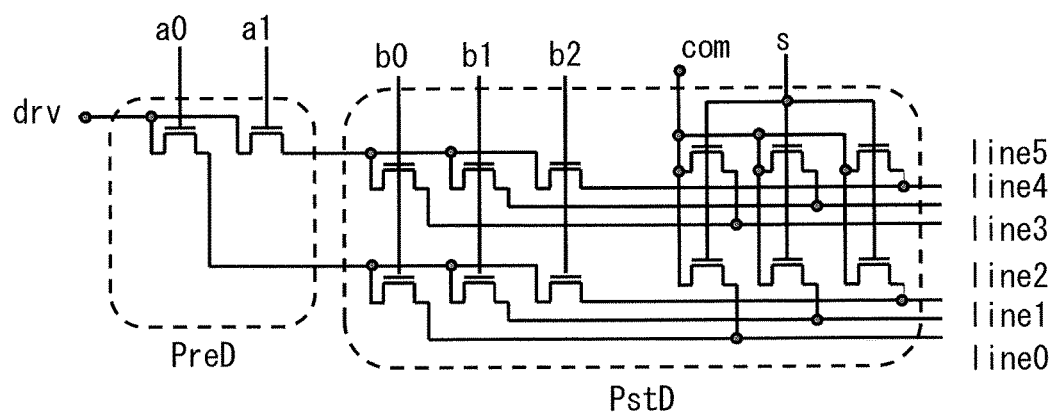
FIG. 11 is a diagram that illustrates one example of a circuit configuration of a decoder according to a comparative example.

FIG. 11 illustrates one example of a circuit configuration of a decoder according to a comparative example. FIG. 12 is a truth table of the decoder according to the comparative example. The decoder according to the comparative example includes, for example, the two input terminals drv and com, and the plurality of the address terminals a0, a1, b0, b1, b2 and s. The decoder according to the comparative example includes, for example, the plurality of the output terminals line0 to line5. In other words, in these terms, the decoder according to the comparative example has a similar configuration to those of the BL decoders 23A and 23B, and the WL decoders 24A and 24B.

However, in the post-decoder PstD of the decoder according to the comparative example, the switch elements are provided at a rate of two for each of the output terminals line. The switch elements are dedicated to respective ones of the output terminals line, without being shared by the other output terminals line. A decoder in which the post-decoder PstD has such a configuration is called a 2T decoder. One of the switch elements is used in setting of the coupling mode between the input terminal drv provided in the pre-decoder PreD and the output terminals line0 to line5. Another of the switch elements is used in setting of the coupling mode between the input terminal com provided in the post-decoder PstD and the output terminals line0 to line5.

It is to be noted that as summarized in the truth table in FIG. 12, in a case where the address terminal s is supplied with "1", one of the output terminals line becomes conductive to both the input terminal drv and the input terminal com. At this occasion, allowing a gate width of the switch element to be controlled by the terminal s to be smaller than a gate width of the switch element to be controlled by the terminals a0, a1, b0 to b2 makes it possible to allow impedance of the input terminal drv to be lower than impedance of the input terminal com, with the switch element is turned on. Accordingly, in a case where the decoder according to the comparative example has such a configuration, a voltage of the output terminal line that is conductive to the input terminal drv serves as a voltage of the input terminal drv.

The decoder according to the comparative example outputs, with the configuration called the 2T decoder, two kinds of voltages (exclusive of the floating state) to the output terminals line0 to line5. Meanwhile, the BL decoders 23A and 23B, and the WL decoders 24A and 24B output, with the configuration called the 1T decoder, a single kind of a voltage (exclusive of the floating state) to the output terminals line0 to line5. Accordingly, in the BL decoders 23A and 23B, and the WL decoders 24A and 24B, circuit area of the post-decoder PstD is smaller than that of the decoder according to the comparative example, owing to the smaller number of the switch elements in the post-decoder PstD.

The read circuit 26 reads data written to the memory cell array 10, in accordance with the control by the memory controller 300. The read circuit 26 includes, for example, a sense amplifier coupled to each of the output terminals line of the WL decoders 24A and 24B. In the read operation, the read circuit 26 detects, with the sense amplifier, a voltage of each of the output terminals line of the WL decoders 24A and 24B. The read circuit 26 outputs a result detected, to the memory controller 300.

[Operation]

Next described is operation of the memory system 200. In the following, description is given in the following order: the write operation, the reset operation, and the read operation.

[Write Operation]

Figure 13A:
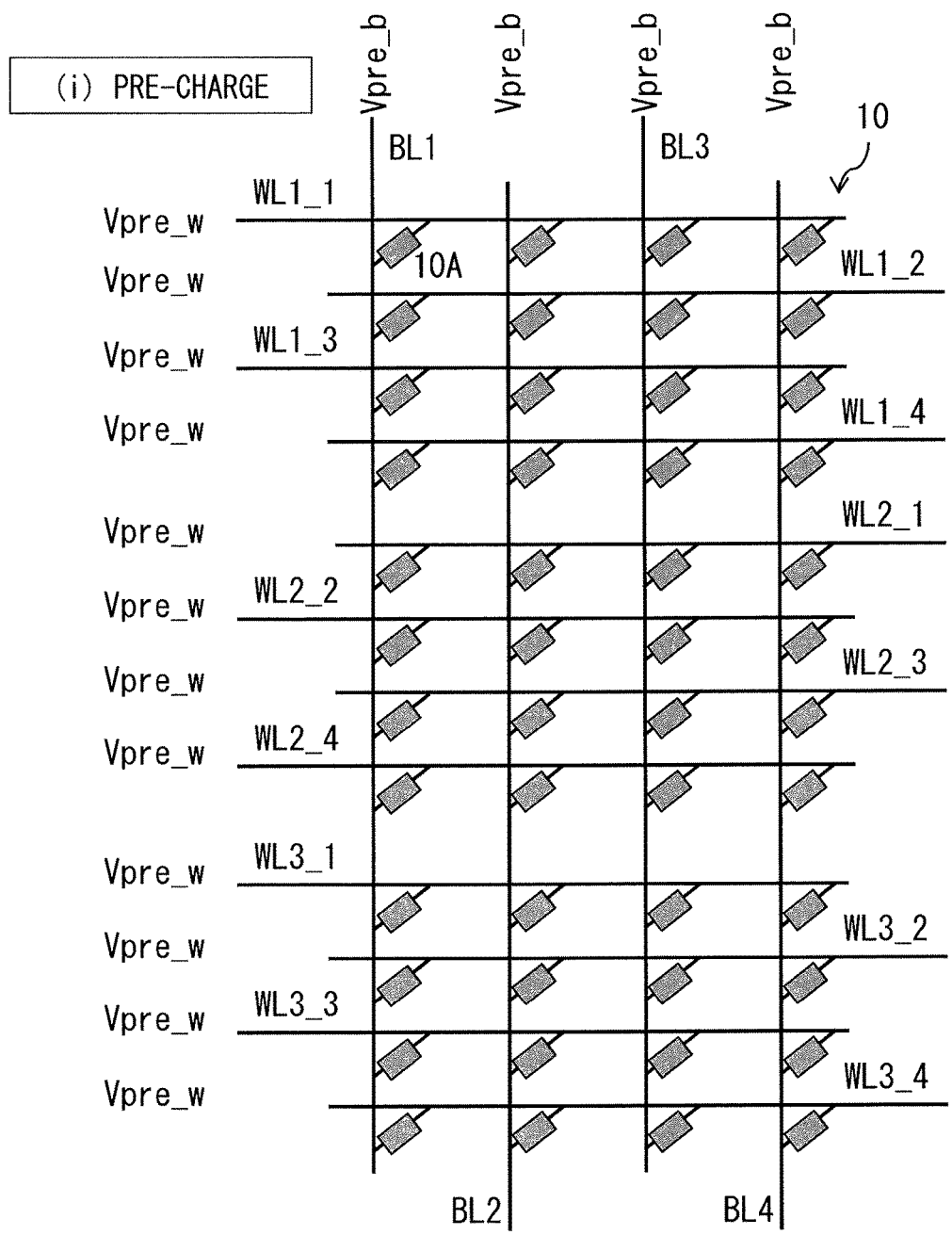
FIG. 13A is a diagram that illustrates one example of a voltage to be applied to the memory cell array in pre-charge.
Figure 13B:
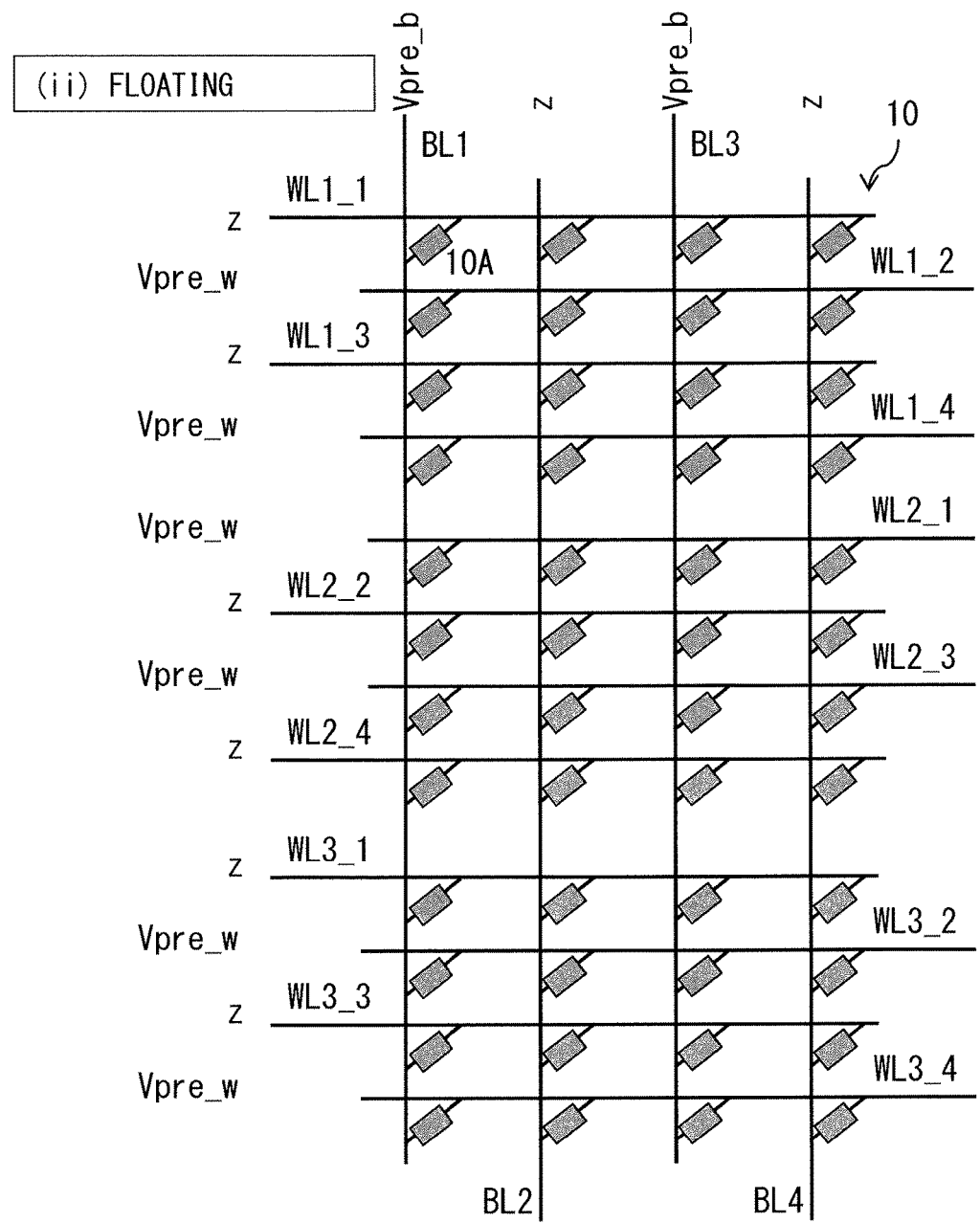
FIG. 13B is a diagram that illustrates one example of a voltage to be applied to the memory cell array in floating.
Figure 13C:
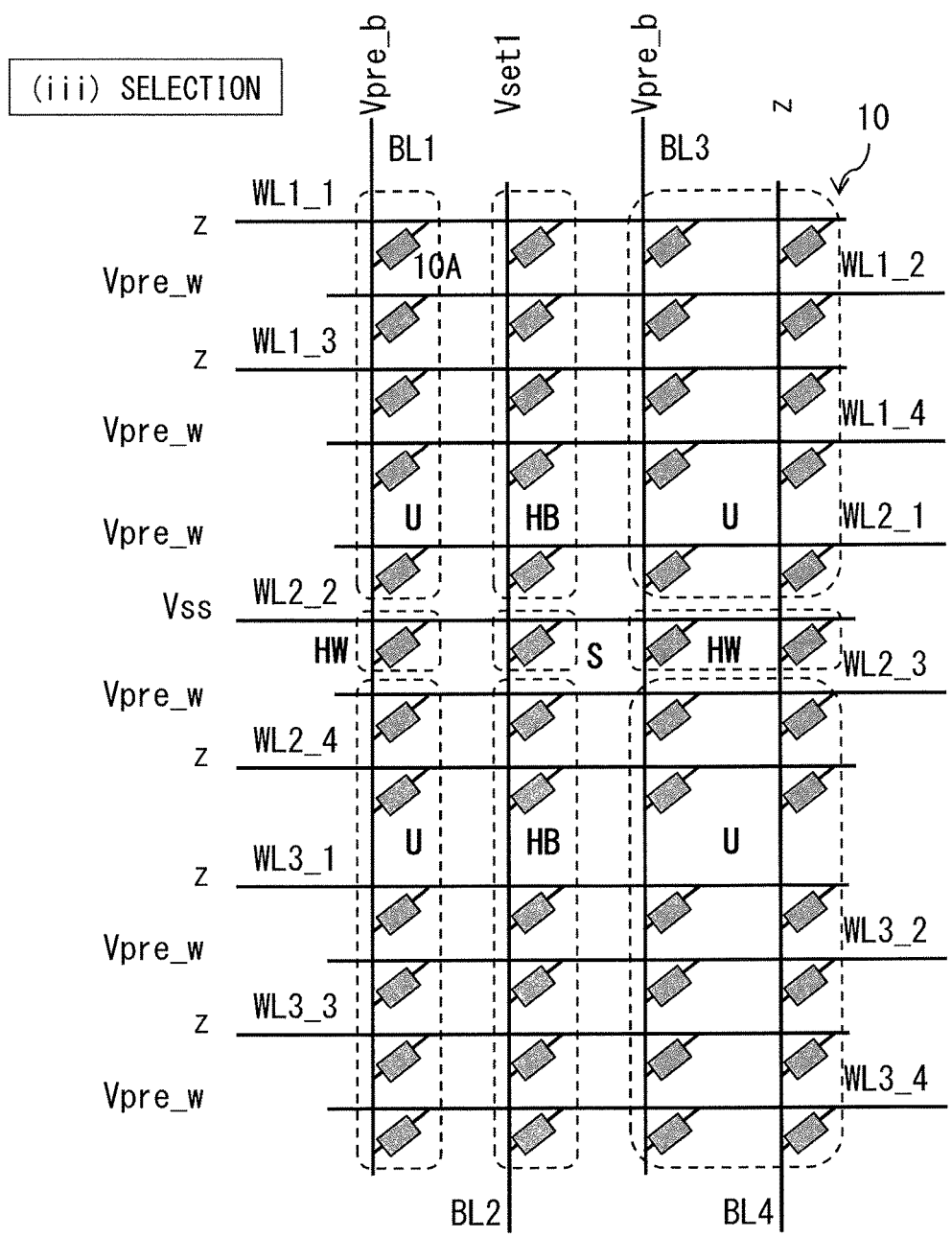
FIG. 13C is a diagram that illustrates one example of a voltage to be applied to the memory cell array in writing.
Figure 13D:
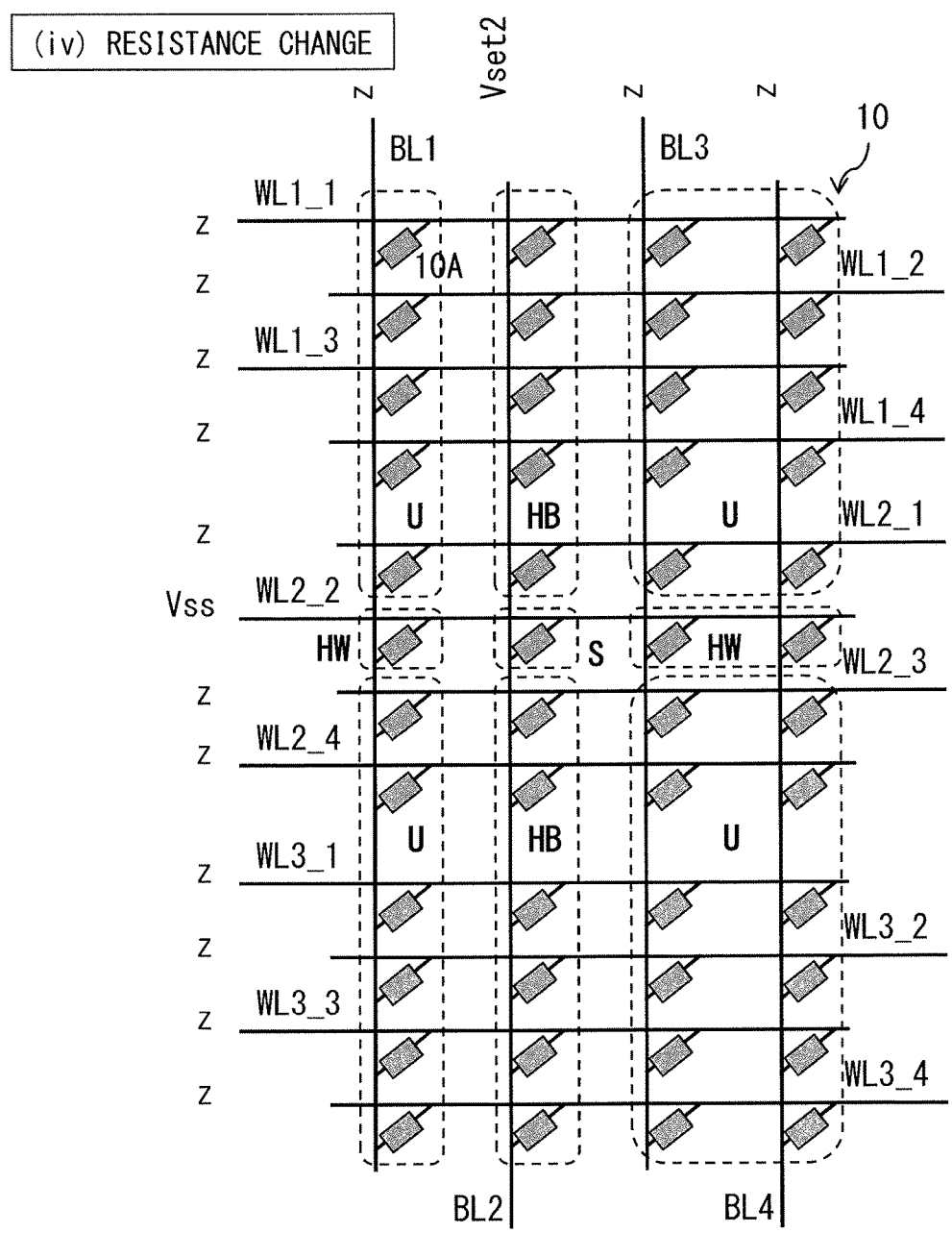
FIG. 13D is a diagram that illustrates one example of a voltage to be applied to the memory cell array after the writing.
Figure 14:
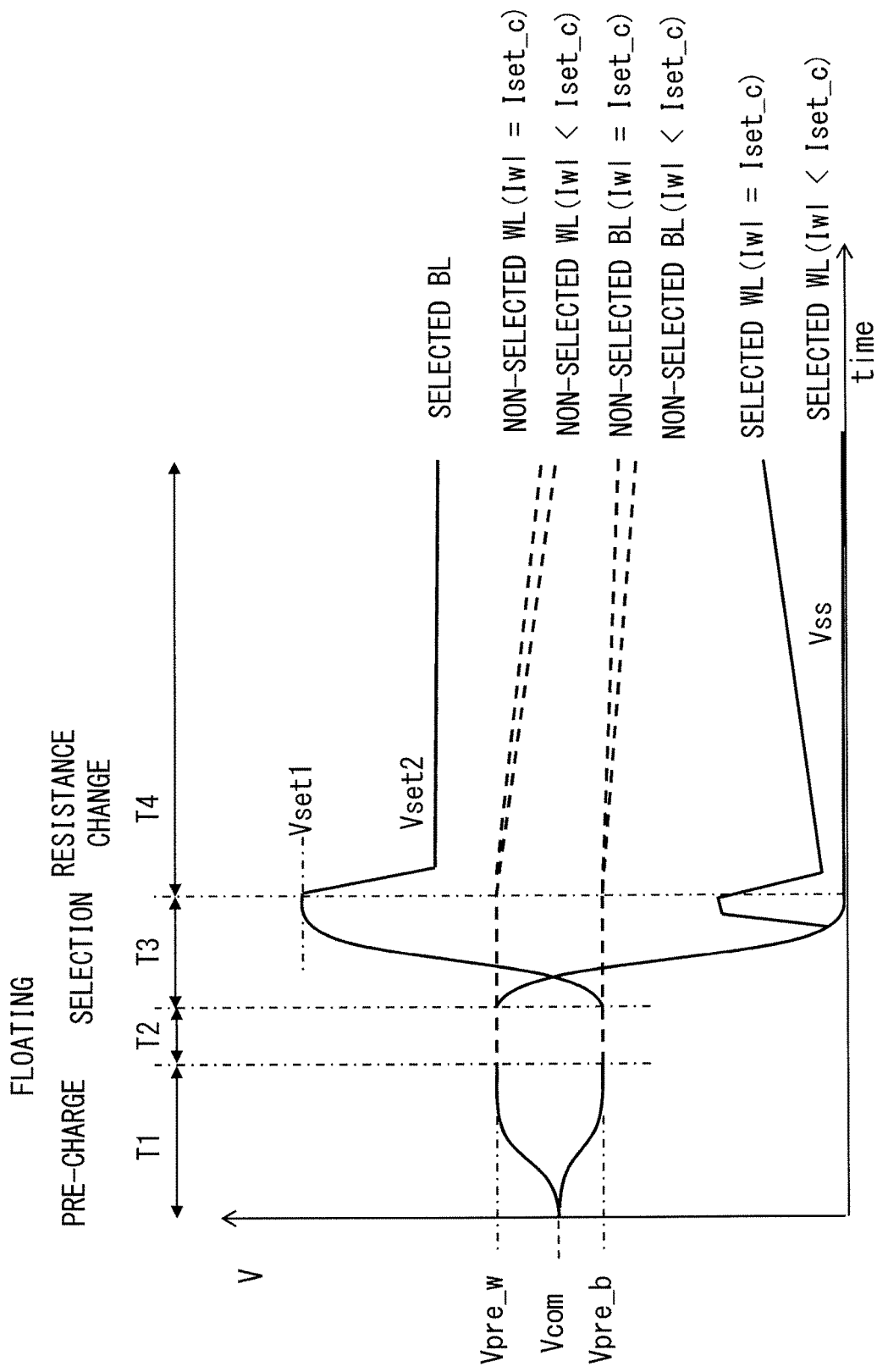
FIG. 14 is a diagram that illustrates one example of a voltage waveform in a memory cell as a target of the writing.

FIG. 13A illustrates one example of a voltage to be applied to the memory cell array 10 in pre-charge. FIG. 13B illustrates one example of a voltage to be applied to the memory cell array 10 in floating. FIG. 13C illustrates one example of a voltage to be applied to the memory cell array 10 in the writing. FIG. 13D illustrates one example of a voltage to be applied to the memory cell array 10 after the writing. FIG. 14 illustrates one example of a voltage waveform in the memory cell 10A as a target of the writing.

The memory system 200 executes the write operation in the following order: (i) the pre-charge, (ii) the floating, (iii) the selection, and (iv) the resistance change.

(i) Pre-Charge

The memory controller 300 outputs, to the WL decoders 24A and 24B, the row address (a third row address) that couples each of the word lines WL to the input terminals dry of the WL decoders 24A and 24B. Furthermore, the memory controller 300 outputs, to the BL decoders 23A and 23B, the column address (a third column address) that couples the voltage of each of the bit lines BL to the input terminals dry of the BL decoders 23A and 23B. Thus, all the bit lines BL and all the word lines WL are coupled to the pre-charge circuit 25.

Furthermore, the memory controller 300 outputs, to the pre-charge circuit 25, a control signal provided for outputting the voltage (the voltage A) as the voltage Vpre_w to the WL decoders 24A and 24B. The voltage (the voltage A) is larger than the voltage Vcom by the predetermined magnitude. Furthermore, the memory controller 300 outputs, to the pre-charge circuit 25, a control signal provided for outputting the voltage (the voltage B) as the voltage Vpre_b to the BL decoders 23A and 23B. The voltage (the voltage B) is smaller than the voltage Vcom by the predetermined magnitude.

For example, the memory controller 300 brings Vgcom of the pre-charge circuit 25 to High, brings the voltages of each of the bit lines BL and each of the word lines WL to Vgcom, and thereafter, brings Vgcom of the pre-charge circuit 25 to Low. Thereafter, for example, the memory controller 300 brings Vg0 and Vg1 of the pre-charge circuit 25 to High, and brings Vg2 and Vg3 to Low. This causes part of charges charged in the bit line BL to move to a capacitor Cpump, causing the voltage of the bit line BL to lower. Thereafter, for example, the memory controller 300 brings Vg0 and Vg1 of the pre-charge circuit 25 to Low, and brings Vg2 and Vg3 to High. This causes part of charges of the capacitor Cpump to move to the word line WL, causing the voltage of the word line WL to increase. As a result, the voltage of the bit line BL becomes the voltage Vpre_b lower than the Vcom, while the voltage of the word linen WL becomes the voltage Vpre_w higher than the Vcom (FIG. 13A, and a term T1 in FIG. 14).

(ii) Floating

Thereafter, the memory controller 300 outputs the row address and the column address that bring each of the word lines WL and each of the bit lines BL to the floating state, to the decoders to be coupled to the memory cell 10A as the target of the selection (e.g., the WL decoder 24A and the BL decoder 23B). For example, the memory controller 300 brings all the address terminals a0, a1, b1, b2, b3 and s of the WL decoder 24A and the BL decoder 23B to Low. This brings each of the word lines WL and each of the bit lines BL that are coupled to the WL decoder 24A and the BL decoder 23B to the floating state (FIG. 13B, and a term T2 in FIG. 14).

(iii) Selection

Thereafter, the memory controller 300 outputs, as the row address, a first row address to the decoder to be coupled to the memory cell 10A as the target of the selection (e.g., the WL decoder 24A). Furthermore, the memory controller 300 outputs, as the row address, a second row address to the decoder that is devoid of coupling to the memory cell 10A as the target of the selection (e.g., the WL decoder 24B). Here, the first row address is a row address that couples the word line WL coupled to the memory cell 10A as the target of the selection (e.g., WL2_2) to the input terminal dry of the WL decoder 24A, and brings each of the word lines WL that are devoid of the coupling to the memory cell 10A as the target of the selection to the floating state. Moreover, the second row address is a row address that couples, to the input terminal dry of the WL decoder 24B, at least each of the word lines WL (e.g., WL2_1, WL2_3, WL1_2, and WL3_2) in adjacency to the word line WL (e.g., WL2_2) coupled to the memory cell 10A as the target of the selection, out of the plurality of the word lines WL.

Furthermore, the memory controller 300 outputs, as the column address, a first column address to the decoder circuit to be coupled to the memory cell 10A as the target of the selection (e.g., the BL decoder 23B). Furthermore, the memory controller 300 outputs, as the column address, a second column address to the decoder circuit that is devoid of the coupling to the memory cell 10A as the target of the selection (e.g., the BL decoder 23A). Here, the first column address is a column address that couples the bit line BL coupled to the memory cell 10A as the target of the selection (e.g., BL2) to the input terminal dry of the BL decoder 23B, and sets each of the bit lines BL that are devoid of the coupling to the memory cell 10A as the target of the selection (e.g., BL4) at the floating state. Moreover, the second column address is a column address that couples, to the input terminal dry of the BL decoder 23A, at least each of the bit lines BL (e.g., BL1 and BL3) in adjacency to the bit line BL (e.g., BL2) coupled to the memory cell 10A as the target of the selection, out of the plurality of the bit lines BL.

Furthermore, the memory controller 300 outputs, to the WL driver 22, a control signal provided for outputting the voltage Vss to the WL decoders 24A and 24B. For example, the memory controller 300 brings Vgset of the WL driver 22 to High, and brings Vgreset and Vgsense of the WL driver 22 to Low. Furthermore, the memory controller 300 outputs, to the BL driver 21, a control signal provided for outputting the voltage Vset1 to the BL decoders 23A and 23B. For example, the memory controller 300 brings Vgset1 of the BL driver 21 to High, and brings Vgset2, Vgreset, and Vgsense of the BL driver 21 to Low. This causes the decoder (e.g., the BL decoder 23B and the WL decoder 24A) coupled to the memory cell 10A as the target of the selection (a selected memory cell S) to output the voltage Vset1 and the voltage Vss, and as a result, to apply the voltage Vset1−the voltage Vss (=a set voltage) to the selected memory cell S (FIG. 13C, and a term T3 in FIG. 14). Here, the set voltage is a voltage of magnitude large enough to cause a voltage equal to or larger than a write threshold voltage to be applied to the memory element 10M in the selected memory cell S. The write threshold voltage is a voltage at which the memory element 10M changes from the high resistance state to the low resistance state.

To the memory cells 10A (half selected memory cells HW) in the same row in adjacency to the selected memory cell S, the decoders coupled to the half selected memory cells HW (e.g., the BL decoder 23A and the WL decoder 24A) apply the voltage Vpre_b–the voltage Vss. To the memory cells 10A (half selected memory cells HB) in the same column in adjacency to the selected memory cell S, the decoders coupled to the half selected memory cells HB (e.g., the BL decoder 23B and the WL decoder 24B) apply the voltage Vset1–the voltage Vpre_w. Thus, to the selected memory cell S, applied is the set voltage. As a result, resistance of the selected memory cell S starts to lower from high resistance. Furthermore, to each of the half selected memory cells HW and each of the half selected memory cells HB in adjacency to the selected memory cell S, applied is a fixed voltage that is smaller than the set voltage and is small enough to keep the resistance change in the memory cell 10A from occurring.

(iv) Resistance Change

Thereafter, the memory controller 300 outputs the row address and the column address that bring each of the word lines WL and each of the bit lines BL to the floating state, to the decoders that are devoid of the coupling to the memory cell 10A as the target of the selection (e.g., the WL decoder 24B and the BL decoder 23A). For example, the memory controller 300 brings all the address terminals a0, a1, b1, b2, b3, and s of the WL decoder 24B and the BL decoder 23A to Low. This brings each of the word lines WL and each of the bit lines BL coupled to the WL decoder 24B and the BL decoder 23A to the floating state (FIG. 13D).

At this occasion, furthermore, the memory controller 300 outputs, to the BL driver 21, a control signal provided for changing the voltage to be outputted to the BL decoders 23A and 23B from the voltage Vset1 to the voltage Vset2. For example, the memory controller 300 brings Vgset1, Vgreset, and Vgsense of the BL driver 21 to Low, and brings Vgset2 of the BL driver 21 to High. As a result, to the memory cell 10A as the target of the selection (the selected memory cell S), applied is the voltage Vset2–the voltage Vss (FIG. 13D, and a term T4 in FIG. 14). Consequently, the resistance of the selected memory cell S further lowers from the high resistance state, and the selected memory cell S is brought to the low resistance state.

It is to be noted that in FIG. 14, a stippled part of voltage transition of the non-selected word line WL (non-selected WL) and the non-selected bit lines BL (non-selected BL) means that at least some of the non-selected WL and the non-selected BL are in the floating state. There exists parasitic capacitance between the word lines WL, between the bit lines BL, and between the word line WL and the bit line BL. A current flows into the non-selected word line WL in the floating state, from the selected bit line BL, through the half selected memory cell. Moreover, a current flows out to the non-selected bit line BL through the half selected memory cell. Thus, the parasitic capacitance as mentioned above is charged and discharged by the respective currents, causing variations in the voltages of the non-selected word lines WL in the floating state. The same applies to the non-selected bit lines BL in the floating state.

Moreover, magnitude of each of the currents changes depending on not only the voltages of the selected bit line BL and the selected word line WL but also the state of a non-selected memory cell (the high resistance state or the low resistance state). In the example in FIG. 14, the stippled voltages of the non-selected bit line BL and the non-selected word line WL gradually lower in "(iv) the resistance change". However, depending on the state of the non-selected memory cell, the stippled voltages of the non-selected bit line BL and the non-selected word line WL may increase in "(iv) the resistance change". Alternatively, there may be variations in the change in the voltages. For example, the voltage of one of the non-selected word lines WL may increase while another of the non-selected word lines WL may lower. In FIG. 14, a line labeled as "(Iwl<Iset_c)" indicates each voltage transition in a case where a current Iwl flowing through the selected word lines WL is smaller than Iset_c. A line labeled as "(Iwl=Iset_c)" indicates each voltage transition in a case where the current Iwl flowing through the selected word line WL has reached Iset_c.

It is to be noted that with the resistance value of the memory element 10M lowering to cause the current flowing through the memory element 10M to be equal to or larger than a certain value, workings of a current mirror circuit 22A in the WL driver 22 causes an increase in an output voltage from the WL driver 22 and a decrease in a voltage applied to between both ends of the memory cell 10A, leading to suppression of the increase in the current. This is a reason why in FIG. 14, the voltage of the selected WL (Iwl=Isec_c) increases in (iv) the resistance change.

Figure 15:
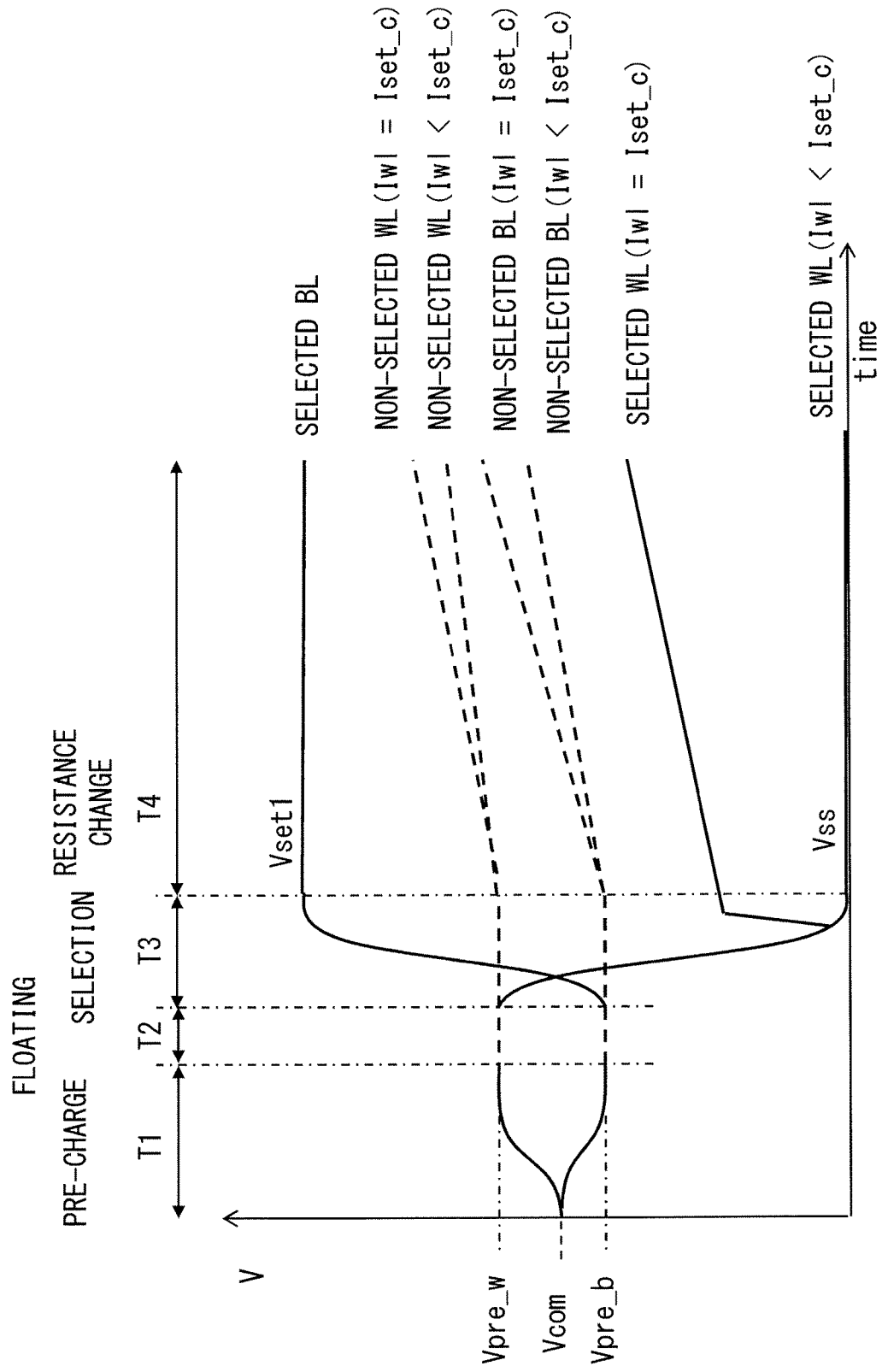
FIG. 15 is a diagram that illustrates another example of the voltage waveform in the memory cell as the target of the writing.

FIG. 15 is a diagram that illustrates another example of the voltage waveform in the memory cell 10A as the target of the writing. In this embodiment, in (iv) the resistance change, the memory controller 300 may output, to the BL driver 21, a control signal provided for using the voltage Vset1, as the voltage to be outputted to the BL decoders 23A and 23B, instead of using the voltage Vset2.

However, there are concerns as follows. In (iv) the resistance change, in a case where the set voltage Vset2 is not used but solely the set voltage Vset1 is used, the voltage of the selected bit line BL is kept high. Accordingly, the voltages of the non-selected bit line BL and the non-selected word line WL generally become higher than those in the case of FIG. 14. At this occasion, in a case where the current Iwl flowing through the selected word line WL is smaller than Isec_c "(Iwl<Isec_c)", a potential difference between the non-selected bit line BL and the selected word line WL reaches the voltage Vsnap of the switch element 10S, causing the current Iset to flow through the half selected memory cell, and resulting in possibility of occurrence of an unintended resistance change. It is therefore desirable to use the two kinds of the set voltages Vset1 and Vset2.

[Reset Operation]

Figure 16A:
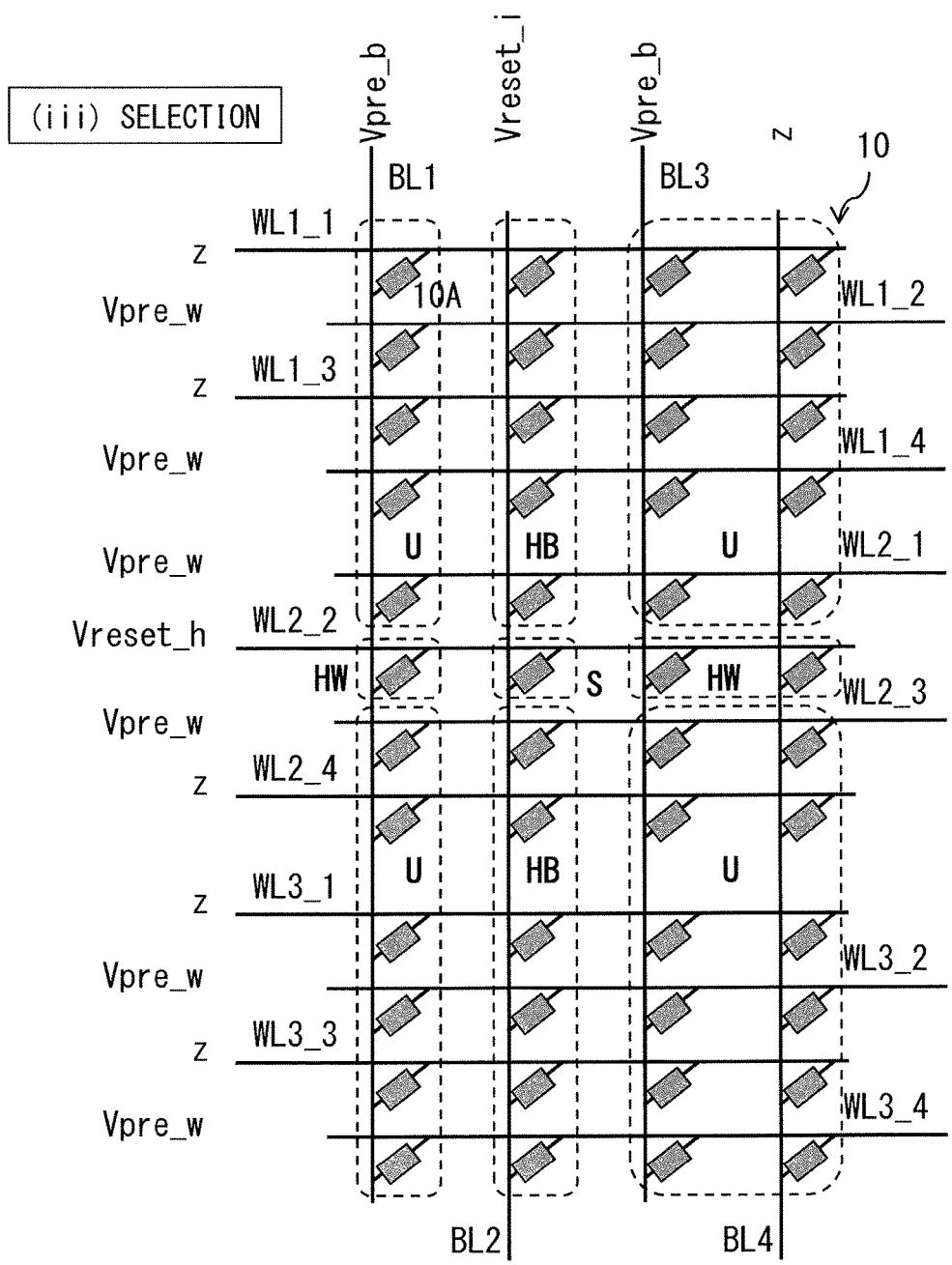
FIG. 16A is a diagram that illustrates one example of a voltage to be applied to the memory cell array in a reset.
Figure 16B:
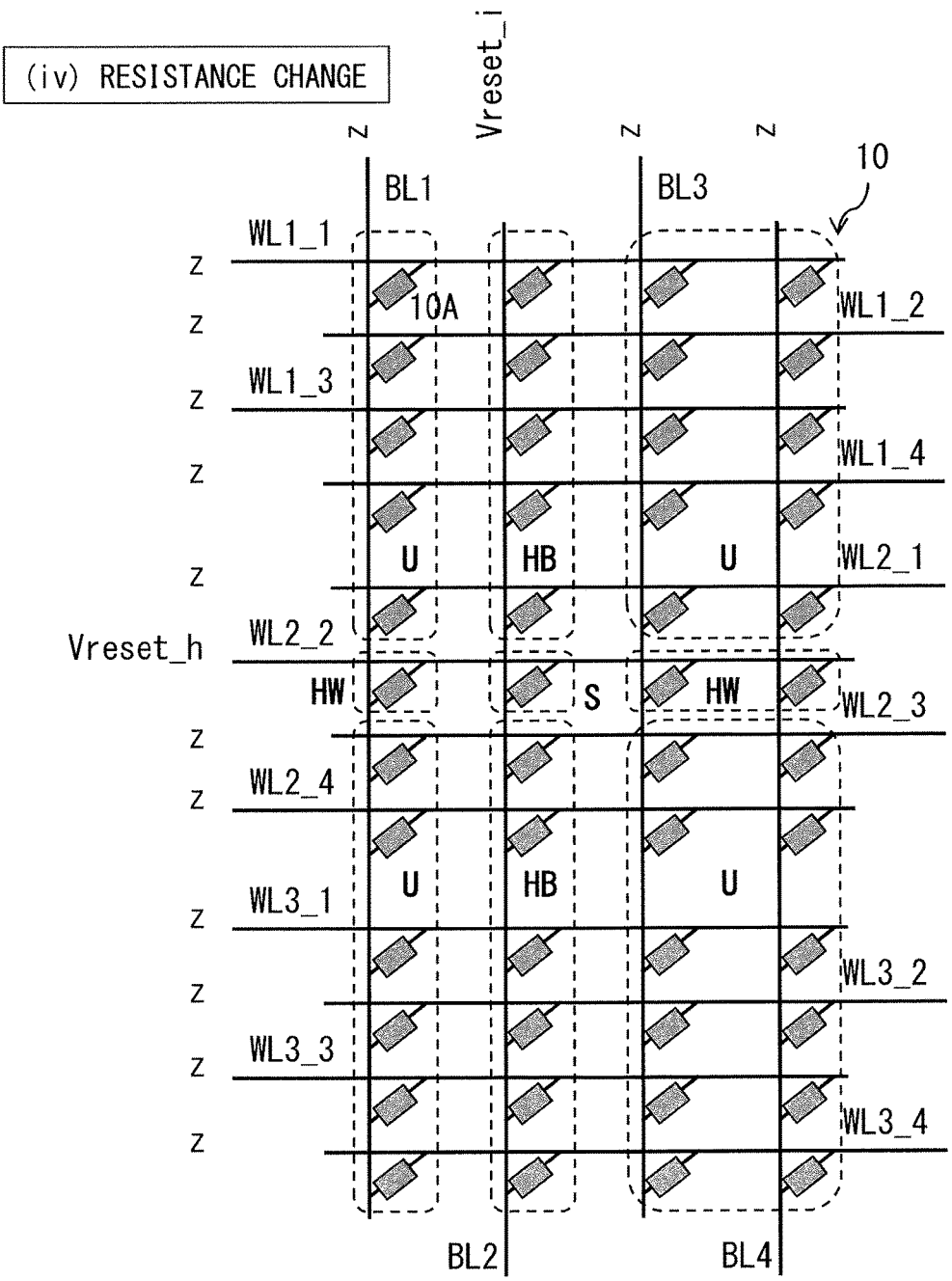
FIG. 16B is a diagram that illustrates one example of a voltage to be applied to the memory cell array after the reset.
Figure 17:
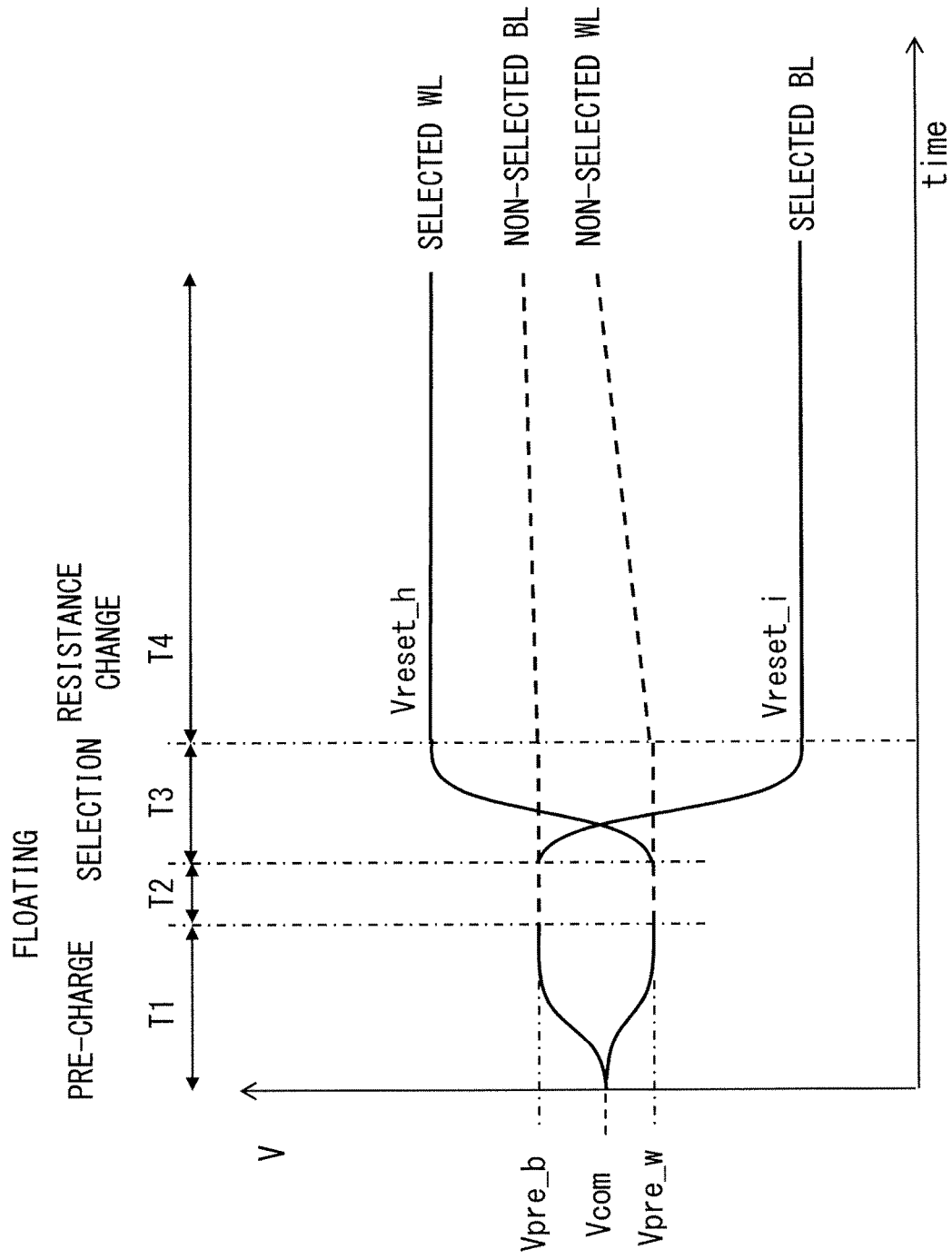
FIG. 17 is a diagram that illustrates one example of a voltage waveform in a memory cell as a target of the reset.

FIG. 16A illustrates one example of a voltage to be applied to the memory cell array 10 in a reset. FIG. 16B illustrates one example of a voltage to be applied to the memory cell array 10 after the reset. FIG. 17 illustrates one example of a voltage waveform in the memory cell 10A as a target of the writing. It is to be noted that in (i) the pre-charge and (ii) the floating of the reset operation, one example of the voltage to be applied to the memory cell array 10 is similar to that in FIGS. 13A and 13B.

The memory system 200 executes the reset operation in the following order: (i) the pre-charge, (ii) the floating, (iii) the selection, and (iv) the resistance change.

(i) Pre-Charge

The memory controller 300 outputs, to the WL decoders 24A and 24B, the row address (the third row address) that couples each of the word lines WL to the input terminals dry of the WL decoders 24A and 24B. Furthermore, the memory controller 300 outputs, to the BL decoders 23A and 23B, the column address (the third column address) that couples the voltage of each of the bit lines BL to the input terminals dry of the BL decoders 23A and 23B. Thus, all the bit lines BL and all the word lines WL are coupled to the pre-charge circuit 25.

Furthermore, the memory controller 300 outputs, to the pre-charge circuit 25, a control signal provided for outputting the voltage (the voltage B) as the voltage Vpre_w to the WL decoders 24A and 24B. The voltage (the voltage B) is smaller than the voltage Vcom by the predetermined magnitude. Furthermore, the memory controller 300 outputs, to the pre-charge circuit 25, a control signal provided for outputting the voltage (the voltage A) as the voltage Vpre_b to the BL decoders 23A and 23B. The voltage (the voltage A) is larger than the voltage Vcom by the predetermined magnitude.

For example, the memory controller 300 brings Vgcom of the pre-charge circuit 25 to High, brings the voltages of each of the bit lines BL and each of the word lines WL to Vgcom, and thereafter, brings Vgcom of the pre-charge circuit 25 to Low. Thereafter, the memory controller 300 brings Vg3 and Vg1 of the pre-charge circuit 25 to High, and brings Vg2 and Vg0 to Low. This causes part of the charges charged in the word line WL to move to the capacitor Cpump, causing the voltage of the word line WL to lower. Thereafter, for example, the memory controller 300 brings Vg3 and Vg1 of the pre-charge circuit 25 to Low, and brings Vg2 and Vg0 to High. This causes part of the charges of the capacitor Cpump to move to the bit line BL, causing the voltage of the bit line BL to increase. As a result, the voltage of the word line WL becomes the voltage Vpre_w lower than Vcom, while the voltage of the bit line BL becomes the voltage Vpre_b higher than Vcom (FIG. 13A, and the term T1 in FIG. 17).

(ii) Floating

Thereafter, the memory controller 300 outputs the row address and the column address that bring each of the word lines WL and each of the bit lines BL to the floating state, to the decoder to be coupled to the memory cell 10A as the target of the selection (e.g., the WL decoder 24A and the BL decoder 23B). For example, the memory controller 300 brings all the address terminals a0, a1, b1, b2, b3, and s of the WL decoder 24A and the BL decoder 23B to Low. This brings each of the word lines WL and each of the bit lines BL coupled to the WL decoder 24A and the BL decoder 23B to the floating state (FIG. 13B, and the term T2 in FIG. 17).

(iii) Selection

Thereafter, the memory controller 300 outputs, as the row address, the first row address as mentioned above, to the decoder to be coupled to the memory cell 10A as the target of the selection (e.g., the WL decoder 24A). Furthermore, the memory controller 300 outputs, as the row address, the second row address as mentioned above, to the decoder that is devoid of the coupling to the memory cell 10A as the target of the selection (e.g., the WL decoder 24B). Furthermore, the memory controller 300 outputs, as the column address, the first column address as mentioned above, to the decoder circuit to be coupled to the memory cell 10A as the target of the selection (e.g., the BL decoder 23B). Furthermore, the memory controller 300 outputs, as the column address, the second column address as mentioned above, to the decoder circuit that is devoid of the coupling to the memory cell 10A as the target of the selection (e.g., the BL decoder 23A).

Furthermore, the memory controller 300 outputs, to the WL driver 22, a control signal provided for outputting the voltage Vreset_h to the WL decoders 24A and 24B. For example, the memory controller 300 brings Vgset and Vgsense of the WL driver 22 to Low, and brings Vgreset of the WL driver 22 to High. Furthermore, the memory controller 300 outputs, to the BL driver 21, a control signal provided for outputting the voltage Vreset_i to the BL decoders 23A and 23B. For example, the memory controller 300 brings Vgset1, Vgset2, and Vgsense of the BL driver 21 to Low, and brings Vgreset of the BL driver 21 to High. This causes the decoders (e.g., the BL decoder 23B and the WL decoder 24A) coupled to the memory cell 10A as the target of the selection (the selected memory cell S) to output the voltage Vreset_h and the voltage Vreset_i, and as a result, to apply the voltage Vreset_h–the voltage Vreset_i (=a reset voltage) to the selected memory cell S (FIG. 16A, and the term T3 in FIG. 17). Here, the reset voltage is a voltage of magnitude large enough to cause a voltage equal to or larger than the erasure threshold voltage to be applied to the memory element 10M in the selected memory cell S. The erasure threshold voltage is a voltage at which the memory element 10M changes from the low resistance state to the high resistance state.

To the memory cells 10A (the half selected memory cells HW) in the same row in adjacency to the selected memory cell S, the decoders coupled to the half selected memory cells HW (e.g., the BL decoder 23A and the WL decoder 24A) apply the voltage Vpre_b–the voltage Vreset_h. To the memory cells 10A (the half selected memory cells HB) in the same column in adjacency to the selected memory cell S, the decoders coupled to the half selected memory cells HB (e.g., the BL decoder 23B and the WL decoder 24B) apply the voltage Vreset_i–the voltage Vpre_w. Thus, to the selected memory cell S, applied is the reset voltage. As a result, the resistance of the selected memory cell S increase from the low resistance, and the selected memory cell S is brought to the high resistance state. Furthermore, to each of the half selected memory cells HW and each of the half selected memory cells HB in adjacency to the selected memory cell S, applied is a fixed voltage that is smaller than the reset voltage and is small enough to keep the resistance change in the memory cell 10A from occurring.

It is to be noted that in the reset operation, because the selected memory cell S changes from the low resistance to the high resistance, there is low possibility that an excessive current flows through the selected memory cell S. Accordingly, it is not necessary to provide a current limiter circuit in a driver that supplies the reset voltage.

(iv) Resistance Change

Thereafter, the memory controller 300 outputs the row address and the column address that bring each of the word lines WL and each of the bit lines BL to the floating state, to the decoders devoid of the coupling to the memory cell 10A as the target of the selection (e.g., the WL decoder 24B and the BL decoder 23A). For example, the memory controller 300 brings all the address terminals a0, a1, b1, b2, b3, and s of the WL decoder 24B and the BL decoder 23A to Low. This brings each of the word lines WL and each of the bit lines BL that are coupled to the WL decoder 24B and the BL decoder 23A to the floating state (FIG. 16B).

In the reset operation, the reset voltage to be applied to the selected memory cell S is smaller than the set voltage. It is therefore conceivable that there is low possibility of occurrence of an unintended resistance change, even in a case with the occurrence of the voltage variations as in the writing operation. Accordingly, in the reset operation, the reset voltage supplied in "(iii) the selection" is maintained in a process of "(iv) the resistance change".

[Read Operation]

Figure 18A:
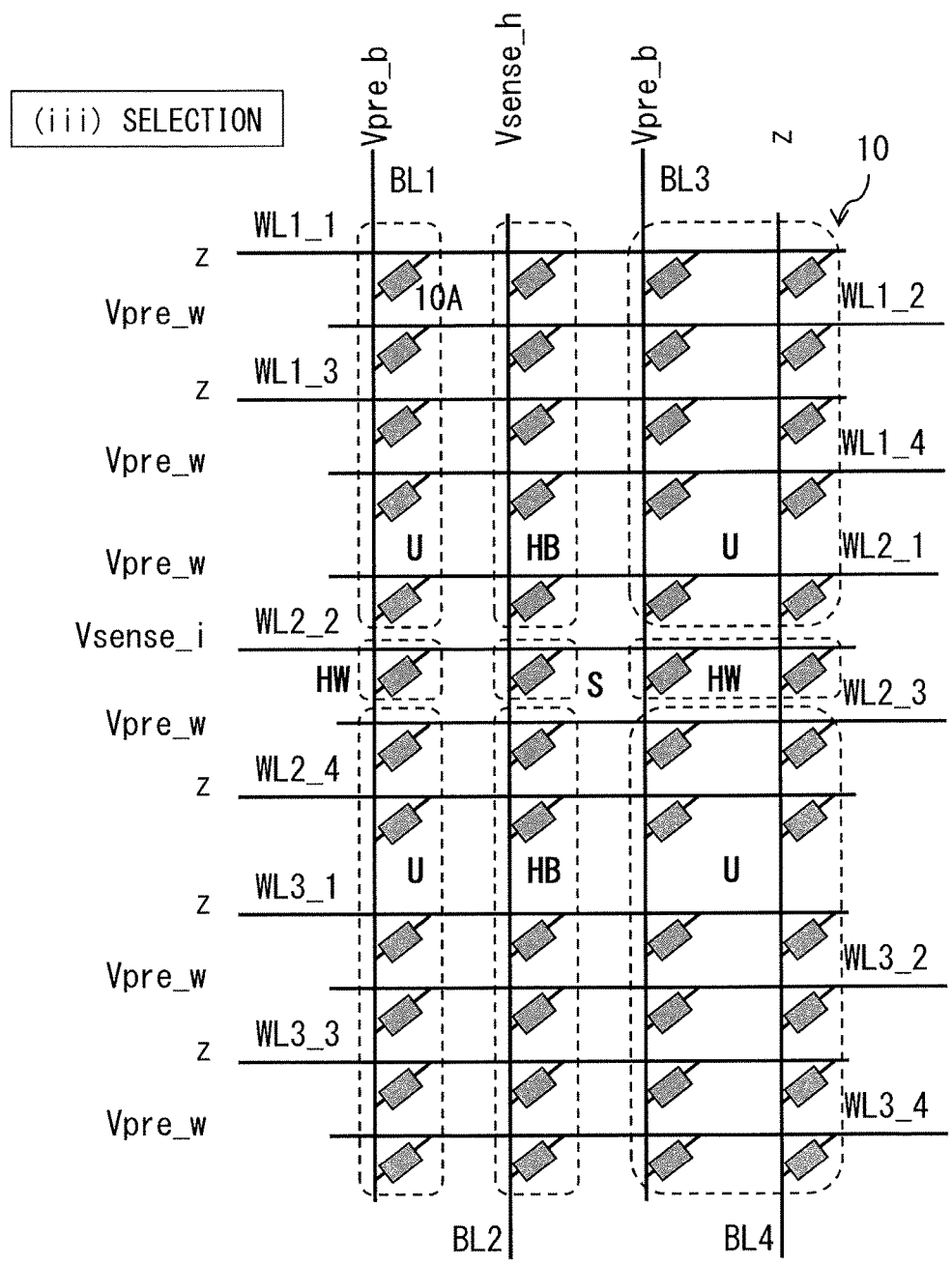
FIG. 18A is a diagram that illustrates one example of a voltage to be applied to the memory cell array in reading.
Figure 18B:
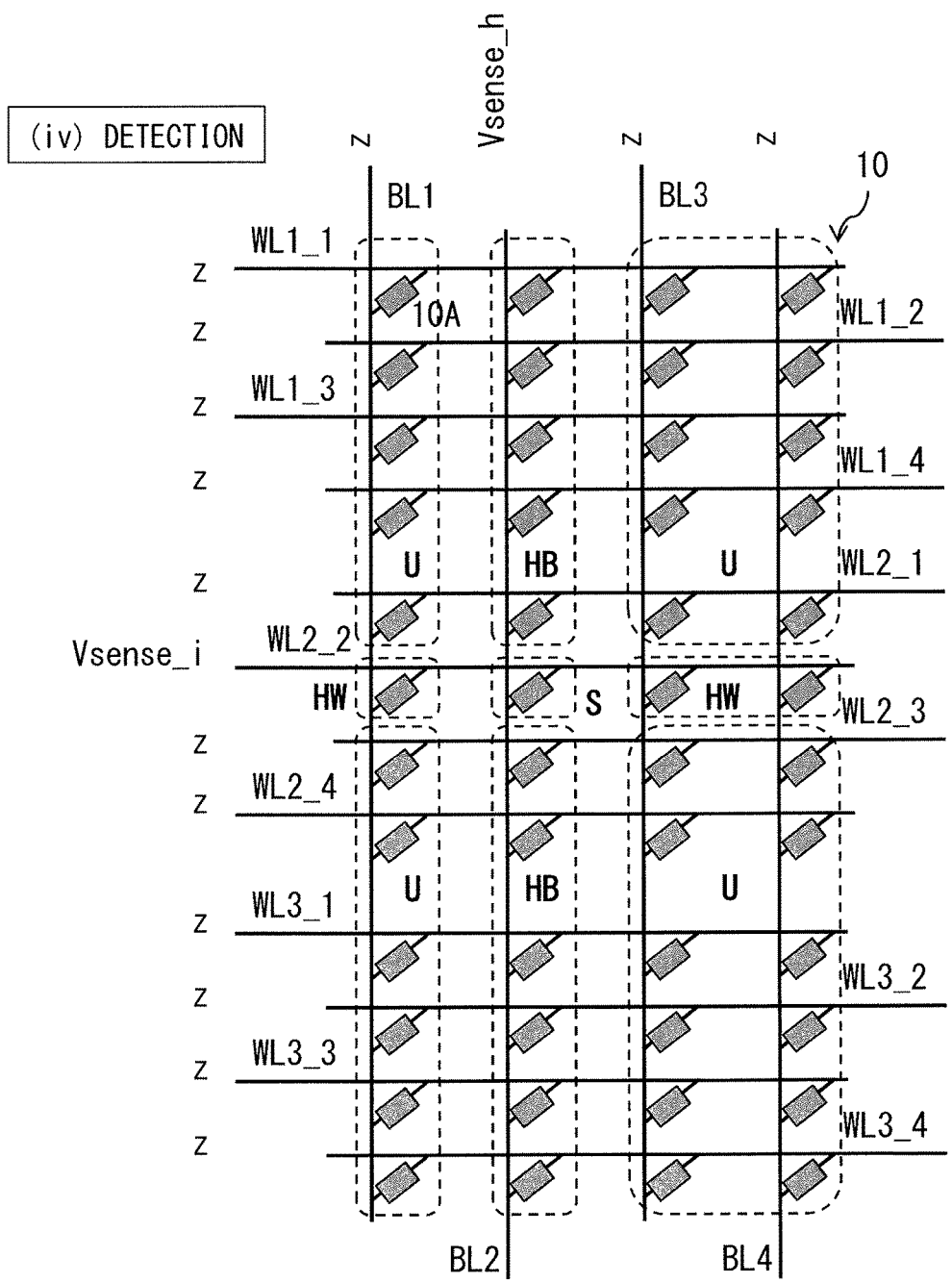
FIG. 18B is a diagram that illustrates one example of a voltage to be applied to the memory cell array after the reading.
Figure 19:
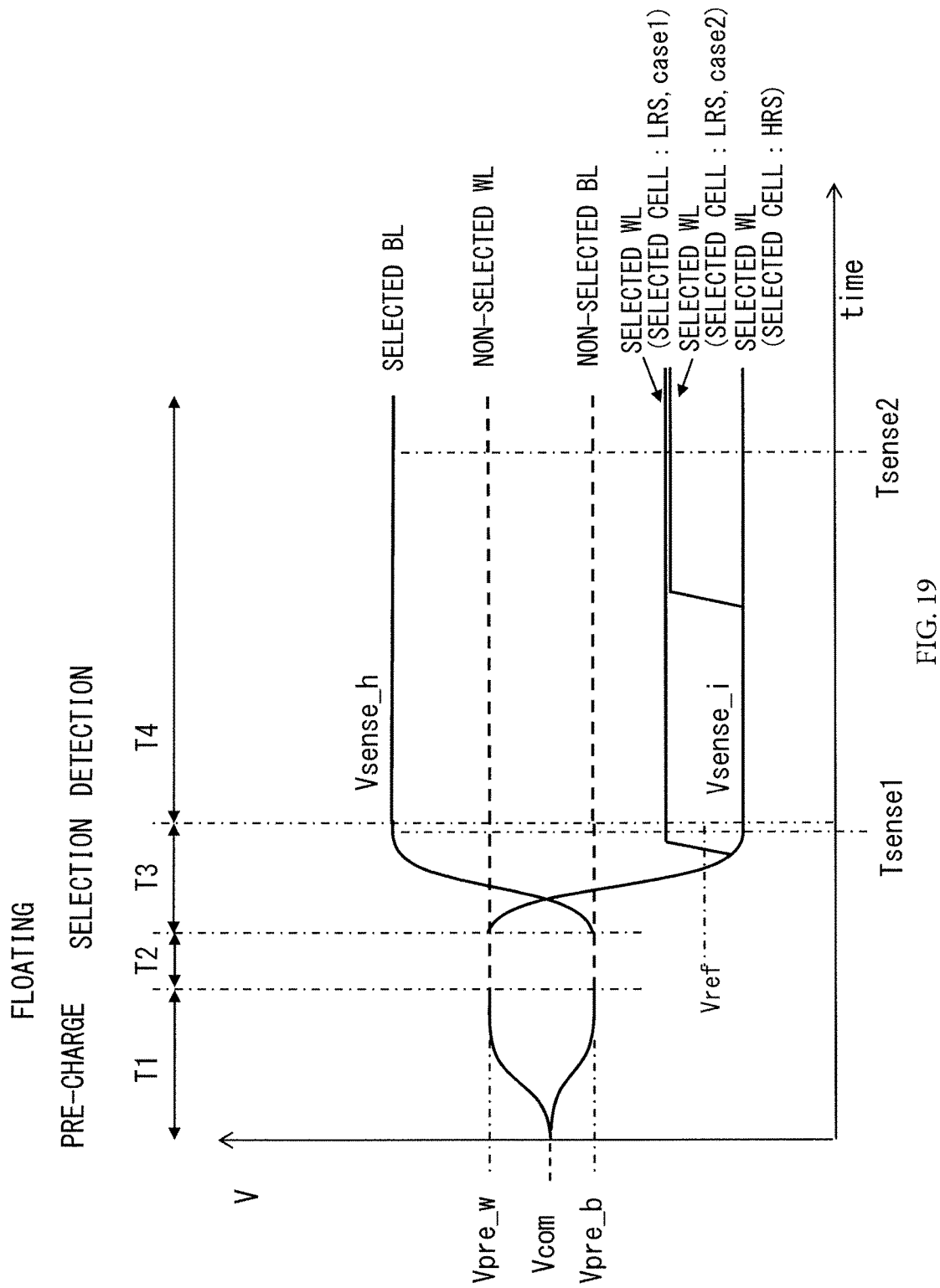
FIG. 19 is a diagram that illustrates one example of a voltage waveform in a memory cell as a target of the reading.

FIG. 18A illustrates one example of a voltage to be applied to the memory cell array 10 in reading. FIG. 18B illustrates one example of a voltage to be applied to the memory cell array 10 after the reading. FIG. 19 illustrates one example of a voltage waveform in the memory cell 10A as a target of the reading. It is to be noted that (i) the pre-charge and (ii) the floating in the read operation is similar to (i) the pre-charge and (ii) the floating in the write operation.

The memory system 200 executes the read operation in the following order: (i) the pre-charge, (ii) the floating, (iii) the selection, and (iv) detection.

(iii) Selection

The memory controller 300 conducts a procedure similar to (i) the pre-charge and (ii) the floating in the write operation, and thereafter, outputs, as the row address, the first row address to the decoder to be coupled to the memory cell 10A as the target of the selection (e.g., the WL decoder 24A). Furthermore, the memory controller 300 outputs, as the row address, the second row address to the decoder devoid of the coupling to the memory cell 10A as the target of the selection (e.g., the WL decoder 24B). Furthermore, the memory controller 300 outputs, as the column address, the first column address to the decoder circuit to be coupled to the memory cell 10A as the target of the selection (e.g., the BL decoder 23B). Furthermore, the memory controller 300 outputs, as the column address, the second column address to the decoder circuit devoid of the coupling to the memory cell 10A as the target of the selection (e.g., the BL decoder 23A).

Furthermore, the memory controller 300 outputs, to the WL driver 22, a control signal provided for outputting the voltage Vsense_i to the WL decoders 24A and 24B. For example, the memory controller 300 brings Vgset and Vgreset of the WL driver 22 to Low, and brings Vgsense of the WL driver 22 to High. Furthermore, the memory controller 300 outputs, to the BL driver 21, a control signal provided for outputting the voltage Vsense_h to the BL decoders 23A and 23B. For example, the memory controller 300 brings Vgset1, Vgset2, and Vgreset of the BL driver 21 to Low, and brings Vgsense of the BL driver 21 to High. This causes the decoders (e.g., the BL decoder 23B and the WL decoder 24A) coupled to the memory cell 10A as the target of the selection (the selected memory cell S) to output the voltage Vsense_i and the voltage Vsense_h, and as a result, to apply the voltage Vsense_i−the voltage Vsense_h (a sense voltage) (FIG. 18A, and the term T3 in FIG. 19). Here, the sense voltage is a voltage of magnitude large enough to cause a voltage smaller than the write threshold voltage to be applied to the memory element 10M in the selected memory cell S, and is a voltage of magnitude large enough to cause a voltage higher than the voltage at which the switch element 10S is turned off to be applied to the switch element 10S in the selected memory cell S. The write threshold voltage is the voltage at which the memory element 10M changes from the high resistance state to the low resistance state.

To the memory cells 10A (the half selected memory cells HW) in the same row in adjacency to the selected memory cell S, the decoders coupled to the half selected memory cells HW (e.g., the BL decoder 23A and the WL decoder 24A) apply the voltage Vpre_b−the voltage Vse·BR>Qi. To the memory cells 10A (the half selected memory cells HB) in the same column in adjacency to the selected memory cell S, the decoders coupled to the half selected memory cells HB (e.g., the BL decoder 23B and the WL decoder 24B) apply the voltage Vsense_h−the voltage Vpre_w. Thus, to the selected memory cell S, applied is the sense voltage. As a result, the resistance of the selected memory cell S keeps the high resistance or the low resistance and remains unchanged. Furthermore, to each of the half selected memory cells HW and each of the half selected memory cells HB in adjacency to the selected memory cell S, applied is a fixed voltage that is smaller than the set voltage and is small enough to keep the memory cell 10A from being selected.

(iv) Detection

Thereafter, the memory controller 300 outputs the row address and the column address that bring each of the word lines WL and each of the bit lines BL to the floating state, to the decoders that are devoid of the coupling to the memory cell 10A as the target of the selection (e.g., the WL decoder 24B and the BL decode 23A). For example, the memory controller 300 brings all the address terminals a0, a1, b1, b2, b3, and s of the WL decoder 24B and the BL decoder 23A to Low. This brings each of the word lines WL and each of the bit lines BL coupled to the WL decoder 24B and the BL decoder 23A to the floating state (FIG. 18B).

In the read operation, the sense voltage to be applied to the selected memory cell S is smaller than the set voltage. It is therefore conceivable that there is low possibility of the occurrence of the unintended resistance change, even in the case with the occurrence of the voltage variations as in the write operation. Accordingly, in the read operation, the sense voltage supplied in "(iii) the selection" is also maintained in the process of "(iv) the detection".

Now, in the read operation, a current mirror circuit 22B limits, in "(iii) the selection", the current flowing through the selected word line WL to the prescribed current value "Isec_c". Specifically, in a case where the current flowing through the selected word line WL is smaller than Isec_c, Vsense_i is applied to the selected word line WL. As a result, in a case where the current flowing through the selected word line WL reaches Isec_c, the current mirror circuit 22B increases the voltage of the selected word line WL, in order to keep the current from being larger than Isec_c. Here, Isec_c is set at a value sufficiently lower than the current flown to the selected memory cell S in the process of "(iv) the resistance change" in the write operation, in order to prevent the resistance change in the selected memory cell S. In other words, Isense_c is smaller than Isec_c.

In a case where the switch element 10S of the selected memory cell S is in the high resistance state, even applying the sense voltage to the selected memory cell S causes a subtle current smaller than sense_c to flow through the switch element 10S of the selected memory cell S. Accordingly, as indicated by a line of the selected WL (a selected cell: HRS) in FIG. 19, the voltage of the selected word line WL keeps Vsense_i and remains unchanged.

In a case where the switch element 10S of the selected memory cell S is in the low resistance state, applying the sense voltage to the selected memory cell S causes the current flowing through the selected memory cell S to reach Isense_c, causing the voltage of the selected word line WL to increase. However, there are cases where the increase in the voltage of the selected word line WL occurs quickly in the process of "(iii) the selection" as indicated by a line of the selected WL (the selected cell: LRS, case 1) in FIG. 19, and cases where the increase in the voltage of the selected word line WL occurs after a lapse of certain time after a start of the process of "(iv) the detection" as indicated by a line of the selected word line WL (the selected cell: LRS, case 2) in FIG. 19. In particular, the selected WL (the selected cell: LRS, case 2) in FIG. 19 occurs in a case where the current flowing through the memory cell in a half selected state causes a voltage drop in the selected bit line BL and in the selected word line WL, resulting in a failure in applying a sufficient voltage to between both ends of the selected memory cell S. In such a case, the lapse of the certain time after the start of the process of "(iv) the detection", and the variations in the voltages of the non-selected bit line BL and the non-selected word line WL in the floating state cause a decrease in the current flowing through the half selected memory cell, causing a decrease in the voltage drop. This causes a sufficient voltage to be applied to the selected memory cell S and causes Isense_c to flow, resulting in the increase in the voltage of the selected word line WL. As in the selected WL (the selected cell: LRS, case 2), in a case where the voltage drop in the selected bit line BL and in the selected word line WL is not significant, a quick voltage rise in the selected word line WL occurs, as indicated by the line of the selected WL (the selected cell: LRS, case 2) in FIG. 19.

With any one of the word lines WL being selected by the WL driver 21, the read circuit 26 is also coupled to the relevant word line WL. In a case where the reference voltage Vref is set at a position indicated in FIG. 19, the read circuit 26 is able to determine whether the voltage of the selected word line WL is higher or lower than the reference voltage Vref. In this case, with the voltage of the selected word line WL being higher than the reference voltage Vref, a determination can be made that the selected memory cell S is in the low resistance state. With the voltage of the selected word line WL being lower than the reference voltage Vref, a determination can be made that the selected memory cell S is in the high resistance state. In consideration of the example of the line of the selected WL (the selected cell: LRS, case 2) in FIG. 19, it is desirable that such a determination be made at timing of Tsenes2 in FIG. 19, rather than at timing of Tsenes1 in FIG. 19. In a case with considerably low possibility of occurrence of the example of the line of the selected WL (the selected cell: LRS, case 2) in FIG. 19, the read circuit 26 may make the determination as mentioned above at the timing of Tsenes1 in FIG. 19. At this occasion, the process of "(iv) the detection" may be omitted.

[Effects]

Next described are effects of the memory system 200 according to this embodiment.

In the post-decoder PstD of the decoder described in FIG. 11, the switch elements are provided at a rate of two for each wiring line. The switch elements are dedicated to respective ones of the output terminals line, without being shared by the other output terminals line. In other words, the decoder described in FIG. 11 is the 2T decoder. Accordingly, in the decoder described in FIG. 11, because of the large number of the switch elements in the post-decoder PstD, circuit area of the post-decoder PstD becomes large.

Meanwhile, in the memory system 200 according to this embodiment, the two decoder circuits (the decoder circuits 24A and 24B) are coupled, on the one-to-one basis, to the word line WL to be coupled to the memory cell S as the target of the selection (the to-be-selected word line WL), and to the word lines WL in adjacency to the to-be-selected word line WL. The two decoder circuits are constituted by the independent circuits from each other. Furthermore, in the memory system 200 according to this embodiment, the two decoder circuits (the decoder circuits 23A and 23B) are coupled, on the one-to-one basis, to the bit line BL to be coupled to the memory cell S as the target of the selection (the to-be-selected bit line BL), and to the bit lines BL in adjacency to the bit line BL. The two decoder circuits are constituted by the independent circuits from each other. That way, allowing the voltage outputted from the decoder circuit 24A and the voltage outputted from the decoder circuit 24B to differ from each other makes it possible to apply the two kinds of the voltages different from each other to the to-be-selected word line WL and to the word lines WL in adjacency to the to-be-selected word line WL. Likewise, allowing the voltage outputted from the decoder circuit 23A and the voltage outputted from the decoder circuit 23B to differ from each other makes it possible to apply the two kinds of the voltages different from each other to the to-be-selected bit line BL and to the bit lines BL in adjacency to the to-be-selected bit line BL. Hence, it is possible to restrain voltage variations in a non-selected memory because of inter-wiring capacitive coupling, with the access voltage being applied to the selected memory cell S.

Moreover, in the memory system 200 according to this embodiment, the to-be-selected word line WL and the word lines WL in adjacency to the to-be-selected word line WL are driven by the decoder circuits different from each other (the decoder circuits 24A and 24B). Furthermore, the to-be-selected bit line BL and the bit lines BL in adjacency to the to-be-selected bit line BL are driven by the decoder circuits different from each other (the decoder circuits 23A and 23B). Accordingly, it is sufficient to use, as each of the decoder circuits (the decoder circuits 24A and 24B, and the decoder circuits 23A and 23B), the decoder circuit including the single switch element 10S per each wiring. It is unnecessary to use the decoder circuit including at least two switch elements per each wiring. Hence, it is possible to restrain influences of the inter-wiring capacitive coupling, while restraining an increase in floor area of the decoder circuit.

2. MODIFICATION EXAMPLES

In the following, described are modification examples of the memory cell array unit 400 according to the forgoing embodiment, or the memory system 200 according to the forgoing embodiment. It is to be noted that in the following, to constituent parts common to those of the forgoing embodiment, assigned are the same reference characters as the reference characters assigned in the forgoing embodiment. Moreover, description is given mainly of constituent parts different from those of the forgoing embodiment. Description of the constituent parts common to those of the forging embodiment is omitted as appropriate.

Modification Example A

Figure 20:
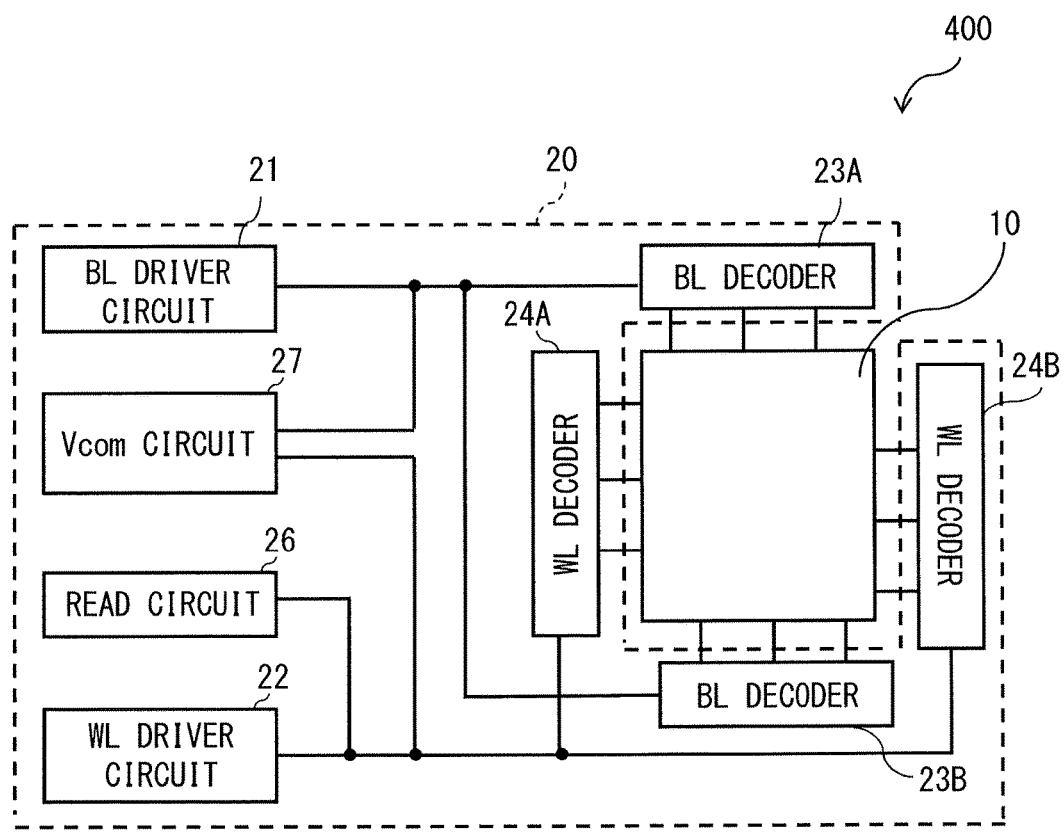
FIG. 20 is a diagram that illustrates one modification example of the functional blocks of the memory cell array unit in FIG. 1.

FIG. 20 illustrates one modification example of the functional blocks of the memory cell array unit 400 according to the forgoing embodiment. The memory cell array unit 400 according to this modification example is different in configuration from the memory cell array unit 400 according to the forgoing embodiment, in terms that the memory cell array unit 400 includes a Vcom circuit 27 instead of the pre-charge circuit 25. In the following, therefore, description is given mainly of contents related to the Vcom circuit 27, with description related to other contents being omitted as appropriate.

Figure 21:
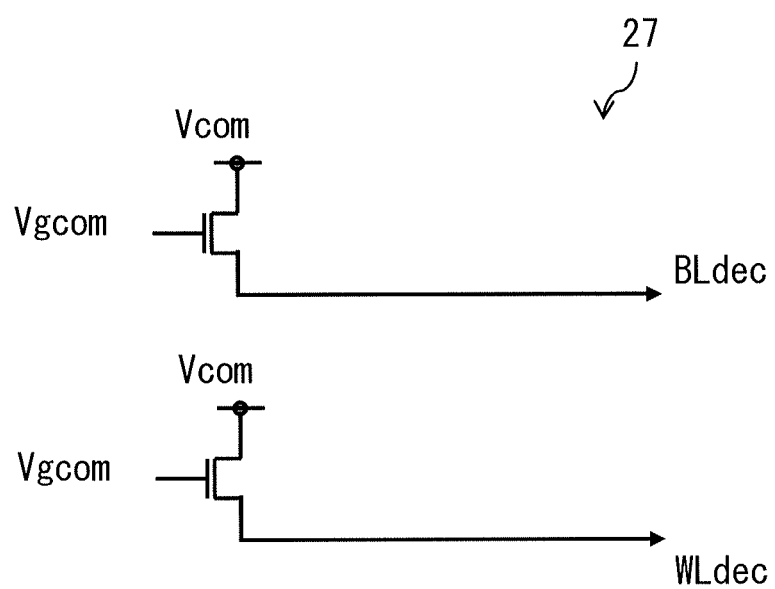
FIG. 21 is a diagram that illustrates one example of a circuit configuration of a Vcom circuit in FIG. 20.

FIG. 21 illustrates one example of a circuit configuration of the Vcom circuit 27. The Vcom circuit 27 has a function equivalent to the function of the pre-charge circuit 25 in a state in which Low is constantly applied to the terminals Vg1 and Vg2 in the pre-charge circuit 25. The Vcom circuit 27 outputs, in accordance with the control by the memory controller 300, the single kind of the voltage (Vcom) supplied from the power supply circuit 500, to the input terminal com of each of the decoder circuits (the decoder circuits 24A and 24B, and the decoder circuits 23A and 23B). Accordingly, in this modification example, the execution of the write operation, the reset operation, and the read operation are started at the process of "(ii) the floating", with no process of "(i) the pre-charge" included. However, in this modification example, at a beginning of the process of "(ii) the floating", each of the decoder circuits (the decoder circuit 23A or the decoder circuit 23B) outputs the voltage Vcom, instead of the voltage Vpre_w and the voltage Vpre_b. In other words, the decoder circuits (the decoder circuit 23A or the decoder circuit 23B) output the respective voltages having voltage values being equal to each other (the voltage Vcom).

In this modification example, with the pre-charge being omitted, each of the decoder circuits (the decoder circuit 23A or the decoder circuit 23B) outputs the voltage Vcom, instead of the voltage Vpre_w and the voltage Vpre_b. That way, in a case where each of the decoder circuits (the decoder circuit 23A or the decoder circuit 23B) repetitively makes access to the memory cell array 10, it is unnecessary to carry out the pre-charge at every access to the memory cell array 10.

Moreover, in this modification example, while the decoder circuit 23A makes access to the memory cell array 10, the decoder circuit 23B constantly outputs Vcom to the non-selected bit lines BL and the word lines WL. Furthermore, there is no contribution to charging of the inter-wiring parasitic capacitance by part of a current flowing into or out of the non-selected bit lines BL and the word lines WL from the selected bit line BL and the word line WL. Furthermore, part of the current as mentioned above flows to the non-selected memory cell 10A between the non-selected bit line BL in the floating state and the non-selected word line WL to which Vcom is applied, or between the non-selected word line WL in the floating state and the non-selected bit line BL to which Vcom is applied. Accordingly, a voltage change occurring in the non-selected wiring in the floating state is considerably small, as compared to the case of the forgoing embodiment in which the pre-charge is carried out.

In this modification example, therefore, it is possible to reduce delay time accompanying repetitive access to the memory cell array 10 by each of the decoder circuits (the decoder circuit 23A and the decoder circuit 23B). However, an amount of a current flowing through the half selected memory cells during application of the access voltage becomes larger than an amount of a current flowing through the half selected memory cells during the application of the access voltage in the forgoing embodiment. Accordingly, from a viewpoint of an amount of power consumption during the application of the access voltage, the forgoing embodiment is more optimal than this modification example.

Figure 22:
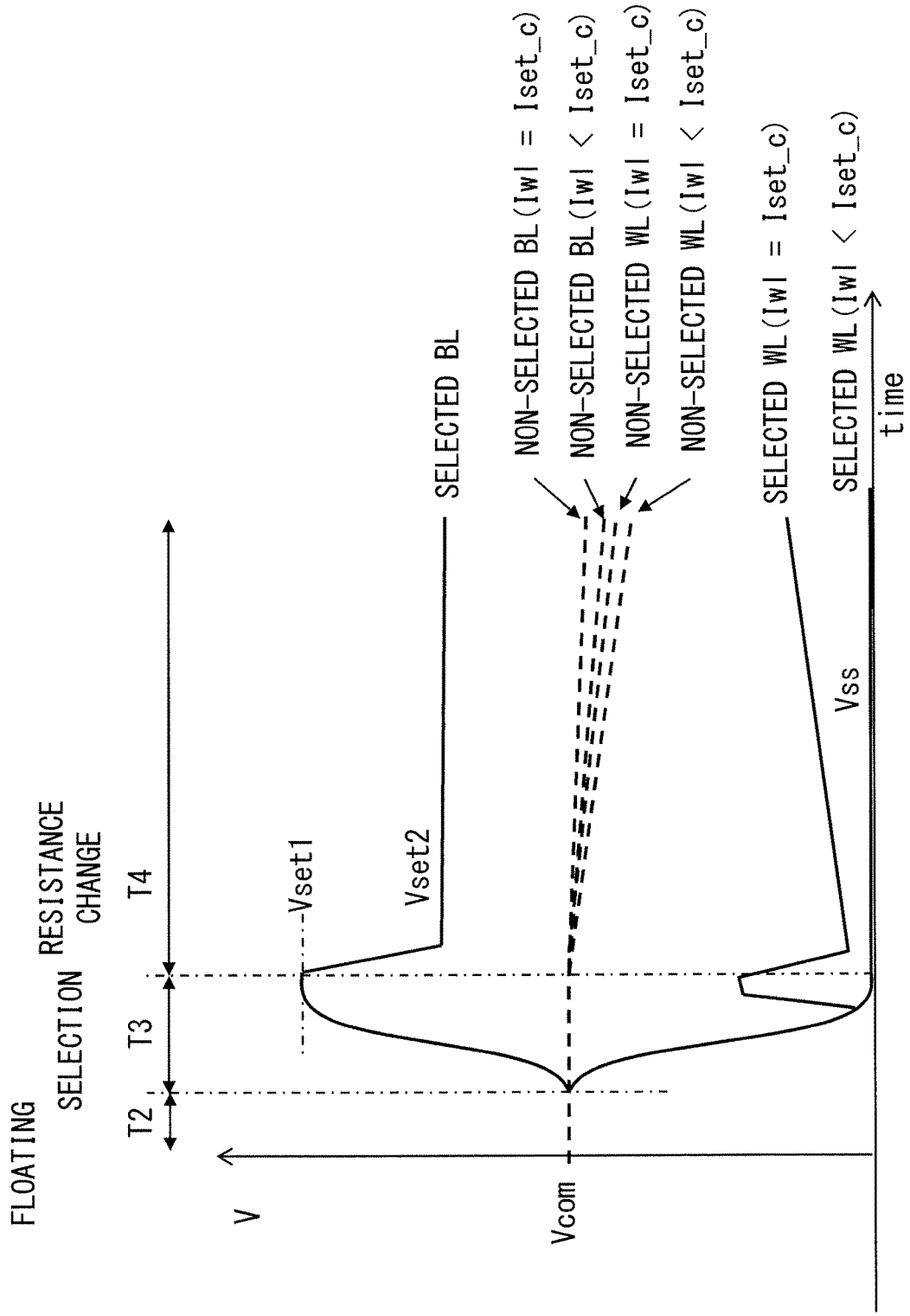
FIG. 22 is a diagram that illustrates one example of a voltage waveform in a memory cell as a target of writing.
Figure 23:
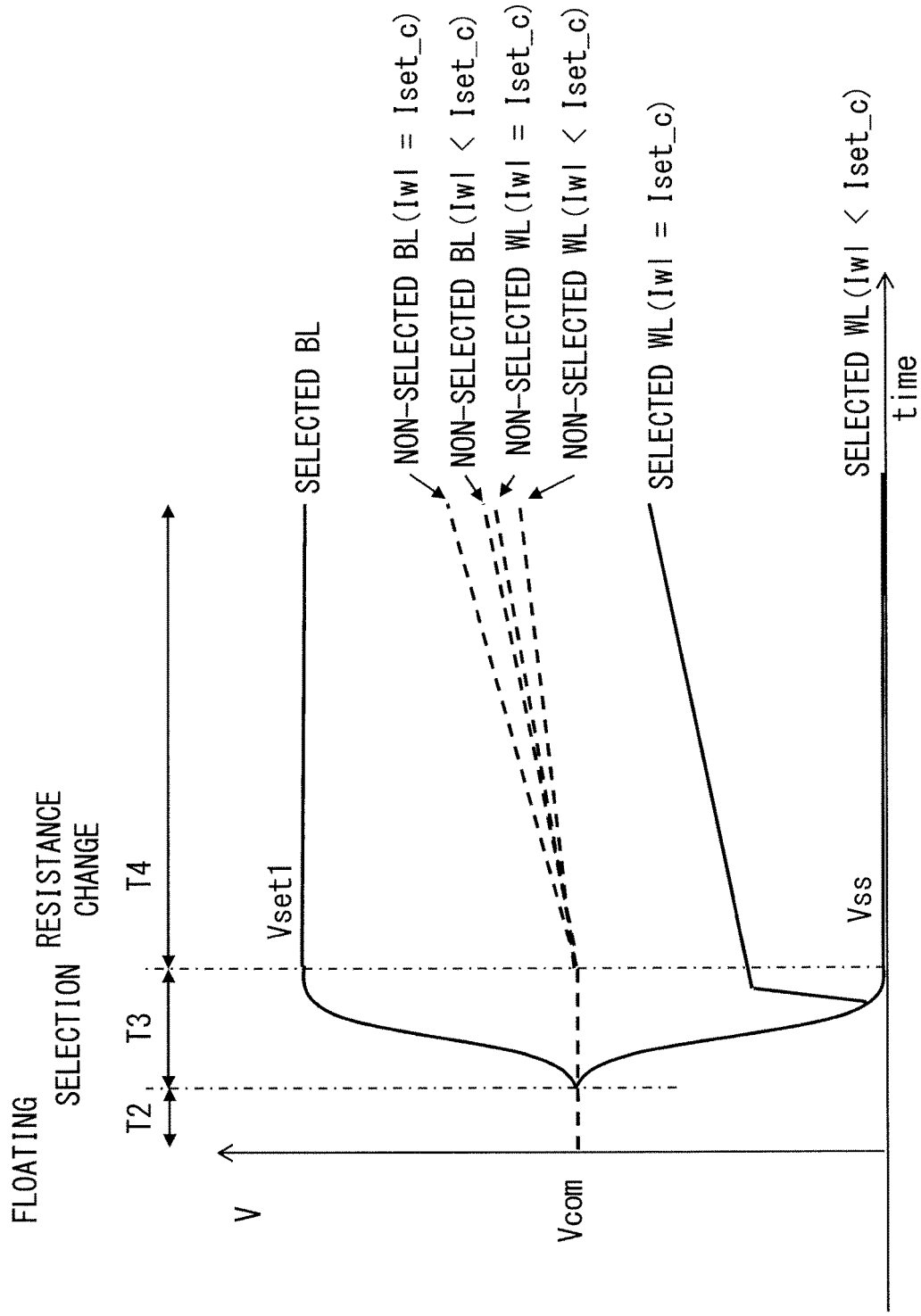
FIG. 23 is a diagram that illustrates one modification example of the voltage waveform in the memory cell as the target of the writing.
Figure 24:
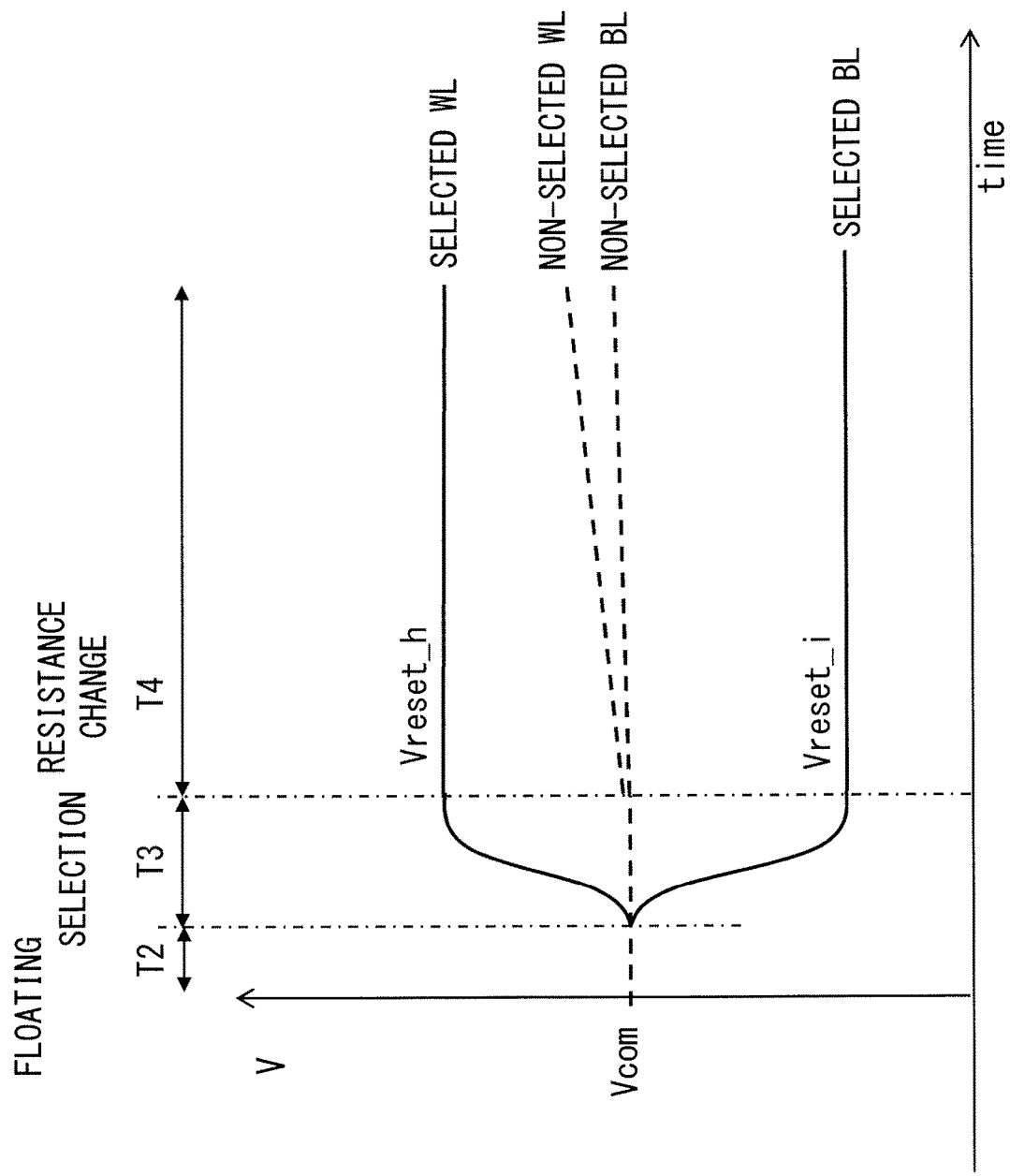
FIG. 24 is a diagram that illustrates one example of a voltage waveform in a memory cell as a target of a reset.
Figure 25:
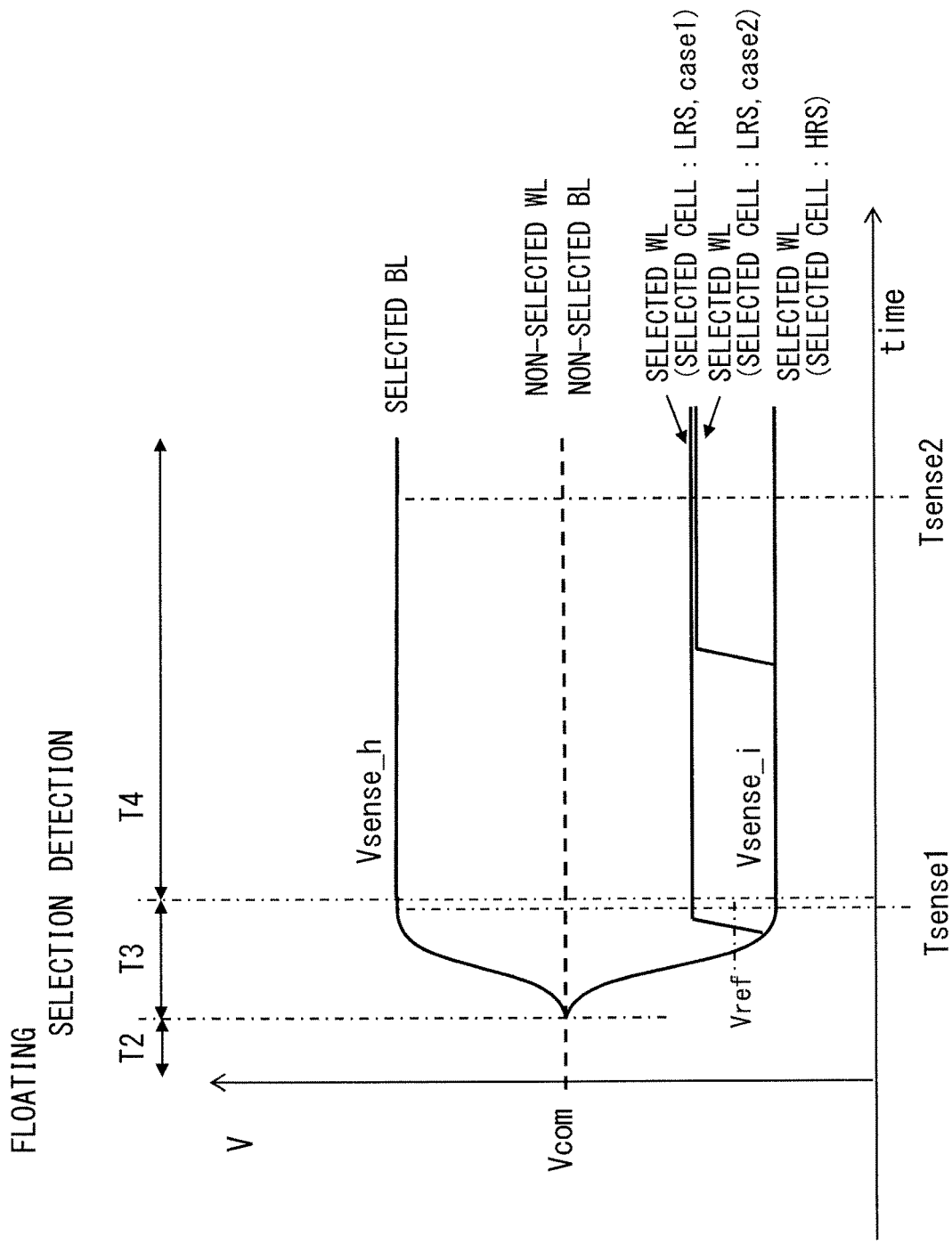
FIG. 25 is a diagram that illustrates one example of a voltage waveform in a memory cell as a target of reading.

FIG. 22 is a diagram that illustrates one example of a voltage waveform in a memory cell as a target of writing. FIG. 23 is a diagram that illustrates one modification example of the voltage waveform in the memory cell as the target of the writing. FIG. 24 is a diagram that illustrates one example of a voltage waveform in a memory cell as a target of a reset FIG. 25 is a diagram that illustrates one example of a voltage waveform in a memory cell as a target of reading. It is to be noted that in this modification example, the pre-charge circuit 25 may be provided, instead of the Vcom circuit 27. However, in this case, the memory controller 300 may constantly output Low to the terminals Vg1 and Vg2 of the pre-charge circuit 25, and utilize the pre-charge circuit 25 on an assumption that the pre-charge circuit 25 has the similar function to that of the Vcom circuit 27.

Modification Example B

Figure 26:
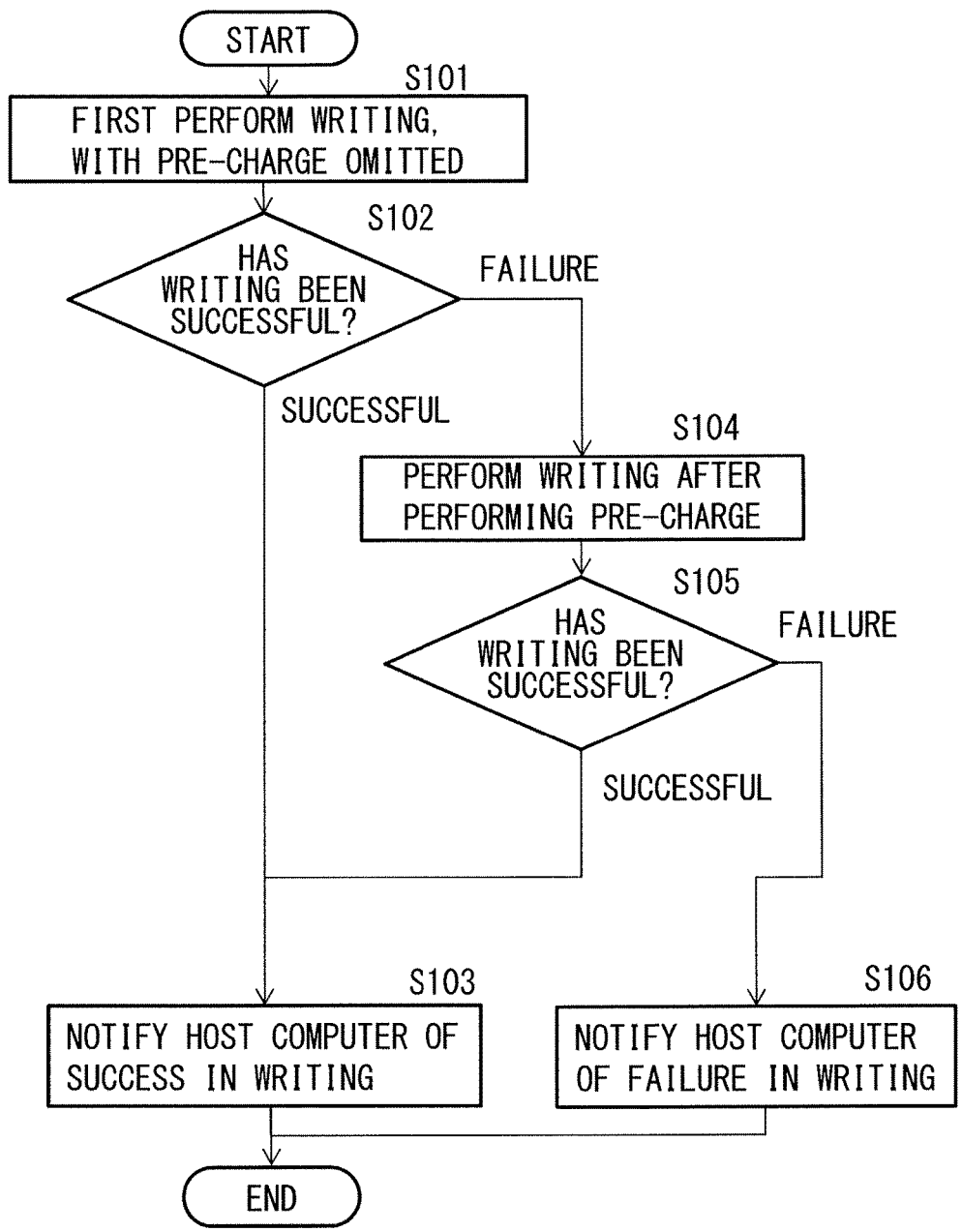
FIG. 26 is a chart that illustrates one example of a writing procedure.

FIG. 26 illustrates one example of a writing procedure in the memory system 200 according to this modification example. In the forgoing embodiment, the memory controller 300 may perform the writing to the selected memory cell S, after performing the pre-charge, solely on the condition that the writing has failed.

First, the memory controller 300 performs, with the pre-charge being omitted, the writing to the memory cell 10A as the target of the selection (the selected memory cell S) (step S101). Specifically, in a first writing operation, the memory controller 300 constantly outputs Low to the terminals Vg1 and Vg2 of the pre-charge circuit 25, and utilizes the pre-charge circuit 25 on the assumption that the pre-charge circuit 25 has the similar function to that of the Vcom circuit 27. In other words, in the first writing operation, the memory controller 300 outputs a control signal to the pre-charge circuit 25, to output the single kind of the voltage (Vcom) supplied from the power supply circuit 500 to the input terminal com of each of the decoder circuits (the decoder circuits 24A and 24B, and the decoder circuits 23A and 23B). Accordingly, in the first writing operation, the pre-charge circuit 25 outputs, in accordance with the control by the memory controller 300, the voltages Vcom having the voltage values equal to one another to the input terminals com of the respective decoder circuits (the decoder circuits 24A and 24B, and the decoder circuits 23A and 23B).

The memory controller 300 determines whether or not the writing to the selected memory cell S has been successful (step S102), as a result of the control of the pre-charge circuit 25, to output the voltages Vcom having the voltage values equal to one another to the input terminals com of the respective decoder circuits (the decoder circuits 24A and 24B, and the decoder circuits 23A and 23B). Specifically, the memory controller 300 determines whether or not the selected memory cell S is in the low resistance state. As a result, in a case where the selected memory cell S is in the low resistance state, the memory controller 300 notifies the host computer 100 of a success in the writing to the selected memory cell S (step S103).

In a case where the selected memory cell S is in the high resistance state, the memory controller 300 performs again the writing to the selected memory cell S, after performing the pre-charge (step S104). Thereafter, the memory controller 300 determines whether or not the writing to the selected memory cell S has been successful. Specifically, the memory controller 300 determines whether or not the selected memory cell S is in the low resistance state (step S105). As a result, in a case where the selected memory cell S is in the low resistance state, the memory controller 300 notifies the host computer 100 of the success in the writing to the selected memory cell S (step S103). In a case where the selected memory cell S is in the high resistance state, the memory controller 300 notifies the host computer 100 of a failure in the writing to the selected memory cell S (step S106).

In this modification example, the pre-charge is omitted solely in the first writing to the selected memory cell S. Hence, it is possible to reduce the delay time accompanying the repetitive access to the memory cell array 10 by each of the decoder circuits (the decoder circuit 23A or the decoder circuit 23B), while restraining frequent occurrence of failures in the writing.

Modification Example C

Figure 27:
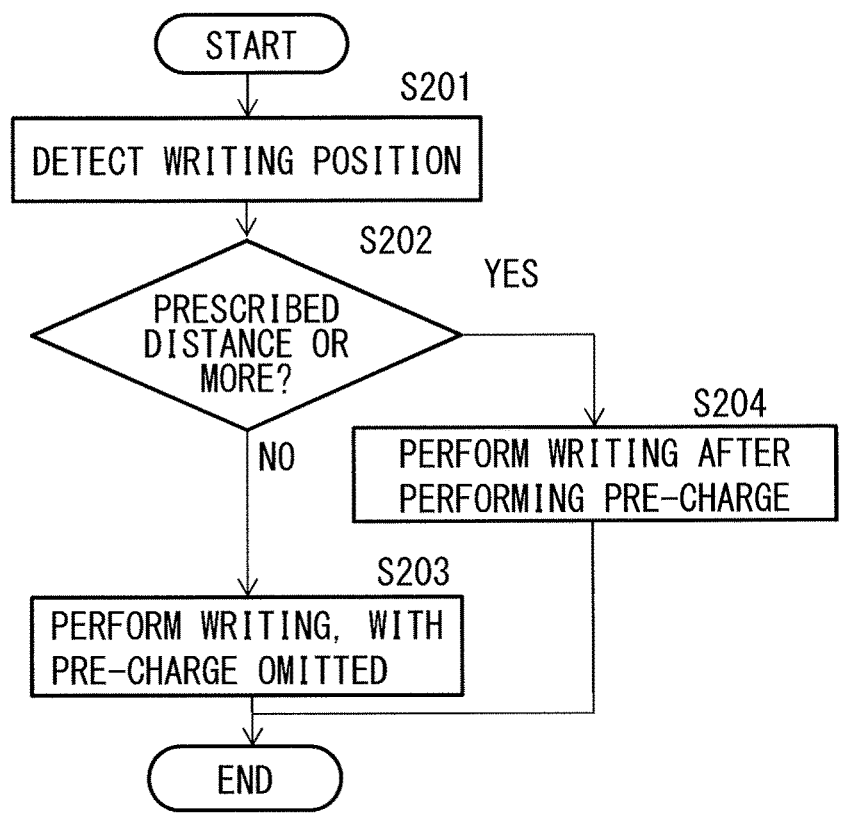
FIG. 27 is a chart that illustrates another example of the writing procedure.

FIG. 27 illustrates one example of the writing procedure in the memory system 200 according to this modification example. In the forgoing embodiment and the modification examples A and B, the memory controller 300 may control the pre-charge circuit 25, to output the two kinds of the voltages (the voltage Vpre_w and the voltage Vpre_b) that differ in the voltage values from each other, or the voltages (the voltage Vcom) equal in the voltage values to each other, in accordance with the physical position of the selected memory cell S.

Specifically, first, the memory controller 300 detects a write position of the selected memory cell S (step S201). Thereafter, the memory controller 300 determines whether or not the write position of the selected memory cell S is away from the position of each of the decoder circuits (the decoder circuit 23A or the decoder circuit 23B) with a prescribed distance or more (step S202). In a case where the write position of the selected memory cell S is not away from the position of each of the decoder circuits with the prescribed distance or more, the memory controller 300 omits the pre-charge and performs the writing to the selected memory cell S (step S203). In a case where the write position of the selected memory cell S is away from the position of each of the decoder circuits with the prescribed distance or more, the memory controller 300 performs the writing to the selected memory cell S, after performing the pre-charge (step S204).

In this modification example, the pre-charge is omitted in accordance with the write position of the selected memory cell S. Hence, it is possible to reduce the delay time accompanying the repetitive access to the memory cell array 10 by each of the decoder circuits (the decoder circuit 23A or the decoder circuit 23B), while restraining the frequent occurrence of the failures in the writing.

Modification Example D

Figure 28:
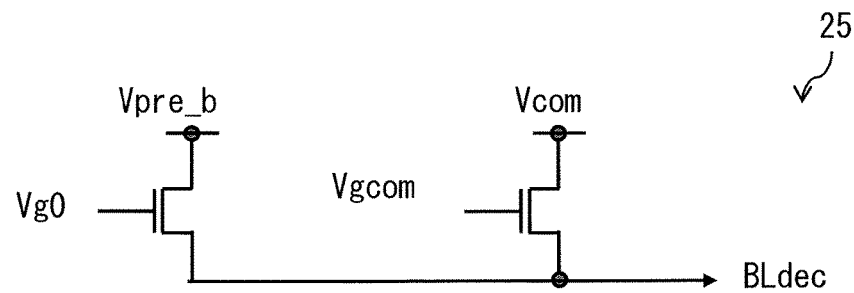
FIG. 28 is a diagram that illustrates one modification example of the circuit configuration of the Pre-Charge circuit in FIG. 2.
Figure 29:
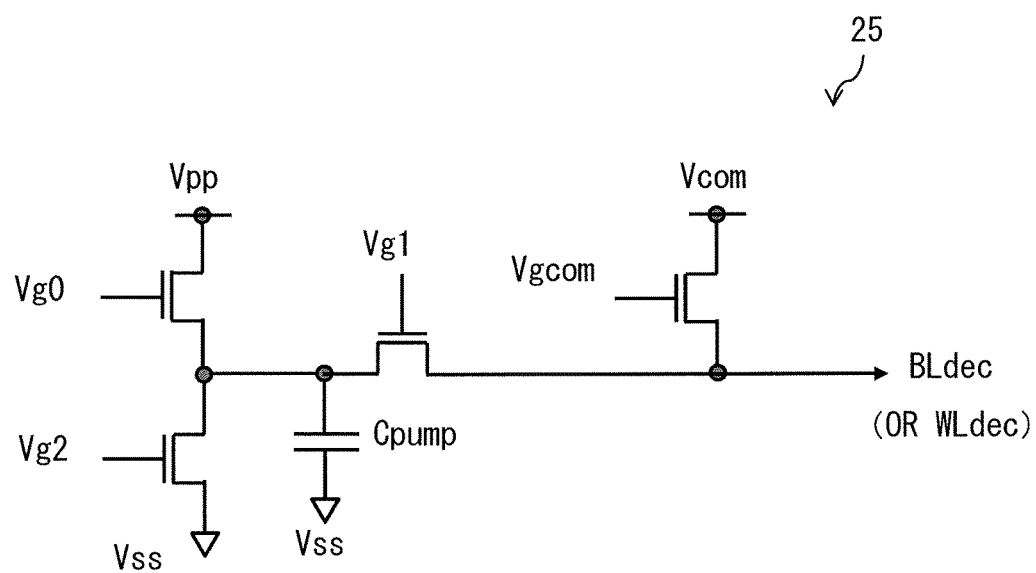
FIG. 29 is a diagram that illustrates one modification example of the circuit configuration of the WL driver circuits in FIGS. 2 and 20.
Figure 30:
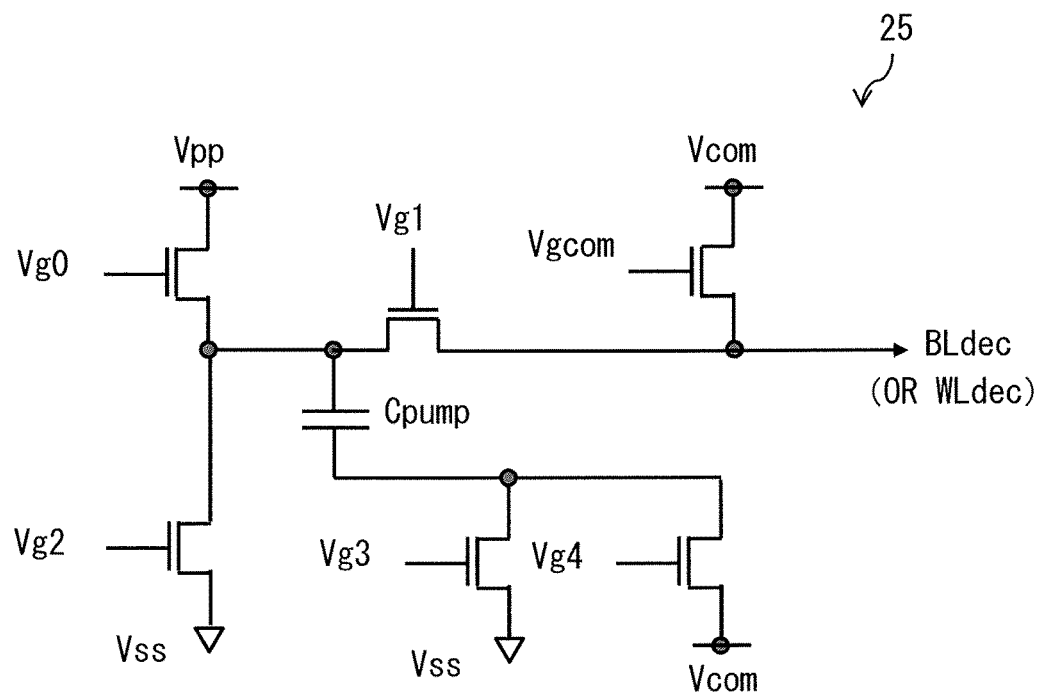
FIG. 30 is a diagram that illustrates one modification example of the circuit configuration of the pre-charge circuits in FIGS. 2 and 20.

FIGS. 28, 29, and 30 illustrates one modification example of a circuit configuration of the pre-charge circuit 25 according to this modification example. For example, as illustrated in FIG. 28, the pre-charge circuit 25 may include a pre-charge circuit for the bit line BL and a pre-charge circuit for the word line WL as separate parts from each other. Moreover, for example, pre-charge circuits as illustrated in FIG. 29, or in FIG. 30, may be provided for the bit line BL and for the word line WL. In this case, in the pre-charge, it is possible to control the voltage of the bit line BL and the voltage of the word line WL independently from each other.

Modification Example E

FIG. 31 illustrates one example of a perspective configuration of the memory cell array 10 according to this modification example. FIG. 32 illustrates one example of an equivalent circuit of the memory cell array 10 in FIG. 31. In the forgoing embodiment and its modification examples, the plurality of the memory cells 10A are in the stacked arrangement. However, for example, as illustrated in FIG. 31, in the forgoing embodiment and its modification examples, the plurality of the memory cells 10A may be in a single-layer arrangement. At this occasion, in the memory cell array 10, for example, as illustrated in FIG. 31, the plurality of the vertical bit lines VBL and the plurality of the word lines WL may be disposed in confronted relation to one another, with a predetermined gap in between, in a horizontal plane. Furthermore, for example, as illustrated in FIG. 31, each of the memory cells 10A may be held by the vertical bit line VBL and the word line WL, in the horizontal plane. In other words, in this modification example, the memory cell array 10 may have the V3D structure, as with the forgoing embodiment and its modification examples.

In addition, in the forgoing embodiment and its modification examples, the two decoders for the word line WL and the two decoders for the bit line BL are provided. However, for example, as illustrated in FIG. 32, in the forgoing embodiment and its modification example, three or more decoders for the word line WL and three or more decoders for the bit line BL may be provided. It is to be noted that in the equivalent circuit in FIG. 32, the memory cells 10A are provided in the same layer. It is understood that the memory cell array 10, represented as the equivalent circuit as in FIG. 32, is equivalent to the cross point memory cell array.

Although description has been made by giving the embodiment and its modification examples A to E as mentioned above, the contents of the technology are not limited to the above-mentioned example embodiments and may be modified in a variety of ways. It is to be noted that effects described herein are merely exemplified. Effects of the technology are not limited to the effects described herein. Effects of the technology may further include other effects than the effects described herein.

For example, in the forgoing embodiment and its modification examples, the switch element used in the pre-charge circuit 25 is constituted by, for example, an NMOS transistor or a PMOS transistor. Moreover, for example, in the forgoing embodiment and its modification examples A to E, the switch element used in the pre-charge circuit 25 may be constituted by a CMOS analog switch in which the NMOS transistor and the PMOS transistor are paired, with their sources and drains coupled.

Moreover, for example, in the forgoing embodiment and its modification examples, the number of the decoder circuits in the row direction may be three or more. Furthermore, for example, in the forgoing embodiment and its modification examples A to E, the number of the decoder circuits in the column direction may be three or more.

Moreover, for example, in the forgoing embodiment and its modification examples, the WL decoder 24A may be coupled to all the word lines WL, with the WL decoder 24B omitted. In this case, for example, the WL decoder 24A may select the word line WL coupled to the selected memory cell S. After a potential of each of the word line WL is stabilized, the BL decoders 23A and 23b may select the bit line WL coupled to the selected memory cell S. Thus, in the plurality of the word lines WL, it is possible to restrain crosstalk caused by variations of the potential of each of the word lines WL.

Moreover, for example, in the forgoing embodiment and its modification examples, as illustrated in FIG. 7, the read circuit 26 may be coupled to a C point of the WL driver 22. In this case, in the reset operation and the write operation, bringing Vgsense to Low makes it possible to separate the read circuit 26 from the word line WL.

Moreover, for example, in the forgoing embodiment and its modification examples, the memory controller 300 may bring the terminals Vg0 and Vg3 of the pre-charge circuit 25 to High, instead of bringing the terminal Vgcom of the pre-charge circuit 25 to High and bringing the voltages of each of the bit lines BL and each of the word lines WL to the voltage Vcom. At this occasion, in the pre-charge circuit 25, the switch element to which the terminal Vcom is coupled may be omitted. In this case as well, bringing the terminals Vg0 and Vg3 of the pre-charge circuit 25 to High makes it possible to bring the voltages of each of the bit lines BL and each of the word lines WL to a value close to Vcom.

In the forgoing embodiment and its modification examples, the memory cell array 10 has the V3D structure. However, as described above, the memory cell array 10, represented as the equivalent circuit, is equivalent to the cross point structure. Accordingly, the contents of the disclosure are applicable not only to the memory cell array of the V3D structure but also the memory cell array of the cross point structure.

Moreover, for example, the technology may have the following configuration.

(1)

A memory system, including:

a plurality of memory cells in a matrix arrangement, the plurality of the memory cells each including a current path that includes a selection element and a variable resistance element coupled in series to each other;

a plurality of row wirings extending in a row direction, the plurality of the row wirings each being coupled to one end of the current path;

a plurality of column wirings extending in a column direction, the plurality of the column wirings each being coupled to another end of the current path;

a first decoder circuit coupled to each of the row wirings of even-numbered rows;

a second decoder circuit coupled to each of the row wirings of odd-numbered rows;

a third decoder circuit coupled to each of the column wirings of even-numbered columns;

a fourth decoder circuit coupled to each of the column wirings of odd-numbered columns;

a voltage control circuit that controls voltages to be applied to the first decoder circuit, the second decoder circuit, the third decoder circuit, and the fourth decoder circuit; and a controller that controls the voltage control circuit, and controls the first decoder circuit, the second decoder circuit, the third decoder circuit, and the fourth decoder circuit independently from one another.

(2)

The memory system according to (1), in which the first decoder circuit and the second decoder circuit each include two first voltage input terminals and a plurality of first address input terminals, and each perform decoding of a row address inputted to a plurality of the first address input terminals, to set a coupling mode of a plurality of the row wirings to a plurality of the first voltage input terminals, the third decoder circuit and the fourth decoder circuit each include two second voltage input terminals and a plurality of second address input terminals, and each perform decoding a column address inputted to a plurality of the second address input terminals, to set a coupling mode of a plurality of the column wirings to a plurality of the second voltage input terminals, and the controller generates the row address and the column address, and outputs the row address and the column address to the first decoder circuit, the second decoder circuit, the third decoder circuit, and the fourth decoder circuit.

(3)

The memory system according to (2), in which the first decoder circuit and the second decoder circuit each include a plurality of first switch elements for the decoding that are equal in number to the row wirings assigned, the plurality of the first switch elements being provided at a rate of one for each of the row wirings, and the third decoder circuit and the fourth decoder circuit each include a plurality of second switch elements for the decoding that are equal in number to the column wirings assigned, the plurality of the second switch elements being provided at a rate of one for each of the column wirings.

(4)

The memory system according to (2) or (3), in which the voltage control circuit outputs a first voltage and a second voltage respectively to two of the first voltage input terminals of the first decoder circuit and to two of the first voltage input terminals of the second decoder circuit, and outputs a third voltage and a second voltage respectively to two of the second voltage input terminals of the third decoder circuit and to two of the second voltage input terminals of the fourth decoder circuit.

(5)

The memory system according to any one of (2) or (4), in which the controller outputs a first row address, as the row address, to whichever decoder circuit is coupled to the memory cell as a target of selection, out of the first decoder circuit and the second decoder circuit, and the controller further outputs a second row address, as the row address, to whichever decoder circuit is devoid of coupling to the memory cell as the target of the selection, out of the first decoder circuit and the second decoder circuit, the first row address being a row address that couples the row wiring coupled to the memory cell as the target of the selection to the first voltage input terminal to which the first voltage is outputted, and brings each of the row wirings that are devoid of the coupling to the memory cell as the target of the selection to a floating state, and the second row address being a row address that sets, at the second voltage, a voltage of, at least, each of the row wirings in adjacency to the row wiring coupled to the memory cell as the target of the selection, out of a plurality of the row wirings.

(6)

The memory system according to (5), in which the controller outputs a first column address, as the column address, to whichever decoder circuit is coupled to the memory cell as the target of the selection, out of the third decoder circuit and the fourth decoder circuit, and the controller further outputs a second column address, as the column address, to whichever decoder circuit is devoid of the coupling to the memory cell as the target of the selection, out of the third decoder circuit and the fourth decoder circuit, the first column address being a column address that couples the column wiring coupled to the memory cell as the target of the selection to the second voltage input terminal to which the third voltage is outputted, and brings each of the column wirings that are devoid of the coupling to the memory cell as the target of the selection, to the floating state, and the second column address being a column address that sets, at the fourth voltage, a voltage of, at least, each of the column wirings in adjacency to the column wiring coupled to the memory cell as the target of the selection, out of a plurality of the column wirings.

(7)

The memory system according to (6), in which with data being written to the memory cell as the target of the election, the voltage control circuit outputs, as the first voltage and the third voltage, a voltage of magnitude large enough to cause a voltage equal to or larger than a write threshold voltage to be applied to the variable resistance element in the memory cell as the target of the selection, the write threshold voltage being a voltage at which the variable resistance element changes from a high resistance state to a low resistance state.

(8)

The memory system according to (7), in which with data of the memory cell as the target of the selection being read, the voltage control circuit outputs, as the first voltage and the third voltage, a voltage of magnitude large enough to cause a voltage smaller than the threshold voltage to be applied to the variable resistance element in the memory cell as the target of the selection, the voltage being of magnitude large enough to cause a voltage higher than a voltage at which the selection element is turned off, to be applied to the selection element in the memory cell as the target of the selection.

(9)

The memory system according to any one of (6) to (8), in which the controller outputs a third row address, as the row address, to the first decoder circuit and the third decoder circuit, and outputs a third column address, as the column address, to the third decoder circuit and the fourth decoder circuit, and afterwards, outputs the first row address and the second row address to the first decoder circuit and the second decoder circuit, and outputs the first column address and the second column address to the third decoder circuit and the fourth decoder circuit, the third row address coupling each of the row wirings to the first voltage input terminal to which the second voltage is outputted, and the third column address coupling each of the column wirings to the second voltage input terminal to which the fourth voltage is outputted.

(10)

The memory system according to any one of (6) to (8), in which the voltage control circuit outputs, as the second voltage and the fourth voltage, two kinds of voltages that differ in voltage values from each other.

(11)

The memory system according to any one of (6) to (8), in which the voltage control circuit outputs, as the second voltage and the fourth voltage, voltages that are equal in voltage values to each other.

(12)

The memory system according to any one of (6) to (8), in which the controller controls the voltage control circuit to output, as the second voltage and the fourth voltage, two kinds of voltages that differ in voltage values from each other or voltages that are equal in voltage values to each other, in accordance with a physical position of the memory cell as the target of the selection.

(13)

The memory system according to any one of (6) to (8), in which on a condition that the controller has failed in writing to the memory cell as the target of the selection as a result of controlling the voltage control circuit to output, as the second voltage and the fourth voltage, voltages that are equal in voltage values to each other, the controller performs again the writing to the memory cell as the target of the selection after controlling the voltage control circuit to output, as the second voltage and the fourth voltage, two kinds of voltages that differ in voltage values from each other.

(14)

The memory system according to any one of (6) to (8), in which after selection of the memory cell as the target of the selection is made, the controller outputs, as the row address, a third row address that sets each of the row wirings and each of the column wirings that are devoid of the coupling to the memory cell as the target of the selection, at the floating state.

(15)

The memory system according to any one of (6) to (8), in which after selection of the memory cell as the target of the selection is made, the controller outputs, as the column address, a third column address that sets the column wiring coupled to the memory cell as the target of the selection, at a voltage smaller than the third voltage.

(16)

A memory device, including:

a plurality of memory cells in a matrix arrangement, the plurality of the memory cells each including a current path that includes a selection element and a variable resistance element coupled in series to each other;

a plurality of row wirings extending in a row direction, the plurality of the row wirings each being coupled to one end of the current path;

a plurality of column wirings extending in a column direction, the plurality of the column wirings each being coupled to another end of the current path;

a first decoder circuit coupled to each of the row wirings of even-numbered rows;

a second decoder circuit coupled to each of the row wirings of odd-numbered rows;

a third decoder circuit coupled to each of the column wirings of even-numbered columns; and a fourth decoder circuit coupled to each of the column wirings of odd-numbered columns, the first decoder circuit, the second decoder circuit, the third decoder circuit, and the fourth decoder circuit being constituted by independent circuits from one another.

(17)

A memory control method in a memory device including a plurality of memory cells in a matrix arrangement, the plurality of the memory cells each including a current path that includes a selection element and a variable resistance element coupled in series to each other, a plurality of row wirings extending in a row direction, the plurality of the row wirings each being coupled to one end of the current path, a plurality of column wirings extending in a column direction, the plurality of the column wirings each being coupled to another end of the current path, a first decoder circuit coupled to each of the row wirings of even-numbered rows, a second decoder circuit coupled to each of the row wirings of odd-numbered rows, a third decoder circuit coupled to each of the column wirings of even-numbered columns, and a fourth decoder circuit coupled to each of the column wirings of odd-numbered columns, the memory control method including controlling the first decoder circuit, the second decoder circuit, the third decoder circuit, and the fourth decoder circuit independently from one another.

(18)

The memory control method according to (17), including:

outputting the first voltage to the row wiring coupled to the memory cell as a target of selection, from whichever decoder circuit is coupled to the memory cell as the target of the selection, out of the first decoder circuit and the second decoder circuit, and bringing each of the row wirings that are devoid of coupling to the memory cell as the target of the selection, to a floating state;

outputting the second voltage to, at least, the row wirings in adjacency to the row wiring coupled to the memory cell as the target of the selection, out of the plurality of the row wirings, from whichever decoder circuit is devoid of the coupling to the memory cell as the target of the selection, out of the first decoder circuit and the second decoder circuit;

outputting the third voltage to the column wiring coupled to the memory cell as the target of the selection, from whichever decoder circuit is coupled to the memory cell as the target of the selection, out of the third decoder circuit and the fourth decoder circuit, and bringing each of the column wirings that are devoid of the coupling to the memory cell as the target of the selection, to the floating state; and outputting the fourth voltage to, at least, each of the column wirings in adjacency to the column wiring coupled to the memory cell as the target of the selection, out of the plurality of the column wirings, from whichever decoder circuit is devoid of the coupling to the memory cell as the target of the selection, out of the third decoder circuit and the fourth decoder circuit.

(19)

The memory control method according to (18), including:

applying, as the first voltage and the third voltage, a voltage of magnitude large enough to cause a voltage equal to or larger than a write threshold voltage to be applied to the variable resistance element in the memory cell as the target of the selection, to the row wiring and the column wiring that are coupled to the memory cell as the target of the selection, to write data to the memory cell as the target of the selection, the write threshold voltage being a voltage at which the variable resistance element changes from a high resistance state to a low resistance state.

(20)

The memory control method according to (19), including:

applying, as the first voltage and the third voltage, a voltage of magnitude large enough to cause a voltage smaller than the threshold voltage to be applied to the variable resistance element in the memory cell as the target of the selection, the voltage being of magnitude large enough to cause a voltage higher than a voltage at which the selection element is turned off, to be applied to the selection element in the memory cell as the target of the selection, to the row wiring and the column wiring that are coupled to the memory cell as the target of the selection, to read data of the memory cell as the target of the selection.

(21)

The memory control method according to (18), including:

after outputting the second voltage to each of the row wirings from the first decoder circuit and the second decoder circuit, and outputting the fourth voltage to each of the column wirings from the third decoder circuit and the fourth decoder circuit, performing the following four, (A) outputting the first voltage to the row wiring coupled to the memory cell as the target of the selection, from whichever decoder circuit is coupled to the memory cell as the target of the selection, out of the first decoder circuit and the second decoder circuit, and bringing each of the row wirings that are devoid of the memory cell as the target of the selection, to the floating state, (B) outputting the second voltage to, at least, each of the row wirings in adjacency to the row wiring coupled to the memory cell as the target of the selection, out of the plurality of the row wirings, from whichever decoder circuit is devoid of the coupling to the memory cell as the target of the selection, out of the first decoder circuit and the second decoder circuit, (C) outputting the third voltage to the column wiring coupled to the memory cell as the target of the selection, from whichever decoder circuit is coupled to the memory cell as the target of the selection, out of the third decoder circuit and the fourth decoder circuit, and bringing each of the column wirings that are devoid of the memory cell as the target of the selection, to the floating state, and (D) outputting the fourth voltage to, at least, each of the column wirings in adjacency to the column wiring coupled to the memory cell as the target of the selection, out of the plurality of the column wirings, from whichever decoder circuit is devoid of the coupling to the memory cell as the target of the selection, out of the third decoder circuit and the fourth decoder circuit.

(22)

The memory control method according to (21), in which the second voltage and the fourth voltage differ from each other.

(23)

The memory control method according to (21), in which the second voltage and the fourth voltage are equal to each other.

(24)

The memory control method according to (21), including:

allowing the second voltage and the fourth voltage to differ from each other or to be equal to each other, in accordance with a physical position of the memory cell as the target of the selection.

(25)

The memory control method according to (21), including:

on a condition that writing to the memory cell as the target of the selection failed as a result of allowing the second voltage and the fourth voltage to differ from each other, performing again the writing to the memory cell as the target of the selection after allowing the second voltage and the fourth voltage to be equal to each other.

(26)

The memory control method according to (21), including:

after selection of the memory cell as the target of the selection is made, bringing each o the row wirings and each of the column wirings that are devoid of the coupling to the memory cell as the target of the selection, to the floating state.

(27)

The memory control method according to (21), including:

after selection of the memory cell as the target of the selection is made, allowing a voltage of the column wiring coupled to the memory cell as the target of the selection to be a voltage smaller than the third voltage.

This application claims the benefit of Japanese Priority Patent Application JP2015-090176 filed on Apr. 27, 2015, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A memory system, comprising:
a plurality of memory cells in a matrix arrangement, the plurality of the memory cells each including a current path that includes a selection element and a variable resistance element coupled in series to each other;
a plurality of row wirings extending in a row direction, the plurality of the row wirings each being coupled to one end of the current path;
a plurality of column wirings extending in a column direction, the plurality of the column wirings each being coupled to another end of the current path;
a first decoder circuit coupled to each of the row wirings of even-numbered rows;
a second decoder circuit coupled to each of the row wirings of odd-numbered rows;
a third decoder circuit coupled to each of the column wirings of even-numbered columns;
a fourth decoder circuit coupled to each of the column wirings of odd-numbered columns;
a voltage control circuit that controls voltages to be applied to the first decoder circuit, the second decoder circuit, the third decoder circuit, and the fourth decoder circuit; and
a controller that controls the voltage control circuit, and controls the first decoder circuit, the second decoder circuit, the third decoder circuit, and the fourth decoder circuit independently from one another,
wherein the first decoder circuit and the second decoder circuit each include two first voltage input terminals and a plurality of first address input terminals, and each perform decoding of a row address inputted to a plurality of the first address input terminals, to set a coupling mode of a plurality of the row wirings to a plurality of the first voltage input terminals,
the third decoder circuit and the fourth decoder circuit each include two second voltage input terminals and a plurality of second address input terminals, and each perform decoding of a column address inputted to a plurality of the second address input terminals, to set a coupling mode of a plurality of the column wirings to a plurality of the second voltage input terminals, and
the controller generates the row address and the column address, and outputs the row address and the column address to the first decoder circuit, the second decoder circuit, the third decoder circuit, and the fourth decoder circuit.

2. The memory system according to claim 1, wherein
the first decoder circuit and the second decoder circuit each include a plurality of first switch elements for the decoding that are equal in number to the row wirings assigned, the plurality of the first switch elements being provided at a rate of one for each of the row wirings, and
the third decoder circuit and the fourth decoder circuit each include a plurality of second switch elements for the decoding that are equal in number to the column wirings assigned, the plurality of the second switch elements being provided at a rate of one for each of the column wirings.

3. The memory system according to claim 1, wherein the voltage control circuit outputs a first voltage and a second voltage respectively to two of the first voltage input terminals of the first decoder circuit and to two of the first voltage input terminals of the second decoder circuit, and outputs a third voltage and a fourth voltage respectively to two of the second voltage input terminals of the third decoder circuit and to two of the second voltage input terminals of the fourth decoder circuit.

4. The memory system according to claim 3, wherein
the controller outputs a first row address, as the row address, to whichever decoder circuit is coupled to the memory cell as a target of selection, out of the first decoder circuit and the second decoder circuit, and
the controller further outputs a second row address, as the row address, to whichever decoder circuit is devoid of coupling to the memory cell as the target of the selection, out of the first decoder circuit and the second decoder circuit,
the first row address being a row address that couples the row wiring coupled to the memory cell as the target of the selection to the first voltage input terminal to which the first voltage is outputted, and brings each of the row wirings that are devoid of the coupling to the memory cell as the target of the selection to a floating state, and
the second row address being a row address that sets, at the second voltage, a voltage of, at least, each of the row wirings in adjacency to the row wiring coupled to the memory cell as the target of the selection, out of a plurality of the row wirings.

5. The memory system according to claim 4, wherein
the controller outputs a first column address, as the column address, to whichever decoder circuit is coupled to the memory cell as the target of the selection, out of the third decoder circuit and the fourth decoder circuit, and
the controller further outputs a second column address, as the column address, to whichever decoder circuit is devoid of the coupling to the memory cell as the target of the selection, out of the third decoder circuit and the fourth decoder circuit,
the first column address being a column address that couples the column wiring coupled to the memory cell as the target of the selection to the second voltage input terminal to which the third voltage is outputted, and brings each of the column wirings that are devoid of the coupling to the memory cell as the target of the selection, to the floating state, and
the second column address being a column address that sets, at the fourth voltage, a voltage of, at least, each of the column wirings in adjacency to the column wiring coupled to the memory cell as the target of the selection, out of a plurality of the column wirings.

6. The memory system according to claim 5, wherein with data being written to the memory cell as the target of the election, the voltage control circuit outputs, as the first voltage and the third voltage, a voltage of magnitude large enough to cause a voltage equal to or larger than a write threshold voltage to be applied to the variable resistance element in the memory cell as the target of the selection, the write threshold voltage being a voltage at which the variable resistance element changes from a high resistance state to a low resistance state.

7. The memory system according to claim 6, wherein with data of the memory cell as the target of the selection being read, the voltage control circuit outputs, as the first voltage and the third voltage, a voltage of magnitude large enough to cause a voltage smaller than the threshold voltage to be applied to the variable resistance element in the memory cell as the target of the selection, the voltage being of magnitude large enough to cause a voltage higher than a voltage at which the selection element is turned off, to be applied to the selection element in the memory cell as the target of the selection.

8. The memory system according to claim 5, wherein the controller outputs a third row address, as the row address, to the first decoder circuit and the third decoder circuit, and outputs a third column address, as the column address, to the third decoder circuit and the fourth decoder circuit, and afterwards, outputs the first row address and the second row address to the first decoder circuit and the second decoder circuit, and outputs the first column address and the second column address to the third decoder circuit and the fourth decoder circuit, the third row address coupling each of the row wirings to the first voltage input terminal to which the second voltage is outputted, and the third column address coupling each of the column wirings to the second voltage input terminal to which the fourth voltage is outputted.

9. The memory system according to claim 5, wherein the voltage control circuit outputs, as the second voltage and the fourth voltage, two kinds of voltages that differ in voltage values from each other.

10. The memory system according to claim 5, wherein the voltage control circuit outputs, as the second voltage and the fourth voltage, voltages that are equal in voltage values to each other.

11. The memory system according to claim 5, wherein the controller controls the voltage control circuit to output, as the second voltage and the fourth voltage, two kinds of voltages that differ in voltage values from each other or voltages that are equal in voltage values to each other, in accordance with a physical position of the memory cell as the target of the selection.

12. The memory system according to claim 5, wherein on a condition that the controller has failed in writing to the memory cell as the target of the selection as a result of controlling the voltage control circuit to output, as the second voltage and the fourth voltage, voltages that are equal in voltage values to each other, the controller performs again the writing to the memory cell as the target of the selection after controlling the voltage control circuit to output, as the second voltage and the fourth voltage, two kinds of voltages that differ in voltage values from each other.

13. The memory system according to claim 5, wherein after selection of the memory cell as the target of the selection is made, the controller outputs, as the row address, a third row address that sets each of the row wirings and each of the column wirings that are devoid of the coupling to the memory cell as the target of the selection, at the floating state.

14. The memory system according to claim 5, wherein after selection of the memory cell as the target of the selection is made, the controller outputs, as the column address, a third column address that sets the column wiring coupled to the memory cell as the target of the selection, at a voltage smaller than the third voltage.

15. A memory device, comprising:
a plurality of memory cells in a matrix arrangement, the plurality of the memory cells each including a current path that includes a selection element and a variable resistance element coupled in series to each other;
a plurality of row wirings extending in a row direction, the plurality of the row wirings each being coupled to one end of the current path;
a plurality of column wirings extending in a column direction, the plurality of the column wirings each being coupled to another end of the current path;
a first decoder circuit coupled to each of the row wirings of even-numbered rows;
a second decoder circuit coupled to each of the row wirings of odd-numbered rows;
a third decoder circuit coupled to each of the column wirings of even-numbered columns; and
a fourth decoder circuit coupled to each of the column wirings of odd-numbered columns,
the first decoder circuit, the second decoder circuit, the third decoder circuit, and the fourth decoder circuit being constituted by circuits that are independent from one another,
wherein the first decoder circuit and the second decoder circuit each include two first voltage input terminals and a plurality of first address input terminals, and each perform decoding of a row address inputted to a plurality of the first address input terminals, to set a coupling mode of a plurality of the column wirings to a plurality of the second voltage input terminals,
the third decoder circuit and the fourth decoder circuit each include two second voltage input terminals and a plurality of second address input terminals, and each perform decoding of a column address inputted to a plurality of the second address input terminals, to set a coupling mode of a plurality of the column wirings to a plurality of the second voltage input terminals, and
the controller generates the row address and the column address, and outputs the row address and the column address to the first decoder circuit, the second decoder circuit, the third decoder circuit, and the fourth decoder circuit.

16. A memory control method in a memory device including
a plurality of memory cells in a matrix arrangement, the plurality of the memory cells each including a current path that includes a selection element and a variable resistance element coupled in series to each other,
a plurality of row wirings extending in a row direction, the plurality of the row wirings each being coupled to one end of the current path,
a plurality of column wirings extending in a column direction, the plurality of the column wirings each being coupled to another end of the current path,
a first decoder circuit coupled to each of the row wirings of even-numbered rows,
a second decoder circuit coupled to each of the row wirings of odd-numbered rows,
a third decoder circuit coupled to each of the column wirings of even-numbered columns, and
a fourth decoder circuit coupled to each of the column wirings of odd-numbered columns,
the memory control method comprising
controlling the first decoder circuit, the second decoder circuit, the third decoder circuit, and the fourth decoder circuit independently from one another,
wherein the first decoder circuit and the second decoder circuit perform the decoding of a row address inputted to a plurality of the first address input terminals, setting a coupling mode of a plurality of the row wirings to a plurality of the first voltage input terminals,
third decoder circuit and the fourth decoder circuit each to include two second voltage input terminals and a plurality of second address input terminals, and each perform decoding of a column address inputted to a plurality of the second address input terminals, to set a coupling mode of a plurality of the column wirings to a plurality of the second voltage input terminals, and generating the row address and the column address, and outputting the row address and the column address to the first decoder circuit, the second decoder circuit, the third decoder circuit, and the fourth decoder circuit.

* * * * *